US011810624B2

(12) United States Patent
Kato

(10) Patent No.: US 11,810,624 B2
(45) Date of Patent: Nov. 7, 2023

(54) SEMICONDUCTOR MEMORY DEVICE

(71) Applicant: Kioxia Corporation, Tokyo (JP)

(72) Inventor: Koji Kato, Yokohama (JP)

(73) Assignee: Kioxia Corporation, Tokyo (JP)

( * ) Notice: Subject to any disclaimer, the term of this patent is extended or adjusted under 35 U.S.C. 154(b) by 226 days.

(21) Appl. No.: 17/473,293

(22) Filed: Sep. 13, 2021

(65) Prior Publication Data

US 2022/0238164 A1 Jul. 28, 2022

(30) Foreign Application Priority Data

Jan. 26, 2021 (JP) ................................ 2021-010074

(51) Int. Cl.

| | |
|---|---|
| ***G11C 5/02*** | (2006.01) |
| ***G11C 16/26*** | (2006.01) |
| ***G11C 16/32*** | (2006.01) |
| ***G11C 16/10*** | (2006.01) |
| ***G11C 16/24*** | (2006.01) |
| ***G11C 16/04*** | (2006.01) |
| ***H10B 41/27*** | (2023.01) |
| ***H10B 43/27*** | (2023.01) |

(52) U.S. Cl.

CPC .......... *G11C 16/26* (2013.01); *G11C 16/0483* (2013.01); *G11C 16/10* (2013.01); *G11C 16/24* (2013.01); *G11C 16/32* (2013.01); *H10B 41/27* (2023.02); *H10B 43/27* (2023.02)

(58) Field of Classification Search

CPC ........... G11C 5/025; G11C 5/04; G11C 5/063; G11C 11/4097; G11C 7/18

USPC ..................................................... 365/63, 51

See application file for complete search history.

(56) References Cited

U.S. PATENT DOCUMENTS

| | | | | |
|---|---|---|---|---|
| 9,666,296 B1 | 5/2017 | Maejima | | |
| 10,255,977 B2 | 4/2019 | Shimizu et al. | | |
| 10,892,020 B2 | 1/2021 | Hioka et al. | | |
| 2005/0002263 A1* | 1/2005 | Iwase | .................... | G11C 16/24 365/230.03 |

(Continued)

FOREIGN PATENT DOCUMENTS

| | | |
|---|---|---|
| JP | 2018-160295 A | 10/2018 |
| JP | 6581019 B2 | 9/2019 |
| JP | 2020-4466 A | 1/2020 |

*Primary Examiner* — Son T Dinh

(74) *Attorney, Agent, or Firm* — Oblon, McClelland, Maier & Neustadt, L.L.P.

(57) ABSTRACT

A semiconductor memory device comprises: a substrate; a first conductive layer separated from the substrate in a first direction and extending in a second direction; a second and a third conductive layers separated from the substrate and the first conductive layer in the first direction and aligned in the second direction; a first semiconductor layer facing the first and the second conductive layers; a second semiconductor layer facing the first and the third conductive layers; a first and a second bit lines electrically connected to the first and the second semiconductor layers. At least some of operation parameters in the case of a certain operation being executed on a memory cell corresponding to the first conductive layer differ from at least some of operation parameters in the case of the certain operation being executed on a memory cell corresponding to the second conductive layer or the third conductive layer.

19 Claims, 35 Drawing Sheets

(56) References Cited

U.S. PATENT DOCUMENTS

2012/0069681 A1* 3/2012 Oikawa .............. G11C 16/3418
365/185.24

* cited by examiner

PC
MD
$V_{CCQ}$
$V_{CC}$
$V_{SS}$
DQ0
DQ1
DQ2
DQ7
DQS
$\overline{DQS}$
$\overline{CEn}$
CLE
ALE
$\overline{WE}$
$\overline{RE}$
RE
RY/$\overline{BY}$
I/O
CTR
DAT
DB
DBUS
CM
CA
$D_{ADD}$
ADR
RA
$D_{CMD}$
CMR
$D_{ST}$
STR
SQC
VG
SAM
MCA
RD BL
BL
BL
m0
CC
m0
CC
m0
CC
m0
C4
m0
C4
m0
C4
M0
$L_{MCA2}$
$L_{MCA1}$
D2
D1
D0
$L_{TR}$
100
120
$120_U$
$120_L$
d2
d0
d1
CS
CS
Tr
$R_{MH}$
$R_{HU2}$
100I
110A
D
gc
Vy
Ch
110
111
112
GC
X
Y
Z X
Y
Z
BLK
$L_{MCA1}$, $L_{MCA2}$
$R_{MH}$
$R_{HU2}$
$r_{CC2}$
C4
$R_{C4T}$
CC BLK
X
Y
Z
$R_{MH}$
221
$r_{CC2}$
$102_{CC2}$
$110_{CC2}$
m0a
C4
CC
$L_{MCA2}$
222
$R_{HU2}$
$110_{C4T}$
$R_{C4T}$
220

BLK
X
Y
Z
m0a
CC
m1a
C4
$L_{MCA2}$
230
$r_{CC2}$
$102_{CC2}$
$110_{C4T}$
$R_{C4T}$
$R_{MH}$
$R_{HU2}$

M0
$L_{MCA2}$
$L_{MCA1}$
D2
D1
D0
$L_{TR}$
100
E'
E
m0
CC
Vy
Ch
110
111
112
GC
gc
Tr
CS
d0
d1
d2
100I
X
Y
Z 1-3-3 code

| | Er | A | B | C | D | E | F | G |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

1-2-4 code

| | Er | A | B | C | D | E | F | G |
|---|---|---|---|---|---|---|---|---|
| Upper | 1 | 0 | 0 | 1 | 1 | 0 | 0 | 1 |
| Middle | 1 | 1 | 0 | 0 | 0 | 0 | 1 | 1 |
| Lower | 1 | 1 | 1 | 1 | 0 | 0 | 0 | 0 |

WLS
WLU
SGD
BL
XXL
VPGM
VPASS
VREAD
VSS
VSG
VSGD
VSRC
VVFYA
VVFYB
VVFYC
BLP
BLW
BLA
BLB
BLC
Tf
Te'
Ta'
Tb'
Tc'
Td'
t121
t122
t123
t124
t125
t131
t132
t133
t134
t135
t136
t137
t138
t139
t140
t141
t142
t231
t232
t233
t234
t235
t236

X
Y
Z
$r_{CC2}$
$r_{CC2}$
$r_{C4T}$
$r_{C4T}$
230
210
200
220
CC
C4
m0a

X
Y
Z
$r_{CC2}$
$r_{CC2}$
$r_{C4T}$
$r_{C4T}$
m0a
CC
C4
230
210
200
220
d0, d1, d2
d0, d1, d2
d0, d1, d2
m0a

X
Y
Z
rCC2
rCC2
rC4T
rC4T
m0a
CC
C4
dy
d0, d1, d2
230
210
200
220

X
Y
Z
$r_{CC2}$
$r_{CC2}$
$r_{C4T}$
$r_{C4T}$
m0a
230
230
210
210
200
200
200
200
200
220
220
220
220
220
220
220
230
230
CC
C4
dx
d0, d1, d2
m0a

SEMICONDUCTOR MEMORY DEVICE

CROSS-REFERENCE TO RELATED APPLICATIONS

This application is based upon and claims the benefit of Japanese Patent Application No. 2021-010074, filed on Jan. 26, 2021, the entire contents of which are incorporated herein by reference.

BACKGROUND

Field

Embodiments herein relate to a semiconductor memory device.

Description of the Related Art

There is known a semiconductor memory device comprising: a substrate; a plurality of conductive layers laminated in a direction intersecting a surface of this substrate; a semiconductor layer facing these plurality of conductive layers; and a gate insulating layer provided between the conductive layers and the semiconductor layer. The gate insulating layer comprises a memory portion capable of storing data, such as an insulative charge accumulating film of the likes of silicon nitride ($Si_3N_4$) or a conductive charge accumulating film of the likes of a floating gate, for example.

BRIEF DESCRIPTION OF THE DRAWINGS

FIG. 35 is a schematic plan view in which FIG. 34 is shown with some configurations thereof omitted.

DETAILED DESCRIPTION

Figure 1:
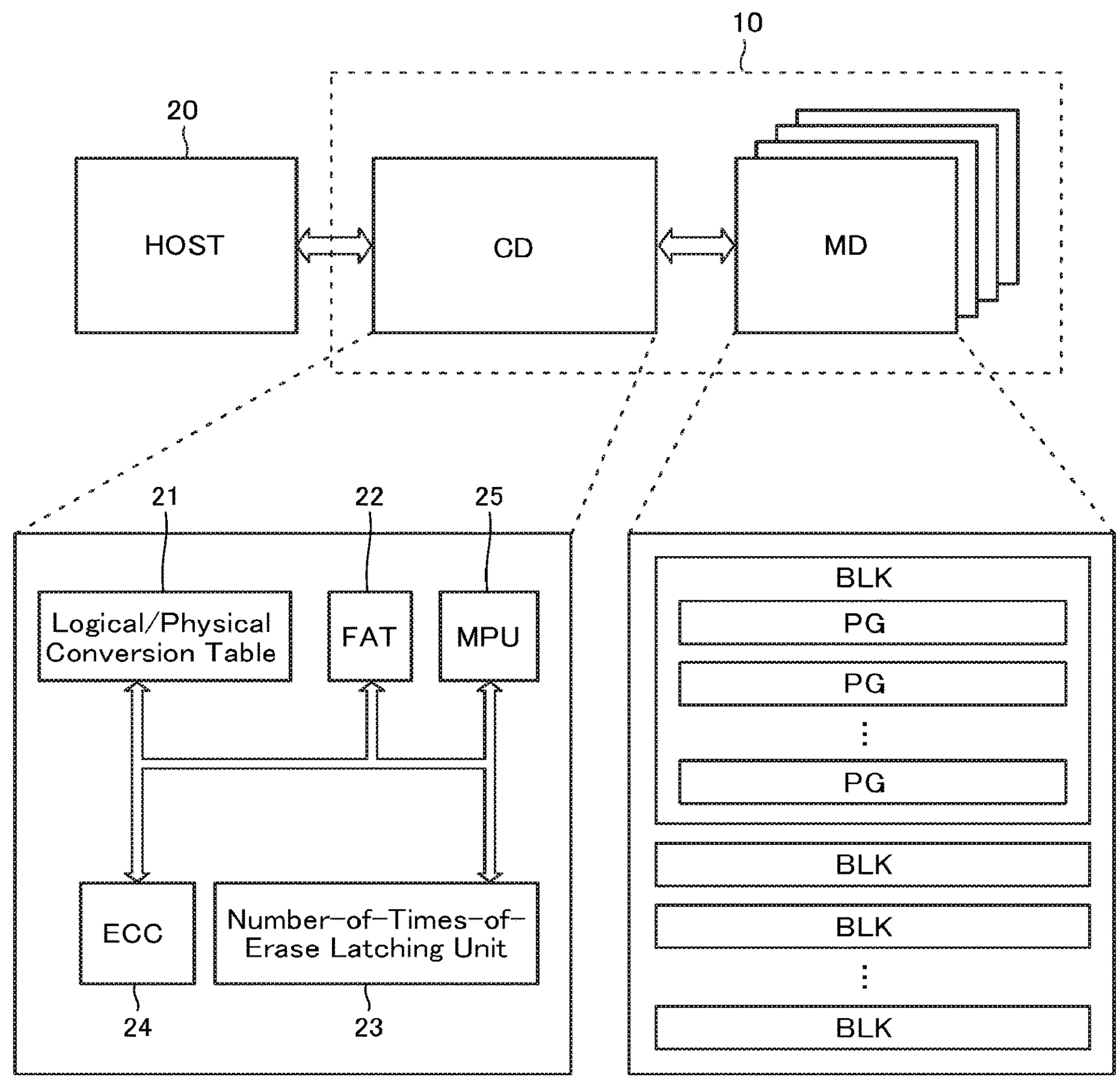
FIG. 1 is a schematic block diagram showing a configuration of a memory system 10 according to a first embodiment.

A semiconductor memory device according to an embodiment comprises: a substrate; a first conductive layer which is separated from the substrate in a first direction intersecting a surface of the substrate and extends in a second direction intersecting the first direction; a second conductive layer which is separated from the substrate and the first conductive layer in the first direction and extends in the second direction; a third conductive layer which is separated from the substrate and the first conductive layer in the first direction, extends in the second direction, is aligned with the second conductive layer in the second direction, and is electrically connected to the second conductive layer; a first semiconductor layer which extends in the first direction and faces the first conductive layer and the second conductive layer; a first charge accumulating portion provided between the first conductive layer and the first semiconductor layer; a second charge accumulating portion provided between the second conductive layer and the first semiconductor layer; a second semiconductor layer which extends in the first direction and faces the first conductive layer and the third conductive layer; a third charge accumulating portion provided between the first conductive layer and the second semiconductor layer; a fourth charge accumulating portion provided between the third conductive layer and the second semiconductor layer; a first bit line electrically connected to the first semiconductor layer; and a second bit line electrically connected to the second semiconductor layer. For example, a magnitude and supply time of one or a plurality of voltages supplied to the first conductive layer, a magnitude and supply time of one or a plurality of voltages supplied to the first bit line, a stabilization waiting time until sense start, and a sense time, in the case of a certain operation being executed on a first memory cell including the first charge accumulating portion, are assumed to be first operation parameters. Moreover, a magnitude and supply time of one or a plurality of voltages supplied to the second conductive layer and the third conductive layer, a magnitude and supply time of one or a plurality of voltages supplied to the first bit line, a stabilization waiting time until sense start, and a sense time, in the case of the certain operation being executed on a second memory cell including the second charge accumulating portion, are assumed to be second operation parameters. In such a case, at least some of the second operation parameters differ from at least some of the first operation parameters.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a controller die, of the likes of a memory chip, a memory card, or an SSD (Solid State Drive). Furthermore, it will sometimes mean a configuration including a host computer, of the likes of a smartphone, a tablet terminal, or a personal computer. Moreover, when a "control circuit" is referred to in the present specification, it will sometimes mean a peripheral circuit of the likes of a sequencer provided in a memory die, will sometimes mean the likes of a controller die or controller chip connected to the memory die, and will sometimes mean a configuration including both of these.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "electrically conducts" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be called an X direction, a direction parallel to the upper surface of the substrate and perpendicular to the X direction will be called a Y direction, and a direction perpendicular to the upper surface of the substrate will be called a Z direction.

Moreover, in the present specification, sometimes, a direction lying along a certain plane will be called a first direction, a direction intersecting the first direction along this certain plane will be called a second direction, and a direction intersecting this certain plane will be called a third direction. These first direction, second direction, and third direction may correspond to any of the X direction, the Y direction, and the Z direction, but need not do so.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

First Embodiment

[Memory System 10]

FIG. 1 is a schematic block diagram showing a configuration of a memory system 10 according to a first embodiment.

The memory system 10 performs read, write, erase, and so on, of user data, in response to a signal transmitted from a host computer 20. The memory system 10 is a memory chip, a memory card, an SSD, or another system capable of storing user data, for example. The memory system 10 comprises a plurality of memory dies MD and a controller die CD.

The memory die MD stores user data. The memory die MD comprises a plurality of memory blocks BLK. The memory block BLK comprises a plurality of pages PG. The memory block BLK may be an execution unit of an erase operation. The page PG may be an execution unit of a read operation and a write operation.

As shown in FIG. 1, the controller die CD is connected to the plurality of memory dies MD and to the host computer 20. The controller die CD comprises a logical/physical conversion table 21, an FAT (File Allocation Table) 22, a number-of-times-of-erase latching unit 23, an ECC circuit 24, and an MPU (Micro Processor Unit) 25, for example.

The logical/physical conversion table 21 latches in an associated manner a logical address that has been received from the host computer 20 and a physical address that has been allocated to a page PG in a memory die MD. The logical/physical conversion table 21 is realized by the likes of an unillustrated RAM (Random Access Memory), for example.

The FAT 22 latches FAT information indicating a state of each of the pages PG. As such FAT information, there is information indicating "valid", "invalid", "erased", for example. For example, a page PG which is "valid" is storing valid data to be read in response to a command from the host computer 20. Moreover, a page PG which is "invalid" is storing invalid data not to be read in response to a command from the host computer 20. Moreover, a page PG which is "erased" has undergone execution of erase operation, so does not have data stored therein. The FAT 22 is realized by the likes of an unillustrated RAM, for example.

The number-of-times-of-erase latching unit 23 latches in an associated manner a physical address corresponding to a memory block BLK and a number-of-times that an erase operation has been executed on the memory block BLK. The number-of-times-of-erase latching unit 23 is realized by the likes of an unillustrated RAM, for example.

The ECC circuit 24 detects an error of data that has been read from a memory die MD, and where possible, performs correction of the data.

The MPU 25 refers to the logical/physical conversion table 21, the FAT 22, the number-of-times-of-erase latching unit 23, and the ECC circuit 24 to perform processing, such as conversion of the logical address and the physical address, bit error detection/correction, garbage collection (compaction), and wear leveling.

[Circuit Configuration of Memory Die MD]

Figure 2:
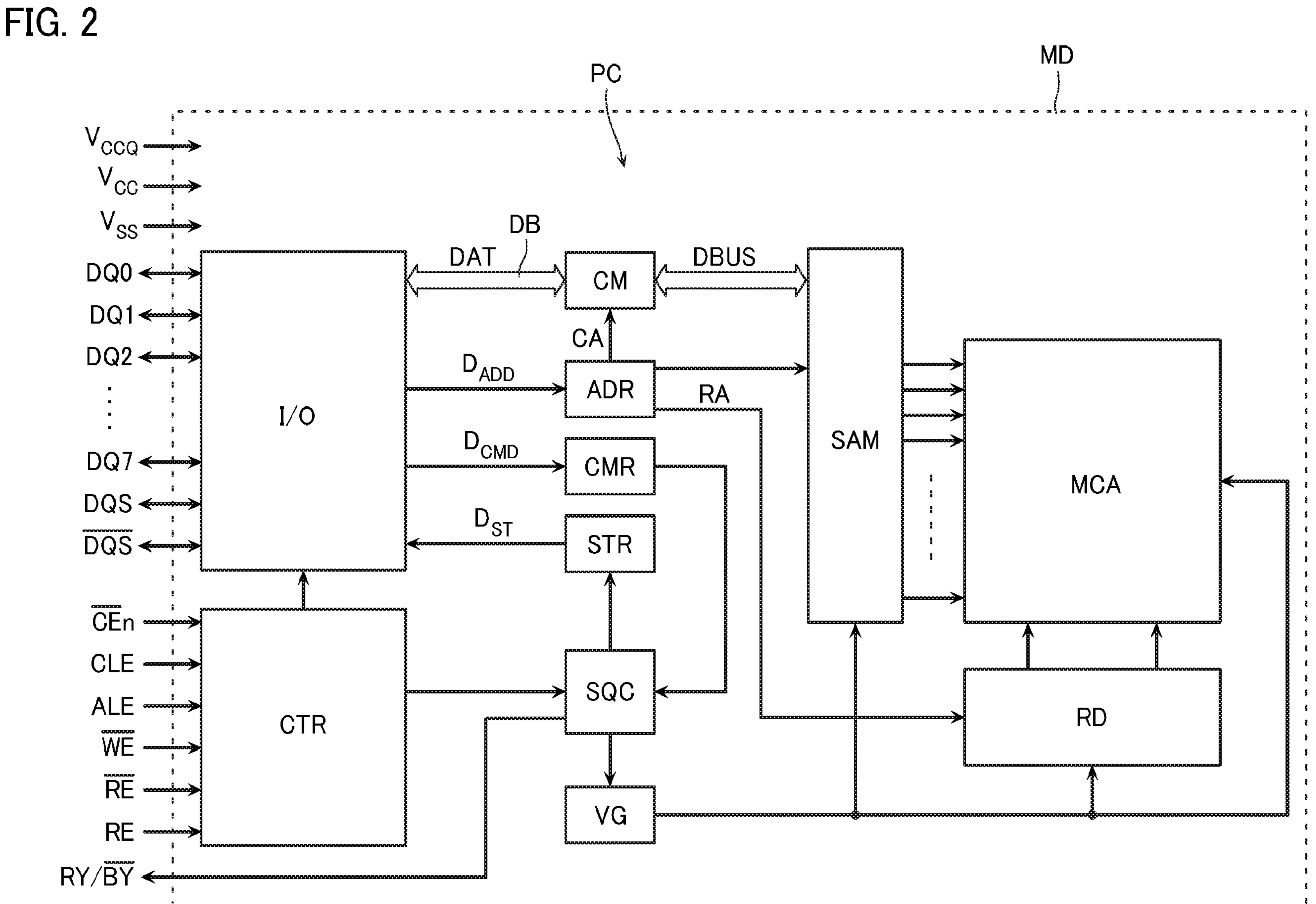
FIG. 2 is a schematic block diagram showing a configuration of a memory die MD according to the first embodiment.

FIG. 2 is a schematic block diagram showing a configuration of the memory die MD according to the first embodiment. FIGS. 3 to 9 are schematic circuit diagrams showing configurations of parts of the memory die MD.

Note that in FIG. 2, a plurality of control terminals, and so on, are illustrated. These plurality of control terminals are sometimes indicated as a control terminal corresponding to a high active signal (a positive logic signal). Moreover, the plurality of control terminals are sometimes indicated as a control terminal corresponding to a low active signal (a negative logic signal). Moreover, the plurality of control terminals are sometimes indicated as a control terminal corresponding to both a high active signal and a low active signal. In FIG. 2, a symbol of a control terminal corresponding to a low active signal includes an overline. In the present specification, a symbol of a control terminal corresponding to a low active signal includes a slash ("/"). Note that description of FIG. 2 is an exemplification, and that a specific mode is appropriately adjustable. For example, it is possible for some or all of the high active signals to be configured as low active signals, or for some or all of the low active signals to be configured as high active signals.

As shown in FIG. 2, the memory die MD comprises a memory cell array MCA and a peripheral circuit PC. The peripheral circuit PC comprises a voltage generating circuit VG, a row decoder RD, a sense amplifier module SAM, and a sequencer SQC. In addition, the peripheral circuit PC comprises a cache memory CM, an address register ADR, a command register CMR, and a status register STR. Moreover, the peripheral circuit PC comprises an input/output control circuit I/O and a logic circuit CTR.

[Circuit Configuration of Memory Cell Array MCA]

Figure 3:
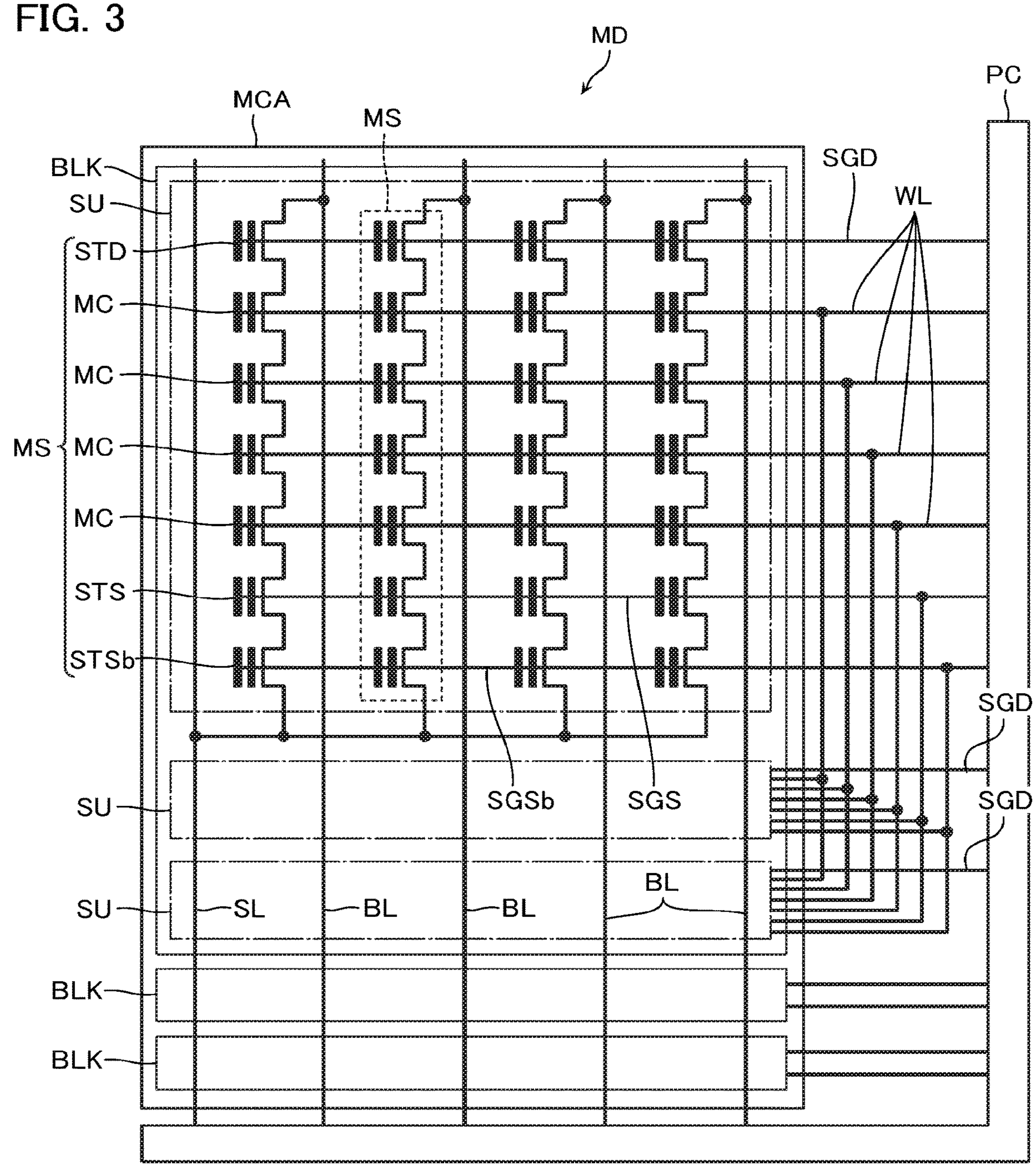
FIG. 3 is a schematic circuit diagram showing a configuration of part of the memory die MD.

As shown in FIG. 3, the memory cell array MCA comprises the above-mentioned plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), a source side select transistor STS, and a source side select transistor STSb. The drain side select transistor STD, the plurality of memory cells MC, the source side select transistor STS, and the source side select transistor STSb are connected in series between the bit line BL and the source line SL. Hereafter, the drain side select transistor STD, the source side select transistor STS, and the source side select transistor STSb will sometimes simply be called select transistors (STD, STS, STSb).

The memory cell MC is a field effect type transistor. The memory cell MC comprises a semiconductor layer, a gate insulating film, and a gate electrode. The semiconductor layer functions as a channel region. The gate insulating film includes a charge accumulating film. A threshold voltage of the memory cell MC changes according to an amount of charge in the charge accumulating film. The memory cell MC stores one bit or a plurality of bits of data. Note that the gate electrodes of the plurality of memory cells MC corresponding to one memory string MS are respectively connected with word lines WL. These word lines WL are respectively commonly connected to all of the memory strings MS in one memory block BLK.

The select transistor (STD, STS, STSb) is a field effect type transistor. The select transistor (STD, STS, STSb) comprises a semiconductor layer, a gate insulating film, and a gate electrode. The semiconductor layer functions as a channel region. The gate electrodes of the select transistors (STD, STS, STSb) are respectively connected with select gate lines (SGD, SGS, SGSb). One drain side select gate line SGD is commonly connected to all of the memory strings MS in one string unit SU. One source side select gate line SGS is commonly connected to all of the memory strings MS in one memory block BLK. One source side select gate line SGSb is commonly connected to all of the memory strings MS in one memory block BLK.

[Circuit Configuration of Voltage Generating Circuit VG]

Figure 4:
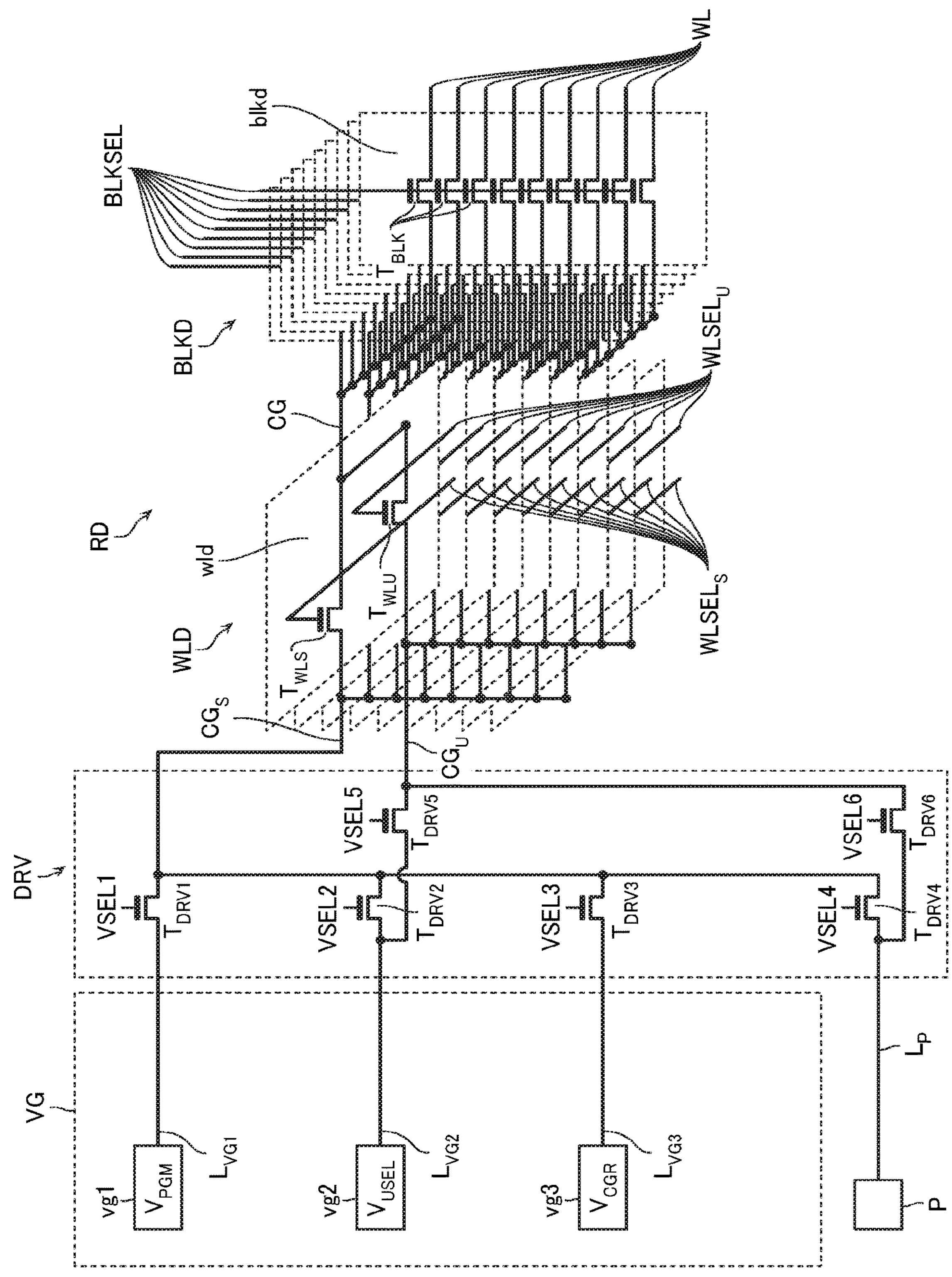
FIG. 4 is a schematic circuit diagram showing a configuration of part of the memory die MD.

As shown in FIG. 4, for example, the voltage generating circuit VG (FIG. 2) comprises a plurality of voltage generating units vg1-vg3. The voltage generating units vg1-vg3 generate voltages of certain magnitudes and output the generated voltages via voltage supply lines $L_{VG}$, in a read operation, a write operation, and an erase operation. For example, the voltage generating unit vg1 outputs a later-mentioned program voltage $V_{PGM}$ in a write operation. Moreover, the voltage generating unit vg2 outputs a later-mentioned read pass voltage $V_{READ}$ in a read operation. Moreover, the voltage generating unit vg2 outputs a later-mentioned write pass voltage $V_{PASS}$ in a write operation. Moreover, the voltage generating unit vg3 outputs a later-mentioned read voltage in a read operation. Moreover, the voltage generating unit vg3 outputs a later-mentioned verify voltage in a write operation. The voltage generating units vg1-vg3 may be a booster circuit such as a charge pump circuit, or may be a step-down circuit such as a regulator, for example. These step-down circuit and booster circuit are each connected to a voltage supply line $L_P$. The voltage supply line $L_P$ is supplied with a power supply voltage $V_{CC}$ or a ground voltage $V_{SS}$ (FIG. 2). These voltage supply lines $L_P$ are connected to a pad electrode P, for example. Operation voltages outputted from the voltage generating circuit VG are appropriately adjusted according to a control signal from the sequencer SQC.

Figure 5:
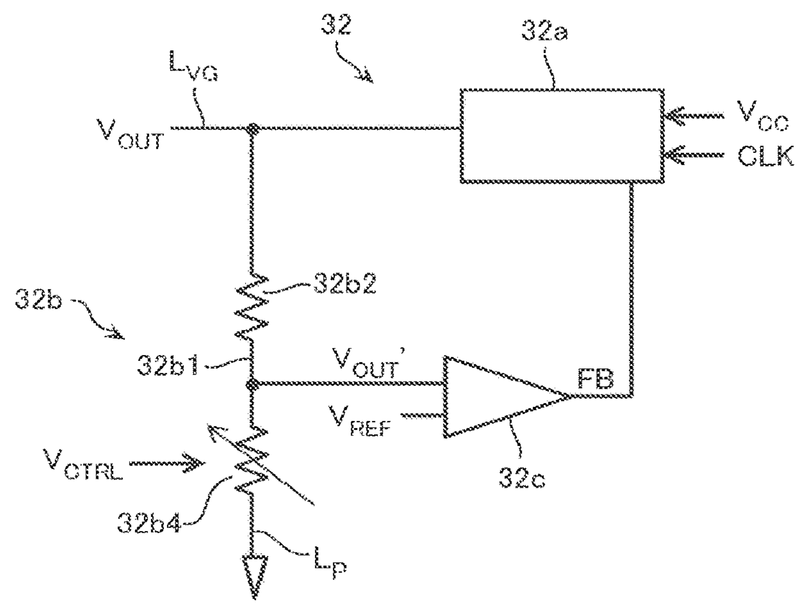
FIG. 5 is a schematic circuit diagram showing a configuration of part of the memory die MD.

As shown in FIG. 5, for example, a charge pump circuit 32 in the voltage generating circuit VG comprises a voltage output circuit 32*a*, a voltage dividing circuit 32*b*, and a comparator 32*c*. The voltage output circuit 32*a* outputs a voltage $V_{OUT}$ to the voltage supply line $L_{VG}$. The voltage dividing circuit 32*b* is connected to the voltage supply line $L_{VG}$. The comparator 32*c* outputs a feedback signal FB to the voltage output circuit 32*a* depending on a magnitude relationship of a voltage $V_{OUT}'$ outputted from the voltage dividing circuit 32*b* and a reference voltage $V_{REF}$.

Figure 6:
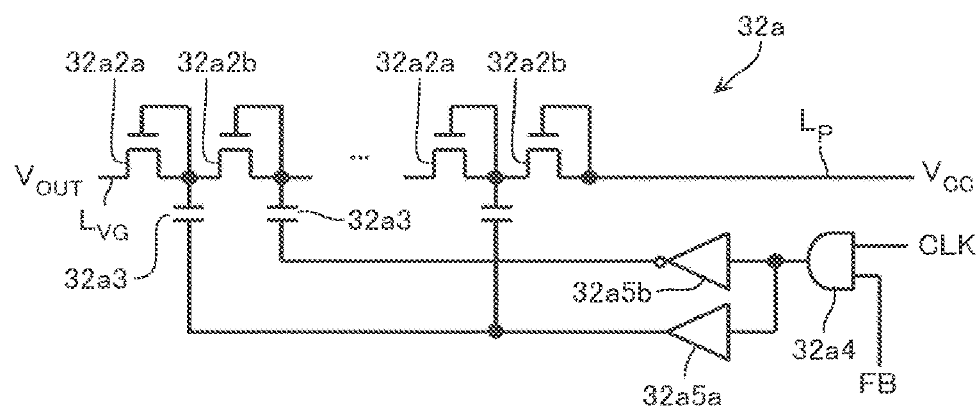
FIG. 6 is a schematic circuit diagram showing a configuration of part of the memory die MD.

As shown in FIG. 6, the voltage output circuit 32*a* comprises a plurality of transistors 32*a*2*a*, 32*a*2*b*. The plurality of transistors 32*a*2*a*, 32*a*2*b* are alternately connected between the voltage supply line $L_{VG}$ and the voltage supply line $L_P$. The voltage supply line $L_P$ illustrated is supplied with the power supply voltage $V_{CC}$. Gate electrodes of the serially connected plurality of transistors 32*a*2*a*, 32*a*2*b* are connected to their respective drain electrodes and capacitors 32*a*3. Moreover, the voltage output circuit 32*a* comprises an AND circuit 32*a*4, a level shifter 32*a*5*a*, and a level shifter 32*a*5*b*. The AND circuit 32*a*4 outputs a logical sum of a clock signal CLK and the feedback signal FB. The level shifter 32*a*5*a* outputs an output signal of the AND circuit 32*a*4 in a boosted state. An output terminal of the level shifter 32*a*5*a* is connected to the gate electrodes of the transistors 32*a*2*a* via the capacitors 32*a*3. The level shifter 32*a*5*b* outputs an inverted signal of the output signal of the AND circuit 32*a*4 in a boosted state. An output terminal of the level shifter 32*a*5*b* is connected to the gate electrodes of the transistors 32*a*2*b* via the capacitors 32*a*3.

When the feedback signal FB is in an "H" state, the clock signal CLK is outputted from the AND circuit 32*a*4. As a result, electrons are transported to the voltage supply line $L_P$ from the voltage supply line $L_{VG}$, and a voltage of the voltage supply line $L_{VG}$ increases. On the other hand, when the feedback signal FB is in an "L" state, the clock signal CLK is not outputted from the AND circuit 32*a*4. Hence, the voltage of the voltage supply line $L_{VG}$ does not increase.

As shown in FIG. 5, the voltage dividing circuit 32*b* comprises a resistance element 32*b*2 and a variable resistance element 32*b*4. The resistance element 32*b*2 is connected between the voltage supply line $L_{VG}$ and a voltage dividing terminal 32*b*1. The variable resistance element 32*b*4 is serially connected between the voltage dividing terminal 32*b*1 and the voltage supply line $L_P$. This voltage supply line $L_P$ is supplied with the ground voltage $V_{SS}$. A resistance value of the variable resistance element 32*b*4 is adjustable depending on an operation voltage control signal $V_{CTRL}$. Hence, magnitude of the voltage $V_{OUT}'$ of the voltage dividing terminal 32*b*1 is adjustable depending on the operation voltage control signal $V_{CTRL}$.

Figure 7:
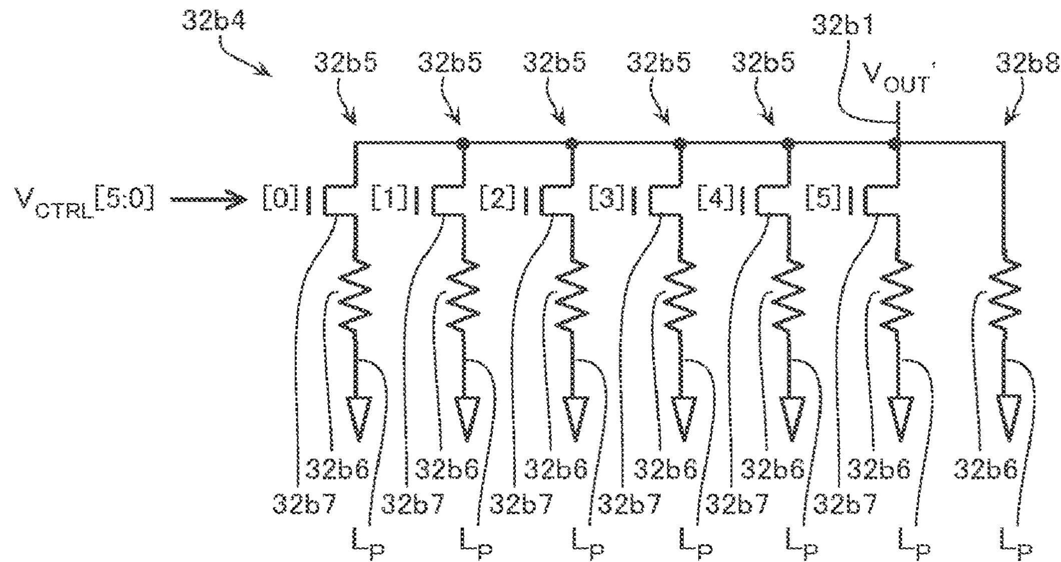
FIG. 7 is a schematic circuit diagram showing a configuration of part of the memory die MD.

As shown in FIG. 7, the variable resistance element 32*b*4 comprises a plurality of current paths 32*b*5. The plurality of current paths 32*b*5 are connected in parallel between the voltage dividing terminal 32*b*1 and the voltage supply line $L_P$. The plurality of current paths 32*b*5 each comprise a resistance element 32*b*6 and a transistor 32*b*7 that are serially connected. Resistance values of the resistance elements 32*b*6 provided to each of the current paths 32*b*5 may differ from each other. Gate electrodes of the transistors 32*b*7 are respectively inputted with different bits of the operation voltage control signal $V_{CTRL}$, Moreover, the variable resistance element 32*b*4 may have a current path 32*b*8 that does not include the transistor 32*b*7.

As shown in FIG. 5, the comparator 32*c* outputs the feedback signal FB. The feedback signal FB attains an "L" state when, for example, the voltage $V_{OUT}'$ of the voltage dividing terminal 32*b*1 is larger than the reference voltage $V_{REF}$. Moreover, the feedback signal FB attains an "H" state when, for example, the voltage $V_{OUT}'$ is smaller than the reference voltage $V_{REF}$.

[Circuit Configuration of Row Decoder RD]

As shown in FIG. 4, for example, the row decoder RD comprises a block decoder BLKD, a word line decoder WLD, a driver circuit DRV, and an unillustrated address decoder.

The block decoder BLKD comprises a plurality of block decode units blkd. The plurality of block decode units blkd correspond to the plurality of memory blocks BLK in the memory cell array MCA. The block decode unit blkd comprises a plurality of transistors $T_{BLK}$. The plurality of transistors $T_{BLK}$ correspond to the plurality of word lines WL in the memory block BLK. The transistor $T_{BLK}$ is a field effect type NMOS transistor, for example. A drain electrode of the transistor $T_{BLK}$ is connected to the word line WL. A source electrode of the transistor $T_{BLK}$ is connected to a wiring CG. The wiring CG is connected to all of the block decode units blkd in the block decoder BLKD. A gate electrode of the transistor $T_{BLK}$ is connected to a signal line BLKSEL. A plurality of the signal lines BLKSEL are provided correspondingly to all of the block decode units blkd. Moreover, the signal line BLKSEL is connected to all of the transistors $T_{BLK}$ in the block decode unit blkd.

In a read operation, a write operation, and so on, for example, one signal line BLKSEL corresponding to a block address in the address register ADR (FIG. 2) attains an "H" state, and other signal lines BLKSEL attain an "L" state. For example, the one signal line BLKSEL is supplied with a certain drive voltage having a positive magnitude, and the other signal lines BLKSEL are supplied with the ground voltage $V_{SS}$, or the like. As a result, all of the word lines WL in the one memory block BLK corresponding to this block address are electrically conducted with all of the wirings CG. Moreover, all of the word lines WL in the other memory blocks BLK attain a floating state.

The word line decoder WLD comprises a plurality of word line decode units wld. The plurality of word line decode units wld correspond to the plurality of memory cells MC in the memory string MS. In the example illustrated, the word line decode unit wld comprises two transistors $T_{WLS}$, $T_{WLU}$. The transistors $T_{WLS}$, $T_{WLU}$ are field effect type NMOS transistors, for example. Drain electrodes of the transistors $T_{WLS}$, $T_{WLU}$ are connected to the wiring CG. A source electrode of the transistor $T_{WLS}$ is connected to a wiring $CG_S$. A source electrode of the transistor $T_{WLU}$ is connected to a wiring $CG_U$. A gate electrode of the transistor $T_{WLS}$ is connected to a signal line $WLSEL_S$. A gate electrode of the transistor $T_{WLU}$ is connected to a signal line $WLSEL_U$. A plurality of the signal lines $WLSEL_S$ are provided correspondingly to the transistors $T_{WLS}$ included in all of the word line decode units wld. A plurality of the signal lines $WLSEL_U$ are provided correspondingly to the transistors $T_{WLU}$ included in all of the word line decode units wld.

In a read operation, a write operation, and so on, for example, the signal line $WLSEL_S$ corresponding to one word line decode unit wld corresponding to a page address in the address register ADR (FIG. 2) attains an "H" state, and the signal line $WLSEL_U$ corresponding to this signal line $WLSEL_S$ attains an "L" state. Moreover, the signal lines $WLSEL_S$ corresponding to the other word line decode units wld attain an "L" state, and the signal lines $WLSEL_U$ corresponding to these signal lines $WLSEL_S$ attain an "H" state. Moreover, the wiring $CG_S$ is supplied with a voltage corresponding to a selected word line WL. Moreover, the wiring $CG_U$ is supplied with a voltage corresponding to an unselected word line WL. As a result, the one word line WL corresponding to the above-described page address is supplied with the voltage corresponding to the selected word line WL. Moreover, the other word lines WL are supplied with the voltage corresponding to the unselected word line WL.

The driver circuit DRV comprises six transistors $T_{DRV1}$-$T_{DRV6}$, for example. The transistors $T_{DRV1}$-$T_{DRV6}$ are field effect type NMOS transistors, for example. Drain electrodes of the transistors $T_{DRV1}$-$T_{DRV4}$ are connected to the wiring $CG_S$. Drain electrodes of the transistors $T_{DRV5}$, $T_{DRV6}$ are connected to the wiring $CG_U$. A source electrode of the transistor $T_{DRV1}$ is connected to an output terminal of the voltage generating unit vg1, via a voltage supply line $L_{VG1}$. Source electrodes of the transistors $T_{DRV2}$, $T_{DRV5}$ are connected to an output terminal of the voltage generating unit vg2, via a voltage supply line $L_{VG2}$. A source electrode of the transistor $T_{DRV3}$ is connected to an output terminal of the voltage generating unit vg3, via a voltage supply line $L_{VG3}$. Source electrodes of the transistors $T_{DRV4}$, $T_{DRV6}$ are connected to the pad electrode P, via the voltage supply line $L_P$. Gate electrodes of the transistors $T_{DRV1}$-$T_{DRV6}$ are respectively connected with signal lines VSEL1-VSEL6.

In a read operation, a write operation, and so on, for example, one of a plurality of the signal lines VSEL1-VSEL4 corresponding to the wiring $CG_S$ attains an "H" state, and the others attain an "L" state. Moreover, one of the two signal lines VSEL5, VSEL6 corresponding to the wiring $CG_U$ attains an "H" state, and the other attains an "L" state.

The unillustrated address decoder sequentially refers to a row address RA of the address register ADR (FIG. 2) according to a control signal from the sequencer SQC (FIG. 2), for example. The row address RA includes the above-mentioned block address and page address. The address decoder controls voltages of the above-described signal lines BLKSEL, $WLSEL_S$, $WLSEL_U$ to an "H" state or an "L" state.

Note that in the example of FIG. 4, the row decoder RD has the block decode units blkd provided one each to each one of the memory blocks BLK. However, this configuration can be appropriately changed. For example, the block decode units blkd may be provided one each to every two or more of the memory blocks BLK.

[Circuit Configuration of Sense Amplifier Module SAM]

Figure 8:
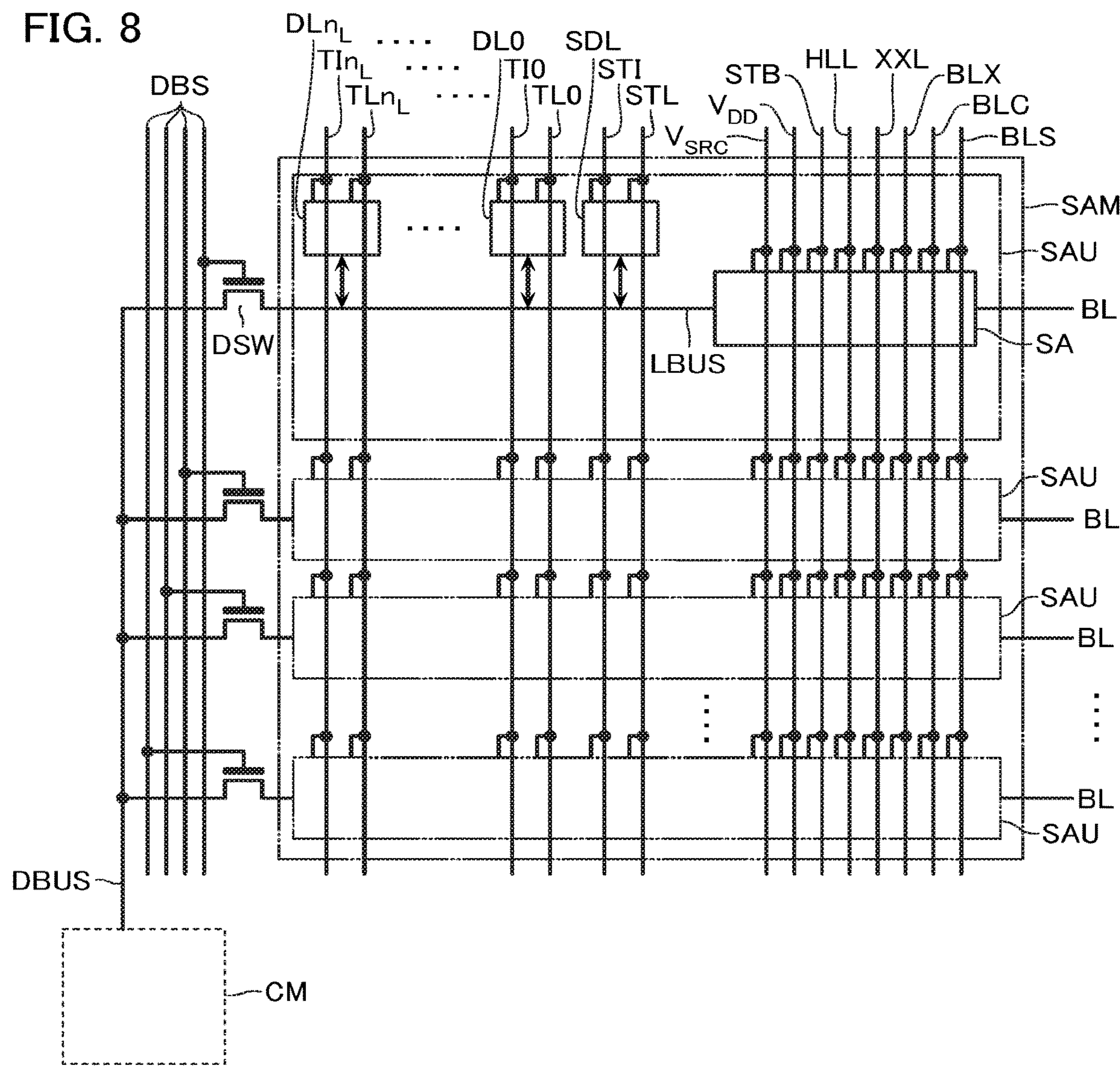
FIG. 8 is a schematic circuit diagram showing a configuration of part of the memory die MD.
Figure 9:
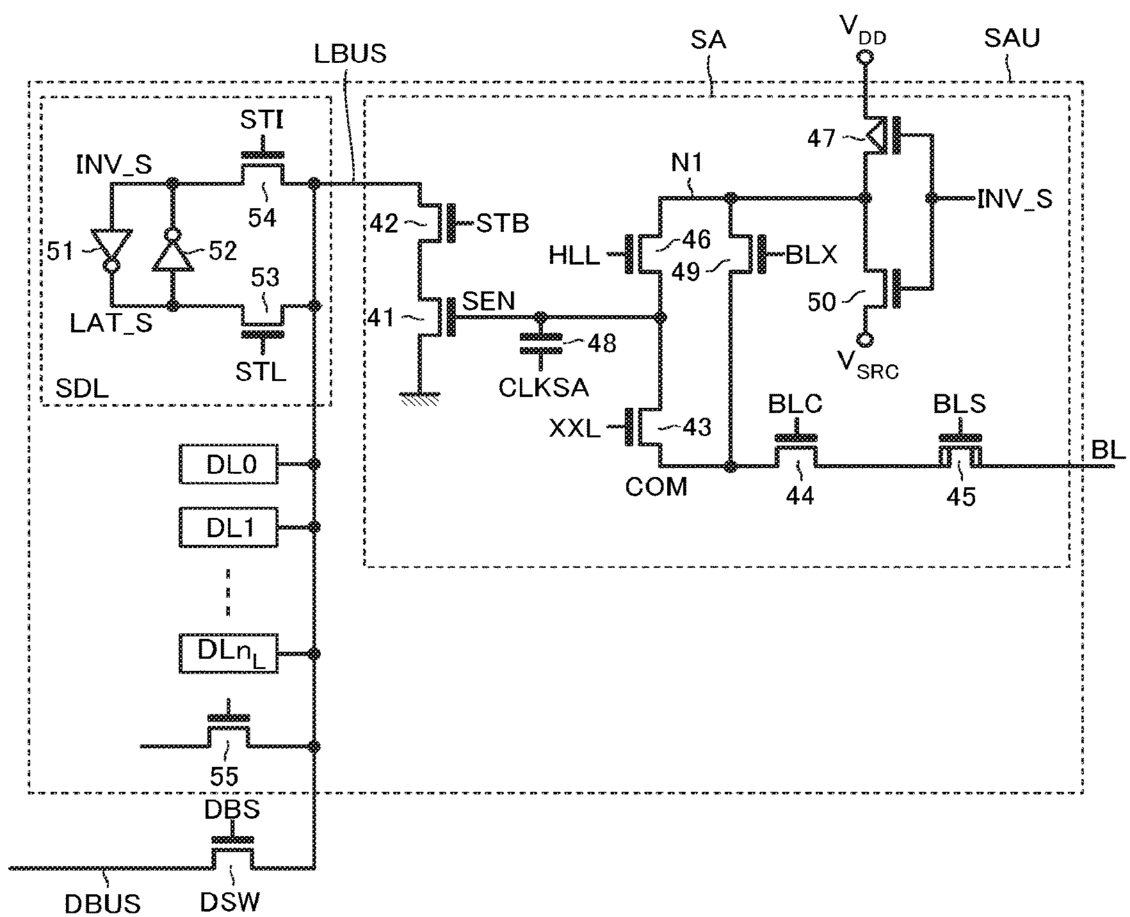
FIG. 9 is a schematic circuit diagram showing a configuration of part of the memory die MD.

As shown in FIG. 8, for example, the sense amplifier module SAM (FIG. 2) comprises a plurality of sense amplifier units SAU. The plurality of sense amplifier units SAU correspond to a plurality of the bit lines BL. The sense amplifier units SAU each comprise a sense amplifier SA, a wiring LBUS, and latch circuits SDL, DL0-DL$n_L$, (where $n_L$ is a natural number). The wiring LBUS is connected with a pre-charge charge transistor 55 (FIG. 9). The wiring LBUS is connected to a wiring DBUS via a switch transistor DSW.

As shown in FIG. 9, the sense amplifier SA comprises a sense transistor 41. The sense transistor 41 discharges charge of the wiring LBUS depending on a current flowing in the bit line BL. A source electrode of the sense transistor 41 is connected to a voltage supply line supplied with the ground voltage $V_{SS}$. A drain electrode of the sense transistor 41 is connected to the wiring LBUS via a switch transistor 42. A gate electrode of the sense transistor 41 is connected to the bit line BL via a sense node SEN, a discharge transistor 43, a node COM, a clamp transistor 44, and a voltage-withstanding transistor 45. Note that the sense node SEN is connected to an internal control signal line CLKSA via a capacitor 48.

Moreover, the sense amplifier SA comprises a voltage transfer circuit. The voltage transfer circuit selectively causes the node COM and the sense node SEN to be electrically conducted with a voltage supply line supplied with a voltage $V_{DD}$ or a voltage supply line supplied with a voltage $V_{SRC}$, depending on data latched in the latch circuit SDL. The voltage transfer circuit comprises a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line supplied with the voltage $V_{DD}$. The discharge transistor 50 is connected between the node N1 and the voltage supply line supplied with the voltage $V_{SRC}$. Note that gate electrodes of the charge transistor 47 and the discharge transistor 50 are commonly connected to anode INV_S of the latch circuit SDL.

Note that the sense transistor 41, the switch transistor 42, the discharge transistor 43, the clamp transistor 44, the charge transistor 46, the charge transistor 49, and the discharge transistor 50 are enhancement type NMOS transistors, for example. The voltage-withstanding transistor 45 is a depression type NMOS transistor, for example. The charge transistor 47 is a PMOS transistor, for example.

Moreover, a gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the voltage-withstanding transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, BLX are connected to the sequencer SQC.

The latch circuit SDL comprises a node LAT_S, the node INV_S, an inverter 51, an inverter 52, a switch transistor 53, and a switch transistor 54. The inverter 51 comprises an output terminal connected to the node LAT_S and an input terminal connected to the node INV_S. The inverter 52 comprises an input terminal connected to the node LAT_S and an output terminal connected to the node INV_S. The switch transistor 53 is provided in a current path between the node LAT_S and the wiring LBUS. The switch transistor 54 is provided in a current path between the node INV_S and the wiring LBUS. The switch transistors 53, 54 are NMOS transistors, for example. A gate electrode of the switch transistor 53 is connected to the sequencer SQC via a signal line STL. A gate electrode of the switch transistor 54 is connected to the sequencer SQC via a signal line STI.

The latch circuits DL0-DL$n_L$, are configured substantially similarly to the latch circuit SDL. However, as mentioned above, the node INV_S of the latch circuit SDL is electrically conducted with the gate electrodes of the charge transistor 47 and the discharge transistor 50 in the sense amplifier SA. The latch circuits DL0-DL$n_L$, differ from the latch circuit SDL in this respect.

The switch transistor DSW is an NMOS transistor, for example. The switch transistor DSW is connected between the wiring LBUS and the wiring DBUS. Agate electrode of the switch transistor DSW is connected to the sequencer SQC via a signal line DBS.

Note that as exemplified in FIG. 8, the above-mentioned signal lines STB, HLL, XXL, BLX, BLC, BLS are each commonly connected to all of the sense amplifier units SAU included in the sense amplifier module SAM. Moreover, the above-mentioned voltage supply line supplied with the voltage $V_{DD}$ and voltage supply line supplied with the voltage $V_{SRC}$ are each commonly connected to all of the sense amplifier units SAU included in the sense amplifier module SAM. Moreover, the signal line STI and the signal line STL of the latch circuit SDL are each commonly connected to all of the sense amplifier units SAU included in the sense amplifier module SAM. Similarly, signal lines TI0-TI$n_L$, TL0-TL$n_L$, corresponding to the signal line STI and the signal line STL in the latch circuits DL0-DL$n_L$, are each commonly connected to all of the sense amplifier units SAU included in the sense amplifier module SAM. On the other hand, a plurality of the above-mentioned signal lines DBS are respectively correspondingly provided to all of the sense amplifier units SAU included in the sense amplifier module SAM.

[Circuit Configuration of Cache Memory CM]

The cache memory CM (FIG. 2) comprises a plurality of latch circuits. The plurality of latch circuits are connected to the latch circuits within the sense amplifier module SAM via the wiring DBUS. Data DAT included in these plurality of latch circuits is sequentially transferred to the sense amplifier module SAM or the input/output control circuit I/O.

Moreover, the cache memory CM is connected with an unillustrated decode circuit and an unillustrated switch circuit. The decode circuit decodes a column address CA latched in the address register ADR. The switch circuit causes the latch circuit corresponding to the column address CA to be electrically conducted with a bus DB (FIG. 2), depending on an output signal of the decode circuit.

[Circuit Configuration of Sequencer SQC]

The sequencer SQC (FIG. 2) outputs an internal control signal to the row decoder RD, the sense amplifier module SAM, and the voltage generating circuit VG, according to command data $D_{CMD}$ latched in the command register CMR. In addition, the sequencer SQC appropriately outputs to the status register STR status data $D_{ST}$ indicating a state of the sequencer SQC itself.

Moreover, the sequencer SQC generates a ready/busy signal, and outputs the ready/busy signal to a terminal RY/BY. In a period when the terminal RY/BY is in an "L" state (a busy period), access to the memory die MD is basically prohibited. Moreover, in a period when the terminal RY/BY is in an "H" state (a ready period), access to the memory die MD is allowed.

[Circuit Configuration of Input/Output Control Circuit I/O]

The input/output control circuit I/O comprises data signal input/output terminals DQ0-DQ7, toggle signal input/output terminals DQS, /DQS, a plurality of input circuits, a plurality of output circuits, a shift register, and a buffer circuit. The plurality of input circuits, the plurality of output circuits, the shift register, and the buffer circuit are each connected to terminals supplied with a power supply voltage $V_{CCQ}$ and the ground voltage $V_{SS}$.

Data that has been inputted via the data signal input/output terminals DQ0-DQ7 is outputted to the cache memory CM, the address register ADR, or the command register CMR from the buffer circuit, depending on an internal control signal from the logic circuit CTR. Moreover, data to be outputted via the data signal input/output terminals DQ0-DQ7 is inputted to the buffer circuit from the cache memory CM or the status register STR, depending on an internal control signal from the logic circuit CTR.

Each of the plurality of input circuits include a comparator connected to any of the data signal input/output terminals DQ0-DQ7 or to both of the toggle signal input/output terminals DQS, /DQS, for example. Each of the plurality of output circuits include an OCD (Off Chip Driver) circuit connected to any of the data signal input/output terminals DQ0-DQ7 or to either of the toggle signal input/output terminals DQS, /DQS, for example.

[Circuit Configuration of Logic Circuit CTR]

The logic circuit CTR (FIG. 2) receives an external control signal from the controller die CD via external control terminals /CEn, CLE, ALE, /WE, /RE, RE, and outputs an internal control signal to the input/output control circuit I/O depending on this external control signal.

[Structure of Memory Die MD]

Figure 10:
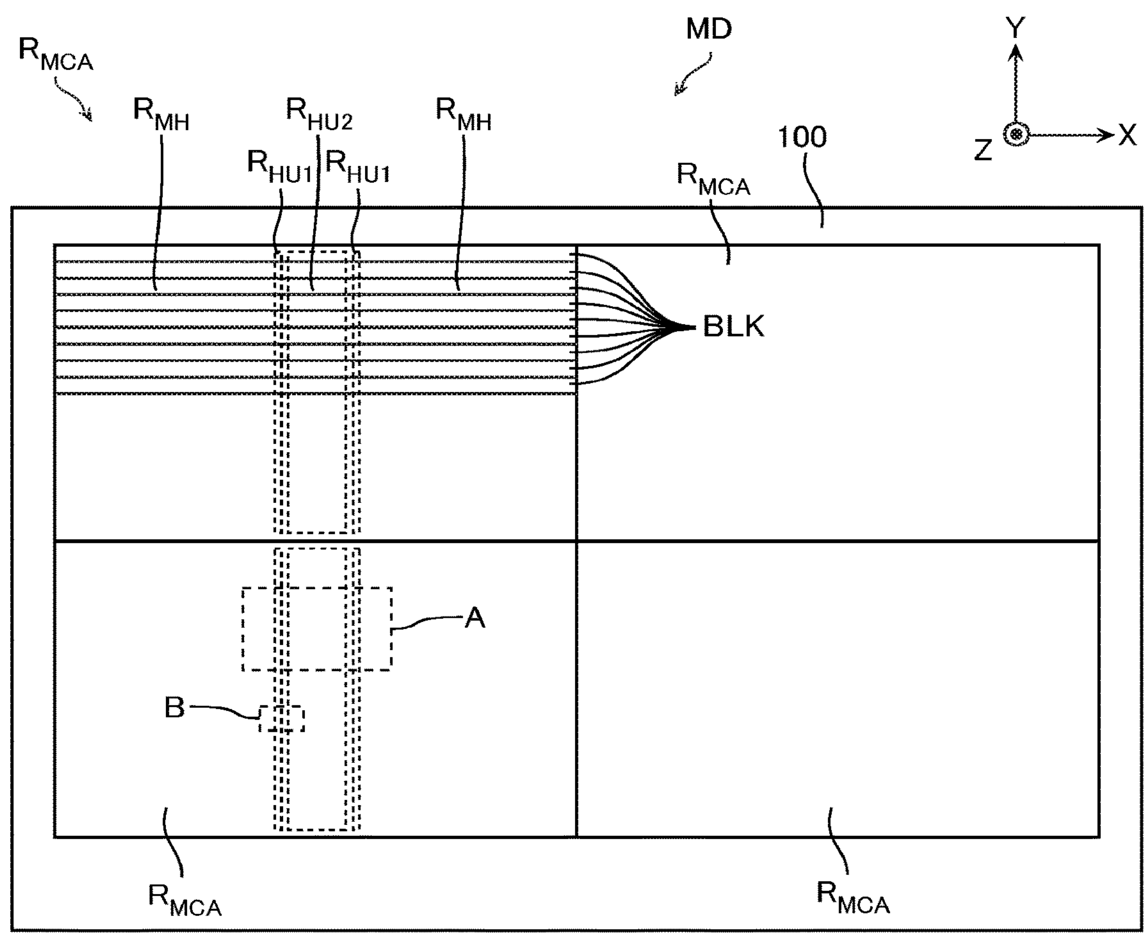
FIG. 10 is a schematic plan view of the memory die MD.
Figure 11:
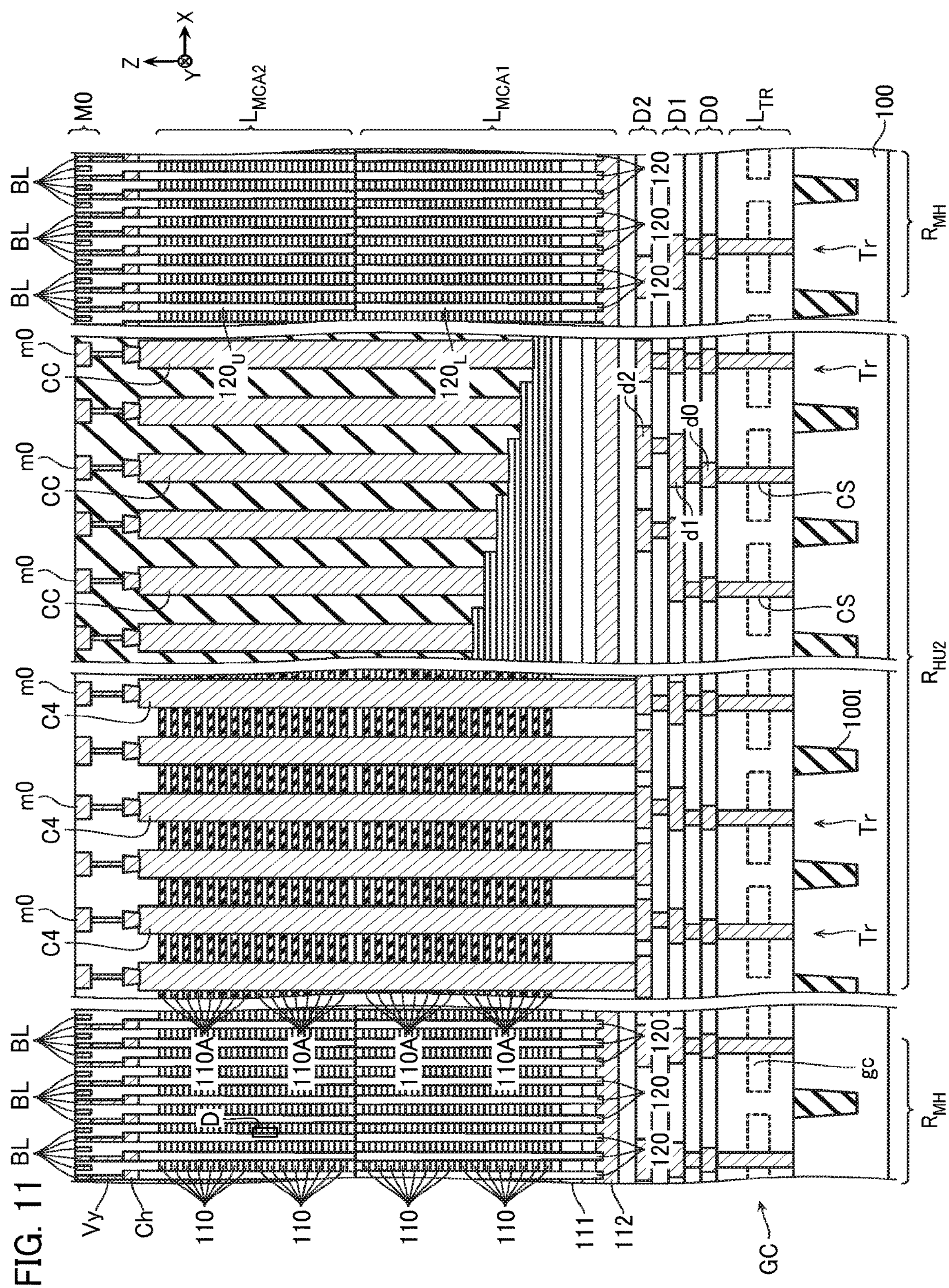
FIG. 11 is a schematic cross-sectional view of the memory die MD.
Figure 12:
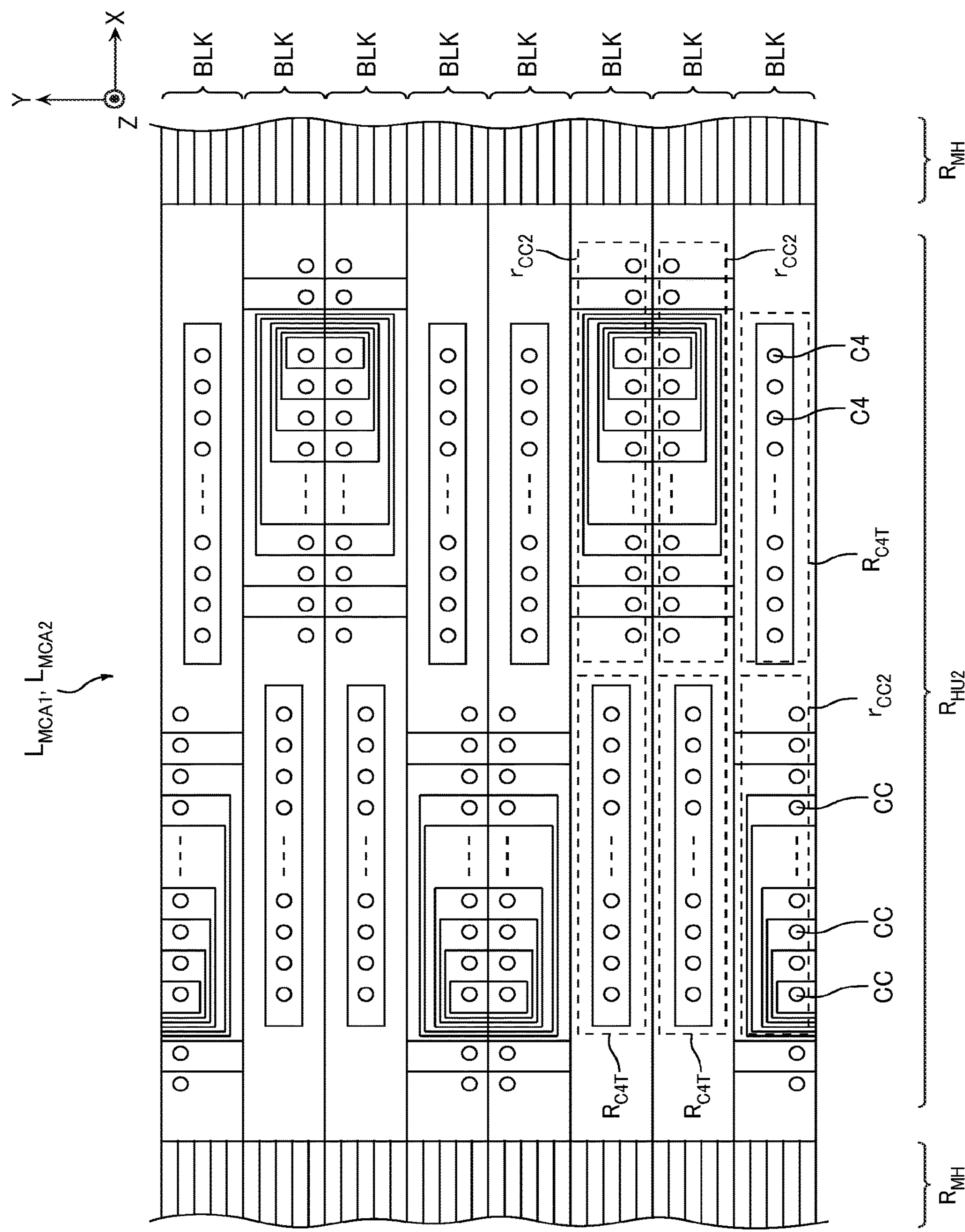
FIG. 12 is a schematic enlarged view of the portion indicated by A in FIG. 10.
Figure 15:
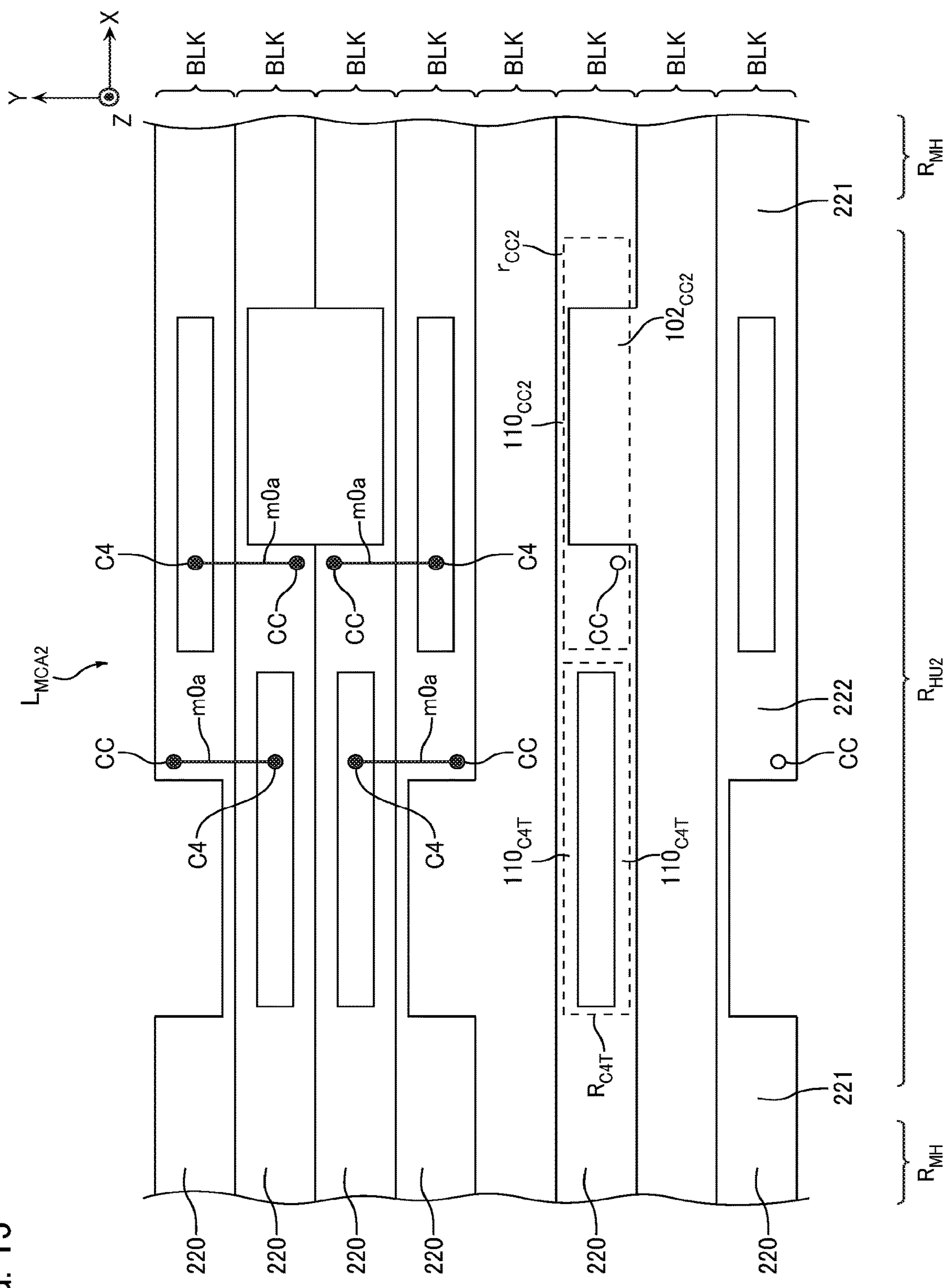
FIG. 15 is a schematic plan view in which the structure shown in FIG. 12 is shown with part thereof omitted.
Figure 16:
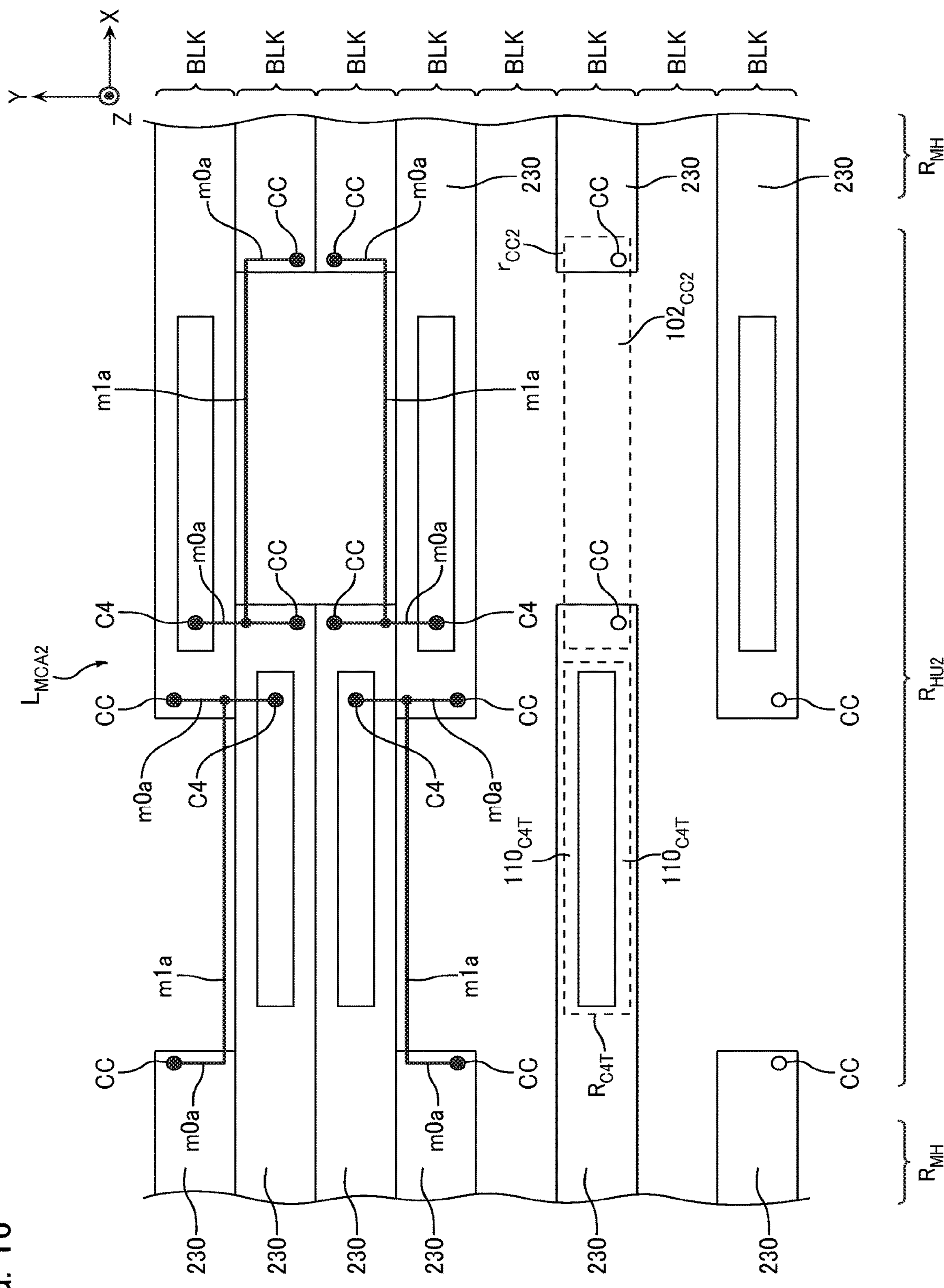
FIG. 16 is a schematic plan view in which the structure shown in FIG. 12 is shown with part thereof omitted.
Figure 17:
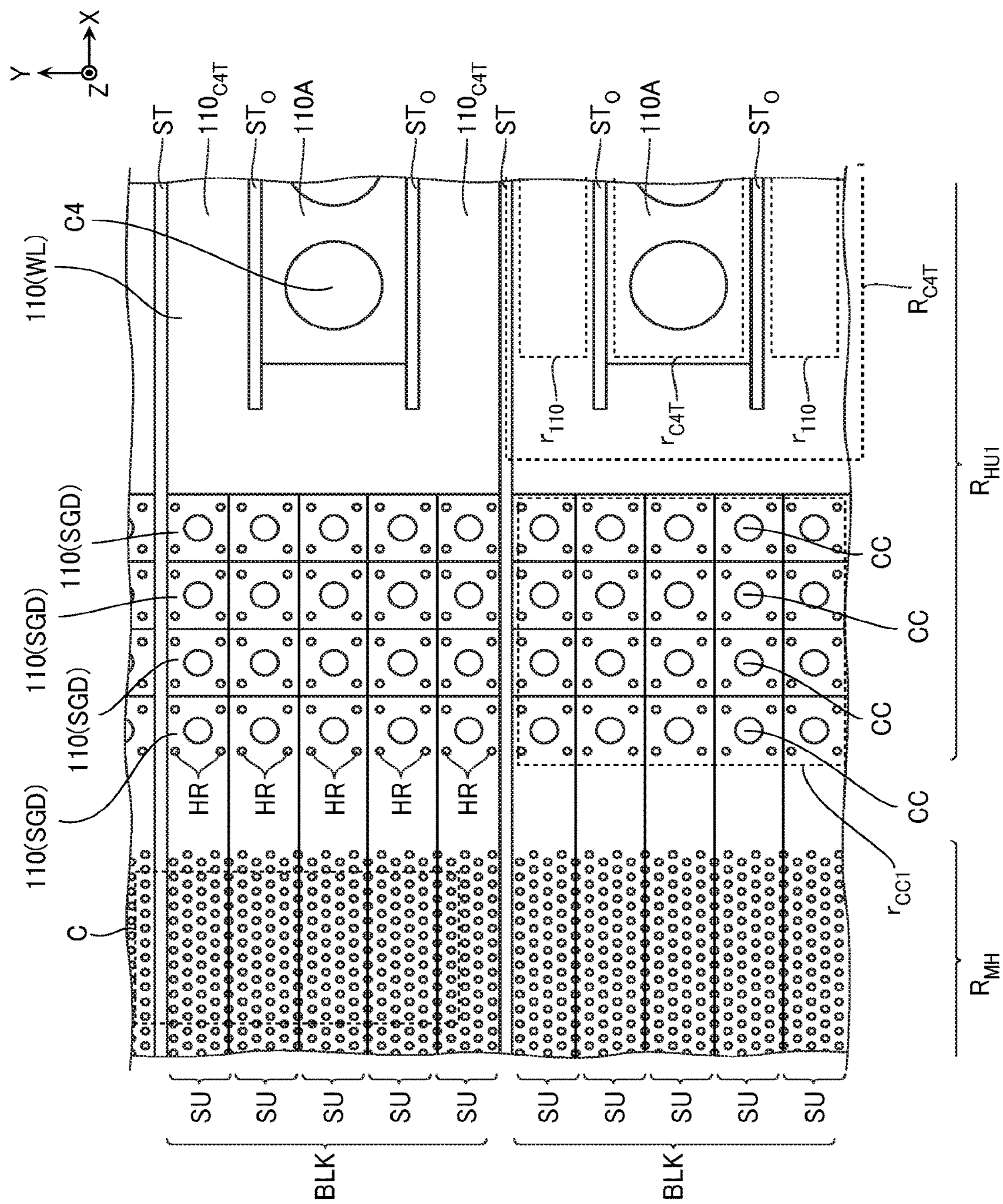
FIG. 17 is a schematic enlarged view of the portion indicated by B in FIG. 10.
Figure 18:
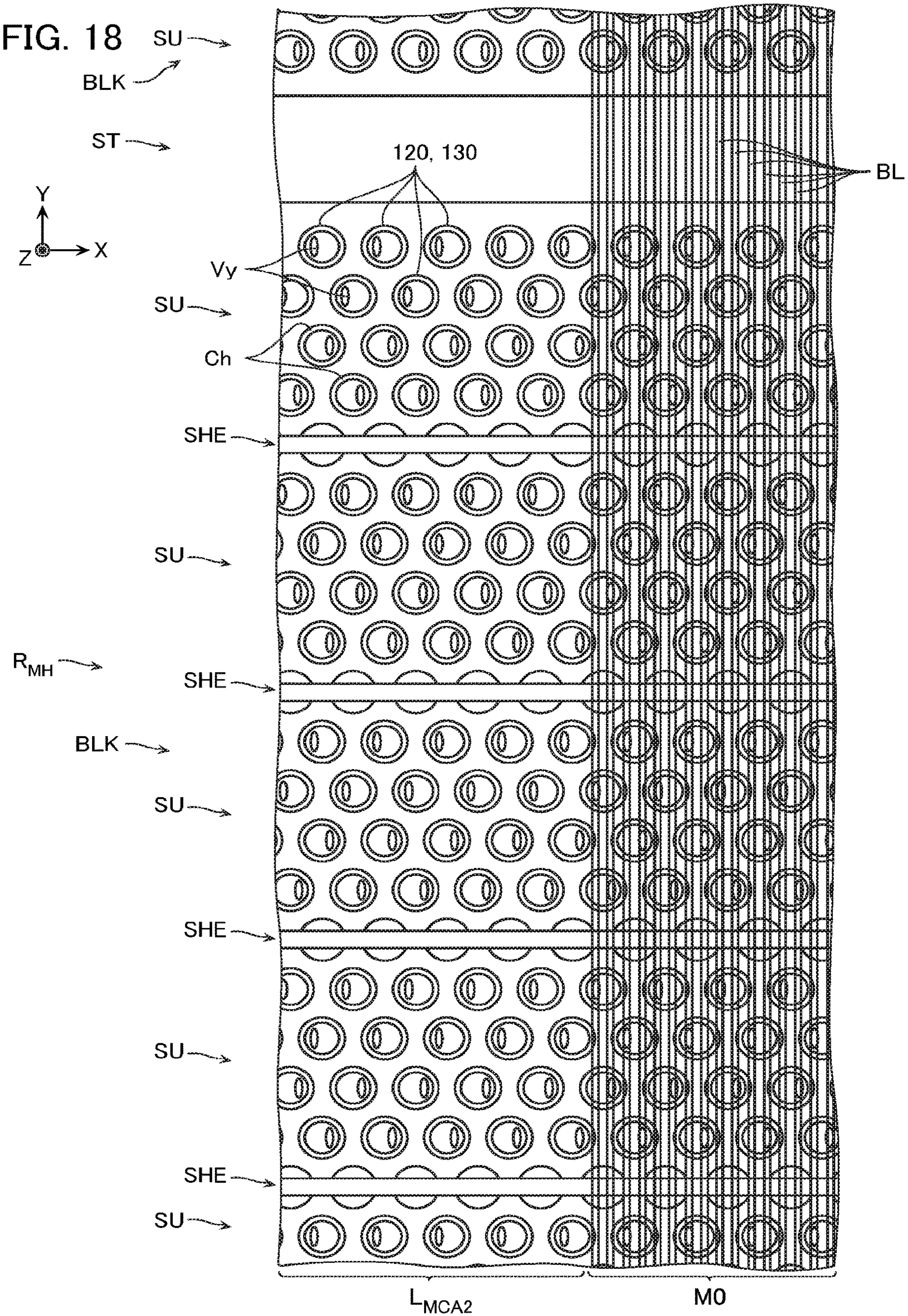
FIG. 18 is a schematic enlarged view of the portion indicated by C in FIG. 17.
Figure 19:
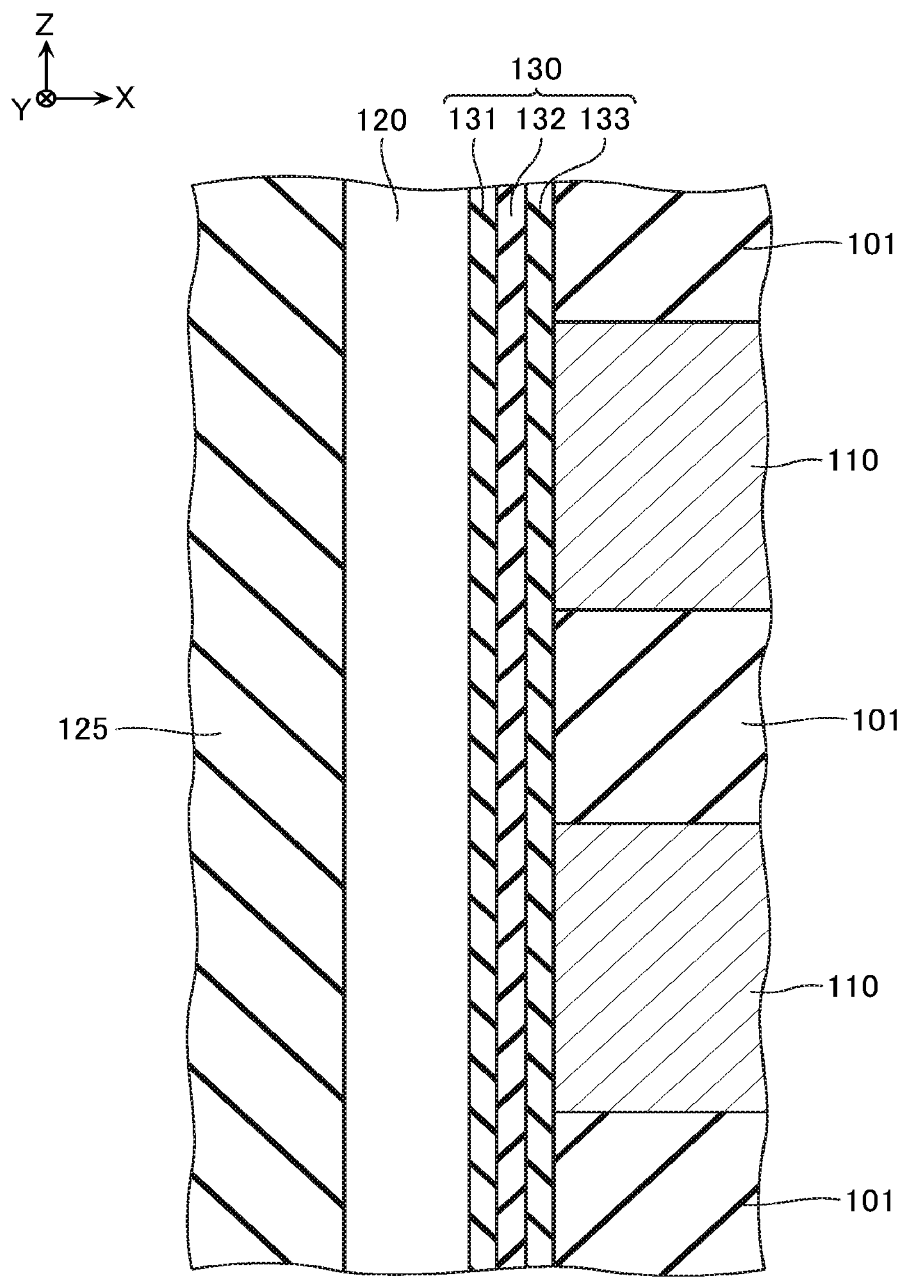
FIG. 19 is a schematic enlarged view of the portion indicated by D in FIG. 11.
Figure 20:
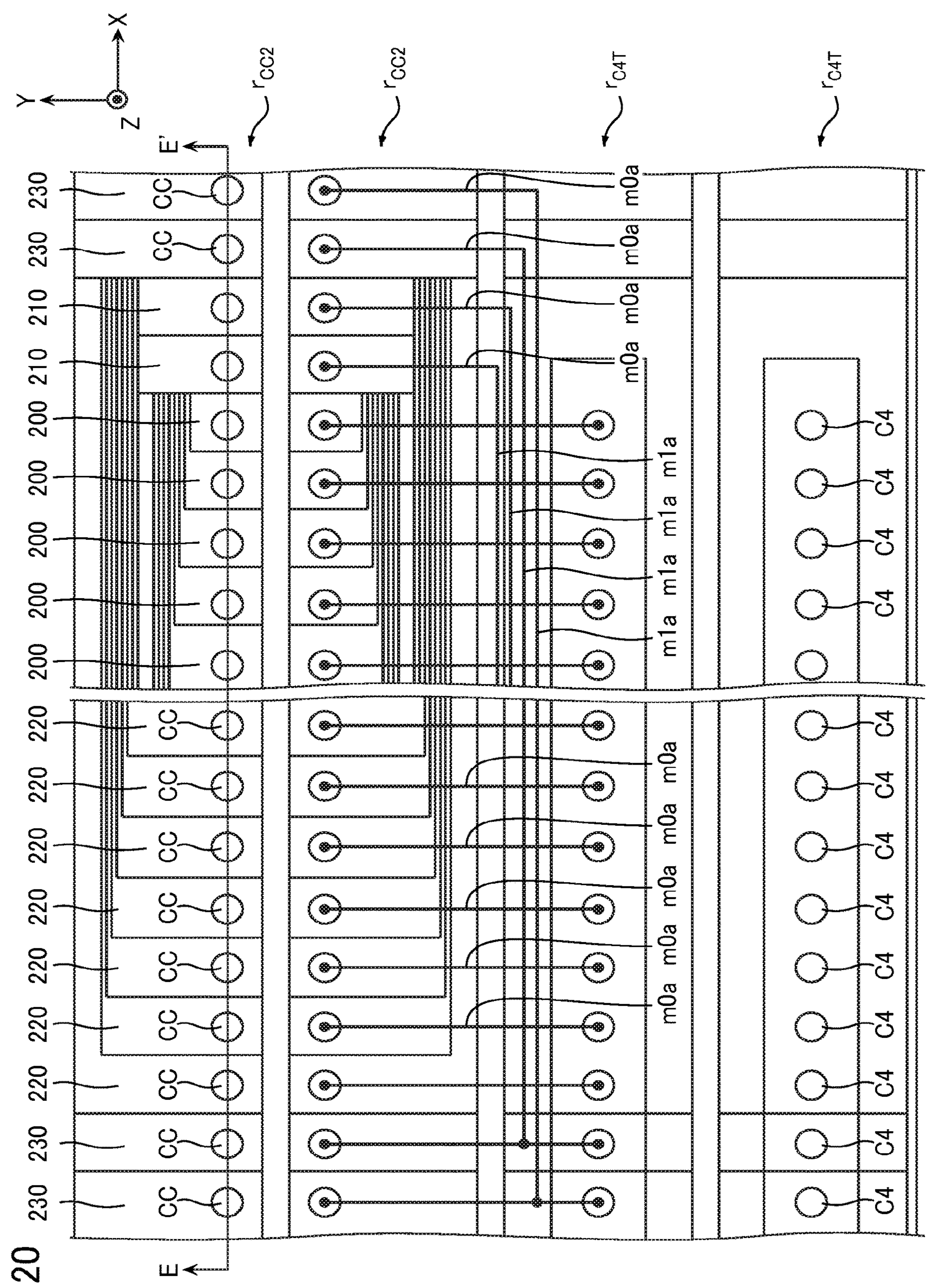
FIG. 20 is a schematic enlarged view of FIG. 12.
Figure 21:
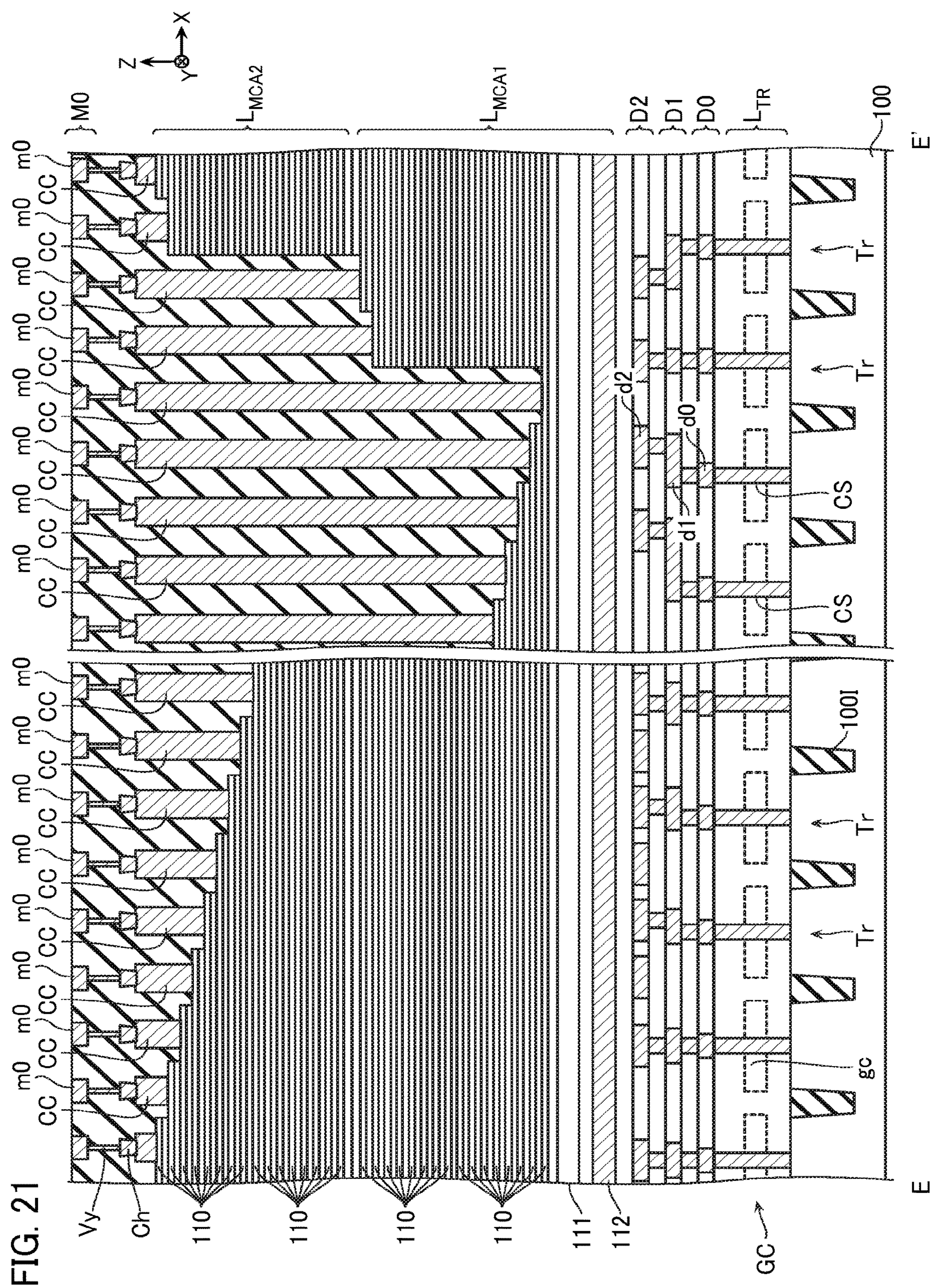
FIG. 21 is a schematic cross-sectional view in which the structure shown in FIG. 20 has been cut along the line E-E' and viewed along a direction of the arrows.

FIG. 10 is a schematic plan view of the memory die MD. FIG. 11 is a schematic cross-sectional view of the memory die MD. Note that FIG. 11 is a view for explaining a schematic configuration of the memory die MD, and does not show specific numbers, shapes, arrangements, and so on, of configurations. FIG. 12 is a schematic enlarged view of the portion indicated by A in FIG. 10. However, in FIG. 12, some of configurations of FIG. 10 (a later-mentioned first hookup region $R_{HU1}$) are omitted. FIGS. 13 to 16 are schematic plan views in which the structure shown in FIG. 12 is shown with parts thereof omitted. FIG. 17 is a schematic enlarged view of the portion indicated by B in FIG. 10. FIG. 18 is a schematic enlarged view of the portion indicated by C in FIG. 17. FIG. 19 is a schematic enlarged view of the portion indicated by D in FIG. 11. FIG. 20 is a schematic enlarged view of FIG. 12. FIG. 21 is a schematic cross-sectional view in which the structure shown in FIG. 20 has been cut along the line E-E' and viewed along a direction of the arrows.

Note that FIGS. 13 to 16 illustrate conductive layers 110, of a plurality of the conductive layers 110 shown in FIG. 12, that are provided at a certain height position (conductive layers 200, conductive layers 210, conductive layers 220, or conductive layers 230). Moreover, in FIGS. 13 to 16, configurations included in the second and fourth memory blocks BLK counting from a negative side in the Y direction, of a plurality of the memory blocks BLK aligned in the Y direction, are omitted.

As shown in FIG. 10, for example, the memory die MD comprises a semiconductor substrate 100. In the example illustrated, the semiconductor substrate 100 is provided with four memory cell array regions $R_{MCA}$ aligned in the X direction and the Y direction. Moreover, the memory cell array region $R_{MCA}$ comprises: two memory hole regions $R_{MH}$ aligned in the X direction; two of the first hookup regions $R_{HU1}$ aligned in the X direction between the two memory hole regions $R_{MH}$; and a second hookup region $R_{HU2}$ provided between the two first hookup regions $R_{HU1}$.

As shown in FIG. 11, for example, the memory die MD comprises: the semiconductor substrate 100; a transistor layer $L_{TR}$ provided on the semiconductor substrate 100; a wiring layer D0 provided above the transistor layer $L_{TR}$; a wiring layer D1 provided above the wiring layer D0; a wiring layer D2 provided above the wiring layer D1; a memory cell array layer $L_{MCA1}$ provided above the wiring layer D2; a memory cell array layer $L_{MCA2}$ provided above the memory cell array layer $L_{MCA1}$; a wiring layer M0 provided above the memory cell array layer $L_{MCA2}$; and unillustrated wiring layers provided above the wiring layer M0.

[Structure of Semiconductor Substrate 100]

The semiconductor substrate 100 is a semiconductor substrate configured from P type silicon (Si) including P type impurities such as boron (B), for example. A surface of the semiconductor substrate 100 is provided with: N type well regions including N type impurities such as phosphorus (P); P type well regions including P type impurities such as boron (B); semiconductor substrate regions where the N type well regions and the P type well regions are not provided; and insulating regions 1001.

[Structure of Transistor Layer $L_{TR}$]

As shown in FIG. 11, for example, a wiring layer GC is provided on an upper surface of the semiconductor substrate 100, via an unillustrated insulating layer. The wiring layer GC includes a plurality of electrodes gc that face the surface of the semiconductor substrate 100. Moreover, each of the regions of the semiconductor substrate 100 and the plurality of electrodes gc included in the wiring layer GC are respectively connected to contacts CS.

The N type well regions, the P type well regions, and the semiconductor substrate regions of the semiconductor substrate 100 respectively function as the likes of channel regions of a plurality of transistors Tr configuring the peripheral circuit PC and as one of electrodes of a plurality of capacitors configuring the peripheral circuit PC.

The plurality of electrodes gc included in the wiring layer GC respectively function as the likes of gate electrodes of the plurality of transistors Tr configuring the peripheral circuit PC and as the other electrodes of the plurality of capacitors configuring the peripheral circuit PC.

The contact CS extends in the Z direction, and has its lower end connected to an upper surface of the semiconductor substrate 100 or an upper surface of the electrode gc. A connecting portion of the contact CS and the semiconductor substrate 100 is provided with an impurity region including an N type impurity or a P type impurity. The contact CS may include, for example, a laminated film of a barrier conductive film of the likes of titanium nitride (TiN) and a metal film of the likes of tungsten (W), or the like.

[Structure of Wiring Layers D0, D1, D2]

As shown in FIG. 11, for example, a plurality of wirings included in the wiring layers D0, D1, D2 are electrically connected to at least one of configurations in the memory cell array MCA and configurations in the peripheral circuit PC.

The wiring layers D0, D1, D2 respectively include pluralities of wirings d0, d1, d2. These pluralities of wirings d0, d1, d2 may each include, for example, a laminated film of a barrier conductive film of the likes of titanium nitride (TiN) and a metal film of the likes of tungsten (W), or the like.

[Structure in Memory Hole Region $R_{MH}$ of Memory Cell Array Layers $L_{MCA1}$, $L_{MCA2}$]

As shown in FIG. 12, for example, the memory cell array layers $L_{MCA1}$, $L_{MCA2}$ are provided with a plurality of the memory blocks BLK aligned in the Y direction. As shown in FIG. 17, for example, the memory block BLK comprises a plurality of the string units SU aligned in the Y direction. An inter-block insulating layer ST of the likes of silicon oxide ($SiO_2$) is provided between two memory blocks BLK adjacent in the Y direction. As shown in FIG. 18, for example, an inter-string unit insulating layer SHE of the likes of silicon oxide ($SiO_2$) is provided between two string units SU adjacent in the Y direction.

As shown in FIG. 11, for example, the memory block BLK comprises: a plurality of the conductive layers 110 aligned in the Z direction; and a plurality of semiconductor layers 120 extending in the Z direction. Moreover, as shown in FIG. 19, for example, the memory block BLK comprises a plurality of gate insulating films 130 respectively provided between the plurality of conductive layers 110 and the plurality of semiconductor layers 120.

The conductive layer 110 is a substantially plate-like conductive layer extending in the X direction. The conductive layer 110 may include a laminated film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. An insulating layer 101 (FIG. 19) of the likes of silicon oxide ($SiO_2$) is provided between the plurality of conductive layers 110 aligned in the Z direction.

As shown in FIG. 11, for example, a conductive layer 111 is provided below the conductive layers 110. The conductive layer 111 may include the likes of polycrystalline silicon including an impurity such as phosphorus (P) or boron (B), for example. Moreover, an insulating layer of the likes of silicon oxide ($SiO_2$) is provided between the conductive layer 111 and the conductive layers 110.

A conductive layer 112 is provided below the conductive layer 111. The conductive layer 112 may include the likes of polycrystalline silicon including an impurity such as phosphorus (P) or boron (B), for example. Moreover, the conductive layer 112 may include a conductive layer of a metal such as tungsten (W), or a conductive layer of tungsten silicide, and so on, or may include another conductive layer, for example. Moreover, an insulating layer of the likes of silicon oxide ($SiO_2$) is provided between the conductive layer 112 and the conductive layer 111.

The conductive layer 112 functions as the source line SL (FIG. 3). The conductive layer 112 is provided in the memory cell array layer $L_{MCA1}$. The conductive layer 112 is commonly provided for all of the memory blocks BLK included in the memory cell array region $R_{MCA}$ (FIG. 10), for example.

The conductive layer 111 functions as the source side select gate line SGSb (FIG. 3) and as the gate electrodes of the plurality of source side select transistors STSb (FIG. 3) connected to this source side select gate line SGSb. The conductive layer 111 is provided in the memory cell array layer $L_{MCA1}$, and extends in the X direction over the two memory hole regions $R_{MH}$, the two first hookup regions $R_{HU1}$ provided between the two memory hole regions $R_{MH}$, and the second hookup region $R_{HU2}$ provided between the two first hookup regions $R_{HU1}$, that are aligned in the X direction. The conductive layer 111 is electrically independent every memory block BLK.

Moreover, one or a plurality of the conductive layers 110 positioned in a lowermost layer, of the plurality of conductive layers 110 function as the source side select gate line SGS (FIG. 3) and as the gate electrodes of the plurality of source side select transistors STS (FIG. 3) connected to this source side select gate line SGS. These conductive layers 110 are provided in the memory cell array layer $L_{MCA1}$, and extend in the X direction over the two memory hole regions $R_{MH}$, the two first hookup regions $R_{HU1}$ provided between the two memory hole regions $R_{MH}$, and the second hookup region $R_{HU2}$ provided between the two first hookup regions $R_{HU1}$, that are aligned in the X direction. These plurality of conductive layers 110 are electrically independent every memory block BLK.

Figure 13:
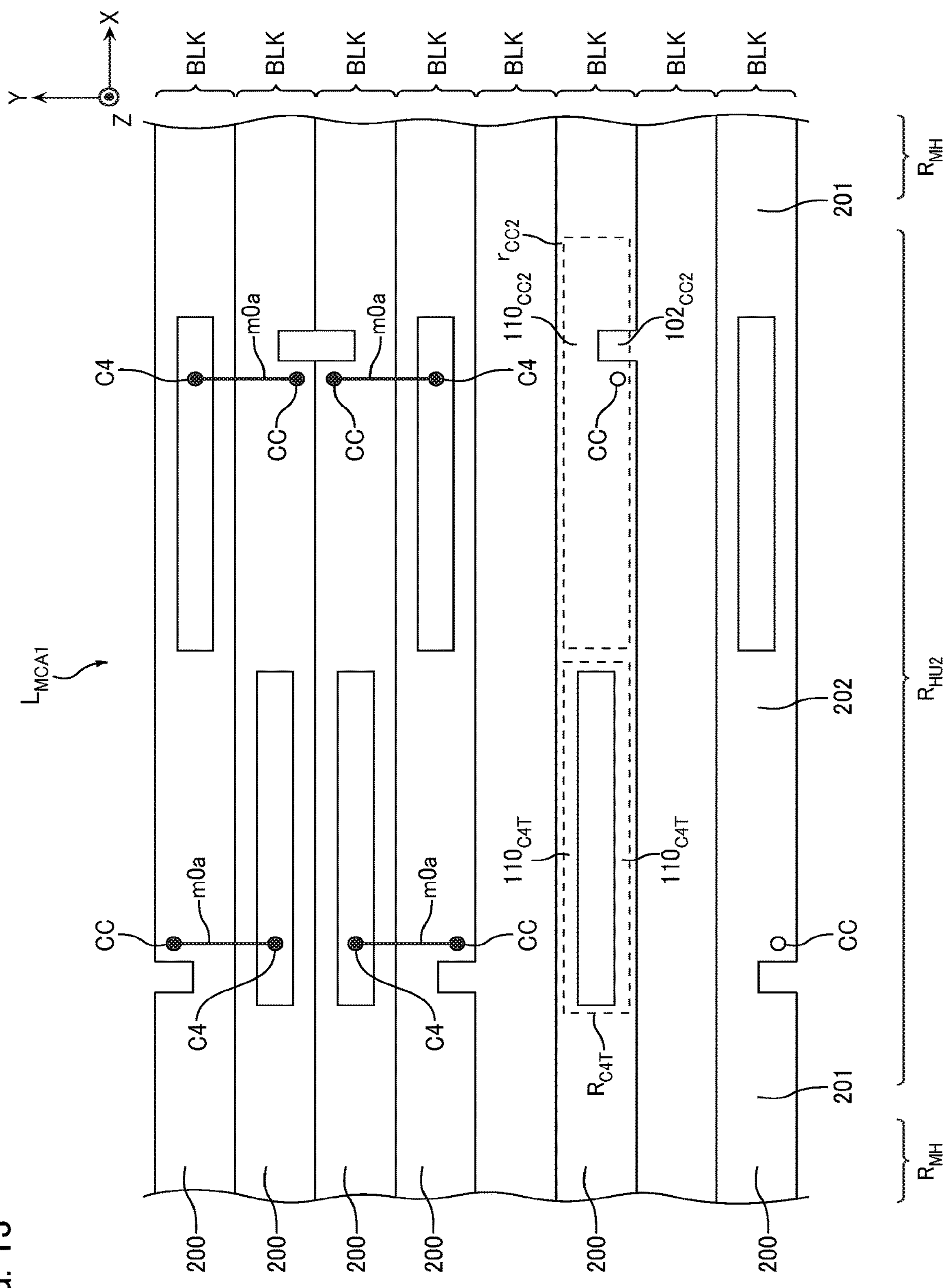
FIG. 13 is a schematic plan view in which the structure shown in FIG. 12 is shown with part thereof omitted.

Moreover, a plurality of the conductive layers 110 positioned above these lowermost layer-positioned conductive layers 110 function as some of the word lines WL (FIG. 3) and as the gate electrodes of the pluralities of memory cells MC (FIG. 3) connected to these word lines WL. In the description below, such a conductive layer 110 will sometimes be called the conductive layer 200 (FIG. 13). As exemplified in FIG. 13, for example, these plurality of conductive layers 200 are provided in the memory cell array layer $L_{MCA1}$, and extend in the X direction over the two memory hole regions $R_{MH}$, the two first hookup regions $R_{HU1}$ provided between the two memory hole regions $R_{MH}$ (omitted in FIG. 13; refer to FIG. 10), and the second hookup region $R_{HU2}$ provided between the two first hookup regions $R_{HU1}$, that are aligned in the X direction. Each of these plurality of conductive layers 200 comprise: two portions 201 provided in the two memory hole regions $R_{MH}$; and a portion 202 connected to both of these two portions 201. The two portions 201 are electrically connected to each other via the portion 202. Moreover, these plurality of conductive layers 200 are electrically independent every memory block BLK.

Figure 14:
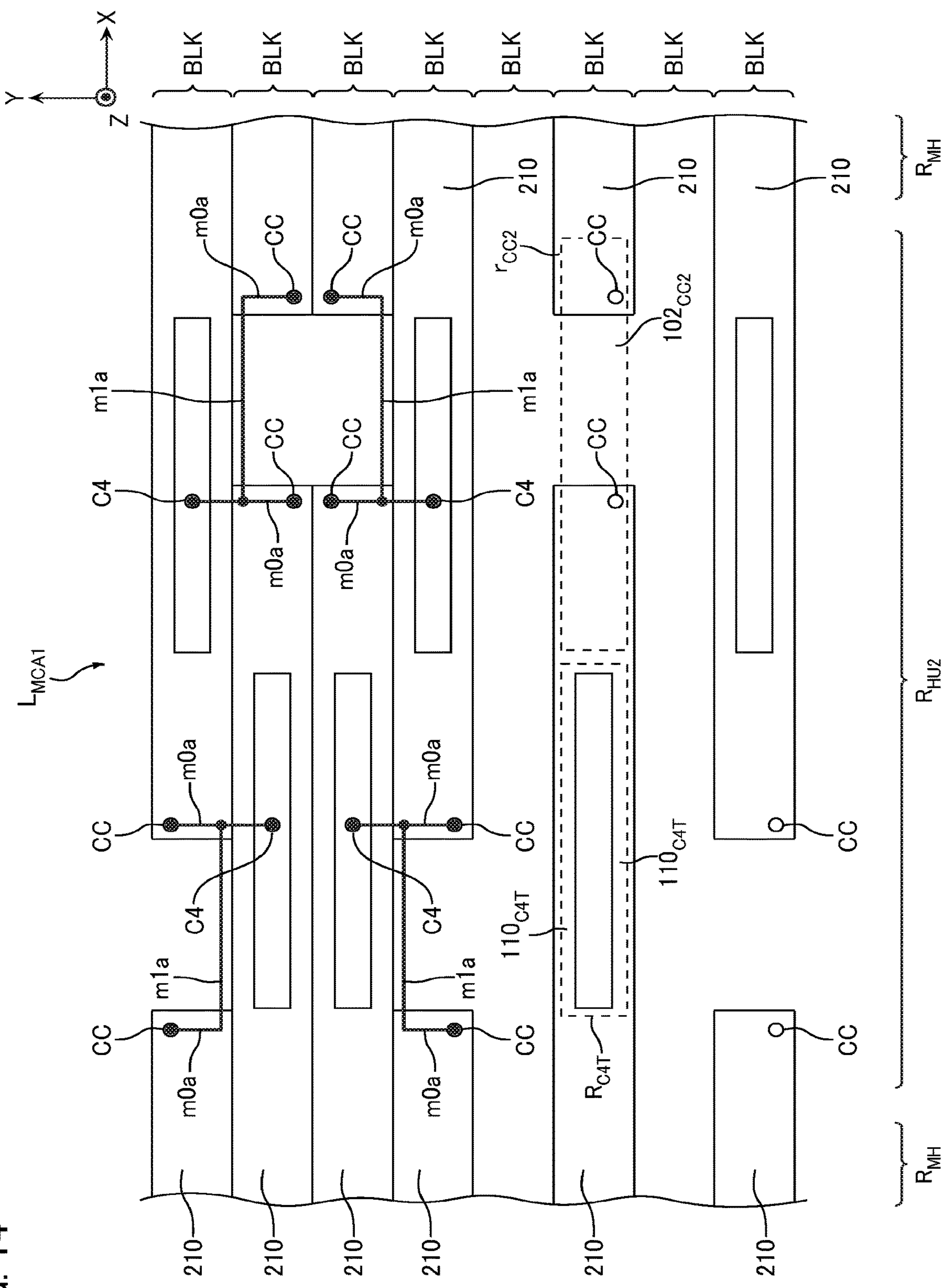
FIG. 14 is a schematic plan view in which the structure shown in FIG. 12 is shown with part thereof omitted.

Moreover, a group of pairs of the conductive layers 110 aligned in the X direction is laminated in the Z direction above the just-mentioned plurality of word line WL-functioning conductive layers 200. In the description below, such a conductive layer 110 will sometimes be called the conductive layer 210 (FIG. 14). These groups of a plurality of the conductive layers 210 function as some of the word lines WL (FIG. 3) and as the gate electrodes of the pluralities of memory cells MC (FIG. 3) connected to these word lines WL. These groups of a plurality of the conductive layers 200 are provided in the memory cell array layer $L_{MCA1}$. As exemplified in FIG. 14, for example, these two conductive layers 210 each extend in the X direction over one or the other of the memory hole regions $R_{MH}$, one or the other of the first hookup regions $R_{HU1}$ (omitted in FIG. 14; refer to FIG. 10), and part of the second hookup region $R_{HU2}$. These two conductive layers 210 are electrically connected to each other via contacts CC and a wiring m1*a*. Moreover, these plurality of conductive layers 210 are electrically independent every memory block BLK.

Moreover, a plurality of the conductive layers 110 positioned above the just-mentioned plurality of word line WL-functioning conductive layers 210 function as some of the word lines WL (FIG. 3) and as the gate electrodes of the pluralities of memory cells MC (FIG. 3) connected to these word lines WL. Note that in the description below, such a conductive layer 110 will sometimes be called the conductive layer 220 (FIG. 15). As exemplified in FIG. 15, for example, these plurality of conductive layers 220 are provided in the memory cell array layer $L_{MCA2}$, and extend in the X direction over the two memory hole regions $R_{MH}$, the two first hookup regions $R_{HU1}$ provided between the two memory hole regions $R_{MH}$ (omitted in FIG. 15; refer to FIG. 10), and the second hookup region $R_{HU2}$ provided between the two first hookup regions $R_{HU1}$, that are aligned in the X direction. These plurality of conductive layers 220 comprise: two portions 221 provided in the two memory hole regions $R_{MH}$; and a portion 222 connected to both of these two portions 221. The two portions 221 are electrically connected to each other via the portion 222. Moreover, these plurality of conductive layers 220 are electrically independent every memory block BLK.

Moreover, a group of pairs of the conductive layers 110 aligned in the X direction is laminated in the Z direction above the just-mentioned plurality of word line WL-functioning conductive layers 220. In the description below, such a conductive layer 110 will sometimes be called the conductive layer 230 (FIG. 16). These groups of a plurality of the conductive layers 230 function as some of the word lines WL (FIG. 3) and as the gate electrodes of the pluralities of memory cells MC (FIG. 3) connected to these word lines WL. These groups of a plurality of the conductive layers 230 are provided in the memory cell array layer $L_{MCA2}$. As exemplified in FIG. 16, for example, these two conductive layers 230 each extend in the X direction over one or the other of the memory hole regions $R_{MH}$, one or the other of the first hookup regions $R_{HU1}$ (omitted in FIG. 16; refer to FIG. 10), and part of the second hookup region $R_{HU2}$. These two conductive layers 230 are electrically connected to each other via contacts CC and a wiring m1*a*. Moreover, these plurality of conductive layers 230 are electrically independent every memory block BLK.

Moreover, one or a plurality of the conductive layers 110 positioned above the just-mentioned plurality of word line WL-functioning conductive layers 230 are provided in the memory cell array layer $L_{MCA2}$ and function as the drain side select gate line SGD (FIG. 3) and as the gate electrodes of the plurality of drain side select transistors STD (FIG. 3) connected to this drain side select gate line SGD. As exemplified in FIG. 17, for example, these plurality of conductive layers 110 have a smaller width in the Y direction than the other conductive layers 110. Moreover, as exemplified in FIG. 18, for example, the inter-string unit insulating layer SHE is provided between two of the conductive layers 110 adjacent in the Y direction. These plurality of conductive layers 110 are each electrically independent every string unit SU.

As shown in FIG. 18, for example, the semiconductor layers 120 are aligned in a certain pattern in the X direction and the Y direction. The semiconductor layer 120 functions as the channel regions of the plurality of memory cells MC and the select transistors (STD, STS, STSb) included in one memory string MS (FIG. 3). The semiconductor layer 120 is a semiconductor layer of the likes of polycrystalline silicon (Si), for example. The semiconductor layer 120 has a substantially cylindrical shape, and has its central portion provided with an insulating layer 125 (FIG. 19) of the likes of silicon oxide.

As shown in FIG. 11, for example, the semiconductor layer 120 comprises: a semiconductor region $\mathbf{120}_L$, included in the memory cell array layer $L_{MCA1}$; and a semiconductor region $\mathbf{120}_U$ included in the memory cell array layer $L_{MCA2}$. A lower end of the semiconductor layer 120 is connected to the conductive layer 112. An upper end of the semiconductor layer 120 is connected to the bit line BL via contacts Ch, Vy.

The semiconductor region $\mathbf{120}_L$ is a substantially cylindrical region extending in the Z direction. Outer peripheral surfaces of the semiconductor regions $\mathbf{120}_L$ are each surrounded by the plurality of conductive layers 110 and conductive layer 111 included in the memory cell array layer $L_{MCA1}$, and face these plurality of conductive layers 110 and conductive layer 111. Note that a diameter of a lower end portion (for example, a portion positioned below the plurality of conductive layers 110 and conductive layer 111 included in the memory cell array layer $L_{MCA1}$) of the semiconductor region $\mathbf{120}_L$ is smaller than a diameter of an upper end portion (for example, a portion positioned above the plurality of conductive layers 110 included in the memory cell array layer $L_{MCA1}$) of the semiconductor region $\mathbf{120}_L$.

The semiconductor region $\mathbf{120}_U$ is a substantially cylindrical region extending in the Z direction. Outer peripheral surfaces of the semiconductor regions $\mathbf{120}_U$ are each surrounded by the plurality of conductive layers 110 included in the memory cell array layer $L_{MCA2}$, and face these plurality of conductive layers 110. Note that a diameter of a lower end portion (for example, a portion positioned below the plurality of conductive layers 110 included in the memory cell array layer $L_{MCA2}$) of the semiconductor region $\mathbf{120}_U$ is smaller than a diameter of an upper end portion (for example, a portion positioned above the plurality of conductive layers 110 included in the memory cell array layer $L_{MCA2}$) of the semiconductor region $\mathbf{120}_U$ and the diameter of the upper end portion of the above-described semiconductor region $\mathbf{120}_L$.

The gate insulating film 130 (FIG. 19) has a substantially cylindrical shape covering an outer peripheral surface of the semiconductor layer 120. The gate insulating film 130 comprises a tunnel insulating film 131, a charge accumulating film 132, and a block insulating film 133 that are laminated between the semiconductor layer 120 and the conductive layers 110. The tunnel insulating film 131 and the block insulating film 133 are insulating films of the likes of silicon oxide ($SiO_2$), for example. The charge accumulating film 132 is a film capable of accumulating charge, of the likes of silicon nitride ($Si_3N_4$), for example. The tunnel insulating film 131, the charge accumulating film 132, and the block insulating film 133 have substantially cylindrical shapes, and extend in the Z direction along the outer peripheral surface of the semiconductor layer 120 excluding a contacting portion of the semiconductor layer 120 and the conductive layer 112.

Note that FIG. 19 shows an example where the gate insulating film 130 comprises the charge accumulating film 132 of the likes of silicon nitride. However, the gate insulating film 130 may comprise floating gates of the likes of polycrystalline silicon including an N type or P type impurity, for example.

[Structure in First Hookup Region $R_{HU1}$ of Memory Cell Array Layers $L_{MCA1}$, $L_{MCA2}$]

As shown in FIG. 17, the first hookup region $R_{HU1}$ is provided with contact connection subregions $r_{CC1}$ that are respectively provided correspondingly to the memory blocks BLK. Moreover, regions corresponding to some of the memory blocks BLK are provided with contact connection regions $R_{C4T}$.

The contact connection subregion $r_{CC1}$ is provided with end portions in the X direction of a plurality of the conductive layers 110 functioning as the drain side select gate lines SGD. In addition, the contact connection subregion $r_{CC1}$ is provided with a plurality of the contacts CC aligned in a matrix-like manner looking from the Z direction. These plurality of contacts CC extend in the Z direction, and have their lower ends connected to the conductive layers 110. The contact CC may include, for example, a laminated film of a barrier conductive film of the likes of titanium nitride (TiN) and a metal film of the likes of tungsten (W), or the like.

The contact CC closest to the memory hole region $R_{MH}$, of a plurality of the contacts CC aligned in the X direction is connected to the first conductive layer 110 counting from above. Moreover, the contact CC second closest to the memory hole region $R_{MH}$ is connected to the second conductive layer 110 counting from above. Likewise, the contact CC a-th closest to the memory hole region $R_{MH}$ (where a is a natural number) is connected to the a-th conductive layer 110 counting from above. These plurality of contacts CC are connected to drain electrodes of the transistors Tr, via a wiring m0, and so on, of the wiring layer M0, and so on, a contact C4, the wirings d0, d1, d2 in the wiring layers D0, D1, D2, and the contact CS.

Moreover, the first hookup region $R_{HU1}$ is provided with support structures HR that are provided in a vicinity of the contact CC. The support structure HR extends in the Z direction and has its lower end connected to the conductive layer 112, for example. The support structure HR includes silicon oxide ($SiO_2$), for example.

The contact connection region $R_{C4T}$ is provided with two insulating layers $ST_O$ that are aligned in the Y direction between two inter-block insulating layers ST aligned in the Y direction. Moreover, a contact connection subregion $r_{C4T}$ is provided between these two insulating layers $ST_O$. Moreover, conductive layer connection subregion $r_{110}$ are provided between the inter-block insulating layers ST and the insulating layers $ST_O$. These regions extend in the X direction along the inter-block insulating layer ST.

The insulating layer $ST_O$ extends in the Z direction and has its lower end connected to the conductive layer 112 (FIG. 11). The insulating layer $ST_O$ includes silicon oxide ($SiO_2$), for example.

As shown in FIG. 11, for example, the contact connection subregion $r_{C4T}$ comprises: a plurality of insulating layers 110A aligned in the Z direction; and a plurality of the contacts C4 extending in the Z direction.

The insulating layer 110A is a substantially plate-like insulating layer extending in the X direction. The insulating layer 110A may include an insulating layer of the likes of silicon nitride (SiN). Insulating layers of the likes of silicon oxide ($SiO_2$) are provided between each two of the plurality of insulating layers 110A aligned in the Z direction.

A plurality of the contacts C4 are aligned in the X direction. The contact C4 may include a laminated film of a barrier conductive film of the likes of titanium nitride (TiN) and a metal film of the likes of tungsten (W), or the like. As shown in FIG. 11, for example, outer peripheral surfaces of the contacts C4 are each surrounded by the insulating layers 110A and insulating layers 101, and are connected to these insulating layers 110A and insulating layers 101. The contact C4 extends in the Z direction, has its upper end connected to the wiring m0 in the wiring layer M0, and has its lower end connected to the wiring d2 in the wiring layer D2.

As shown in FIG. 17, for example, the conductive layer connection subregion $r_{110}$ comprises narrow portions $\mathbf{110}_{C4T}$ of the plurality of conductive layers 110 aligned in the Z direction.

[Structure in Second Hookup Region $R_{HU2}$ of Memory Cell Array Layers $L_{MCA1}$, $L_{MCA2}$]

As shown in FIG. 12, the second hookup region $R_{HU2}$ is provided with a plurality of contact connection subregions $r_{CC2}$ and plurality of the above-described contact connection regions $R_{C4T}$, correspondingly to the plurality of memory blocks BLK.

The contact connection subregion $r_{CC2}$ is provided with parts of the plurality of conductive layers 110 functioning as the word lines WL or source side select gate line SGS. In addition, the contact connection subregion $r_{CC2}$ is provided with a plurality of the contacts CC aligned in the X direction looking from the Z direction. As shown in FIG. 21, these plurality of contacts CC are respectively connected to the conductive layers 110. Moreover, as shown in FIGS. 11 and 20, these plurality of contacts CC are connected to the drain electrodes of the transistors Tr, via the wiring m0, and so on, of the wiring layer M0, and so on, the contact C4, the wirings d0, d1, d2 in the wiring layers D0, D1, D2, and the contact CS.

Note that as shown in FIG. 13, the portion 202 of the conductive layer 200 comprises a narrow portion $\mathbf{110}_{CC2}$ which is provided in the contact connection subregion $r_{CC2}$. Moreover, a region adjacent in the Y direction to this narrow portion $\mathbf{110}_{CC2}$ is provided with an opening $\mathbf{102}_{CC2}$. The narrow portion $\mathbf{110}_{CC2}$, along with the narrow portion $\mathbf{110}_{C4T}$ in the contact connection region $R_{C4T}$, cause the two portions 201 adjacent in the X direction to be electrically conducted. Moreover, the conductive layer 200 is connected with one contact CC. The opening $\mathbf{102}_{CC2}$ is provided with a contact CC which is connected to a conductive layer 110 provided below the conductive layer 200 exemplified in FIG. 13.

Moreover, as shown in FIG. 14, the narrow portion $\mathbf{110}_{CC2}$ of the kind exemplified in FIG. 13 is not provided between the two conductive layers 210 aligned in the X direction. Moreover, these two conductive layers 210 are respectively connected with the contacts CC. Moreover, the opening $\mathbf{102}_{CC2}$ is provided between these two conductive layers 210. The opening $\mathbf{102}_{CC2}$ is provided with contacts CC which are connected to a conductive layer 110 provided below the conductive layer 210 exemplified in FIG. 14.

Moreover, as shown in FIG. 15, the portion 222 of the conductive layer 220 comprises the narrow portion $\mathbf{110}_{CC2}$ which is provided in the contact connection subregion $r_{CC2}$. Moreover, a region adjacent in the Y direction to this narrow portion $\mathbf{110}_{CC2}$ is provided with the opening $\mathbf{102}_{CC2}$. The narrow portion $\mathbf{110}_{CC2}$, along with the narrow portion $\mathbf{110}_{C4T}$ in the contact connection region $R_{C4T}$, cause the two portions 221 adjacent in the X direction to be electrically conducted. Moreover, the conductive layer 220 is connected with one contact CC. The opening $\mathbf{102}_{CC2}$ is provided with a contact CC which is connected to a conductive layer 110 provided below the conductive layer 220 exemplified in FIG. 15.

Moreover, as shown in FIG. 16, the narrow portion $\mathbf{110}_{CC2}$ of the kind exemplified in FIG. 15 is not provided between the two conductive layers 230 aligned in the X direction. Moreover, these two conductive layers 230 are respectively connected with the contacts CC. Moreover, the opening $\mathbf{102}_{CC2}$ is provided between these two conductive layers 230. The opening $\mathbf{102}_{CC2}$ is provided with contacts CC which are connected to a conductive layer 110 provided below the conductive layer 230 exemplified in FIG. 16.

[Structure of Wiring Layer M0, and so on]

As shown in FIG. 11, a plurality of wirings included in the wiring layer M0 are electrically connected to at least one of configurations in the memory cell array layers $L_{MCA1}$, $L_{MCA2}$ and configurations in the transistor layer $L_{TR}$, for example.

The wiring layer M0 includes a plurality of the wirings m0. These plurality of wirings m0 may include, for example, a laminated film of a barrier conductive film of the likes of titanium nitride (TiN) and a metal film of the likes of copper (Cu), or the like.

Some of the plurality of wirings m0 function as the bit lines BL (FIG. 3). As shown in FIG. 18, for example, the bit lines BL are aligned in the X direction and extend in the Y direction. Moreover, these plurality of bit lines BL are respectively connected to one semiconductor layer 120 included in each of the string units SU.

Moreover, some of the plurality of wirings m0 function as wirings m0*a* exemplified in FIGS. 13 to 16. The wiring m0*a* is a wiring provided in a current path between the above-mentioned contact CC and contact C4, and extends in the Y direction.

Moreover, as mentioned above, wiring layers are further provided above the wiring layer M0. These wiring layers each include a plurality of wirings. These plurality of wirings may include, for example, a laminated film of a barrier conductive film of the likes of titanium nitride (TiN) or tantalum nitride (TaN) and a metal film of the likes of copper (Cu), or the like.

Some of these plurality of wirings function as wirings m1*a* exemplified in FIGS. 14 and 16. The wiring m1*a* is a wiring provided in a current path between the above-mentioned contact CC and contact C4, and extends in the X direction.

[Threshold Voltage of Memory Cell MC]

Next, threshold voltage of the memory cell MC will be described with reference to FIGS. 22A, 22B, and 22C.

Figures 22A, 22B, 22C:
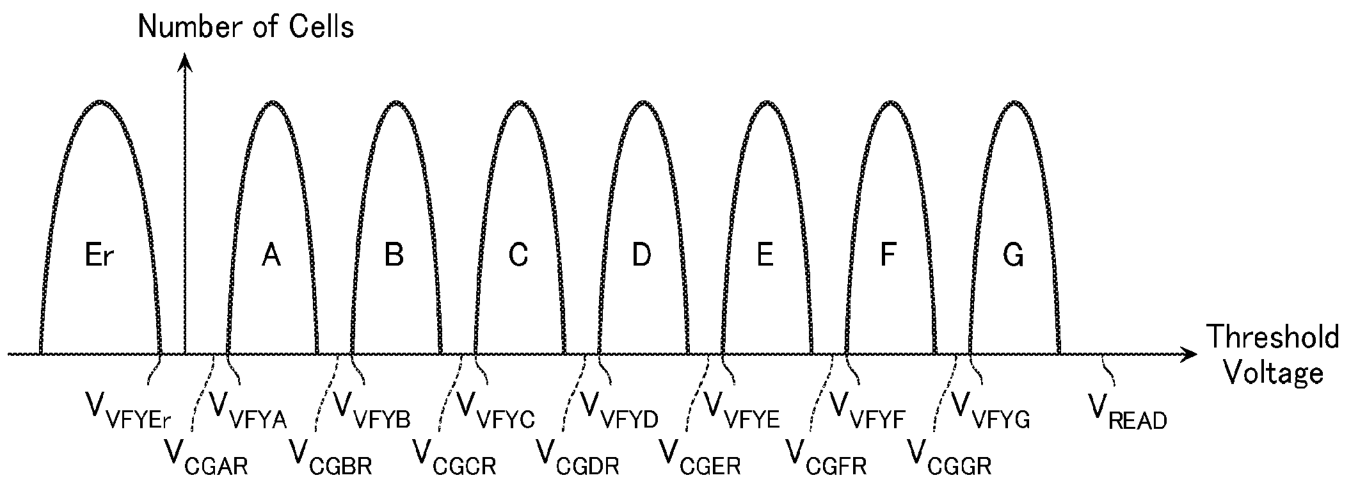
FIG. 22A is a schematic histogram for explaining threshold voltage of a memory cell MC storing 3-bit data.
FIG. 22B is a table showing one example of a relationship of threshold voltages and stored data of a memory cell MC storing 3-bit data.
FIG. 22C is a table showing another example of a relationship of threshold voltages and stored data of a memory cell MC storing 3-bit data.

FIG. 22A is a schematic histogram for explaining threshold voltages of the memory cells MC storing 3-bit data. The horizontal axis indicates voltage of the word line WL, and the vertical axis indicates number of memory cells MC. FIG. 22B is a table showing one example of a relationship of threshold voltages and stored data of the memory cells MC storing 3-bit data. FIG. 22C is a table showing another example of a relationship of threshold voltages and stored data of the memory cell MC storing 3-bit data.

In the example of FIG. 22A, the threshold voltages of the memory cells MC are controlled to eight types of states. The threshold voltages of the memory cells MC controlled to an Er state are smaller than an erase verify voltage $V_{VFYEr}$. Moreover, for example, the threshold voltages of the memory cells MC controlled to an A state is larger than a verify voltage $V_{VFYA}$, but smaller than a verify voltage $V_{VFYB}$. Moreover, for example, the threshold voltages of the memory cells MC controlled to a B state is larger than the verify voltage $V_{VFYB}$, but smaller than a verify voltage $V_{VFYC}$. Likewise, the threshold voltages of the memory cells MC controlled to C through F states are respectively larger than verify voltages $V_{VFYC}$ through $V_{VFYF}$, but smaller than verify voltages $V_{VFYD}$ through $V_{VFYG}$. Moreover, for example, the threshold voltages of the memory cells MC controlled to a G state is larger than the verify voltage $V_{VFYG}$, but smaller than a read pass voltage $V_{READ}$.

Moreover, in the example of FIG. 22A, a read voltage $V_{CGAR}$ is set between the threshold voltages corresponding to the Er state and the threshold voltages corresponding to the A state. Moreover, a read voltage $V_{CGBR}$ is set between the threshold voltages corresponding to the A state and the threshold voltages corresponding to the B state. Likewise, read voltages $V_{CGCR}$ through $V_{CGGR}$ are respectively set between the threshold voltages corresponding to the B state and threshold voltages corresponding to the C state through threshold voltages corresponding to the F state and threshold voltages corresponding to the G state.

For example, the Er state corresponds to a lowest threshold voltage. The memory cells MC in the Er state are the memory cells MC in an erased state, for example. The memory cells MC in the Er state are assigned with data "111", for example.

Moreover, the A state corresponds to a threshold voltage which is higher than the threshold voltage corresponding to the above-described Er state. The memory cells MC in the A state are assigned with data "101", for example.

Moreover, the B state corresponds to a threshold voltage which is higher than the threshold voltage corresponding to the above-described A state. The memory cells MC in the B state are assigned with data "001", for example.

Likewise, the C through G states in the drawings correspond to threshold voltages which are higher than the threshold voltages corresponding to the B through F states. The memory cells MC in these states are assigned with data "011", "010", "110", "100", "000", for example.

Note that in the case of assignation of the kind exemplified in FIG. 22B, lower bit data is discriminable by the single read voltage $V_{CGDR}$, middle bit data is discriminable by the three read voltages $V_{CGAR}$, $V_{CGCR}$, $V_{CGFR}$, and upper bit data is discriminable by the three read voltages $V_{CGBR}$, $V_{CGER}$, $V_{CGGR}$.

Note that the number of bits of data stored in the memory cell MC, the number of states, the assignation of data to each of the states, and so on, may be appropriately changed.

For example, in the case of assignation of the kind exemplified in FIG. 22C, lower bit data is discriminable by the single read voltage $V_{CGDR}$, middle bit data is discriminable by the two read voltages $V_{CGBR}$, $V_{CGFR}$, and upper bit data is discriminable by the four read voltages $V_{CGAR}$, $V_{CGCR}$, $V_{CGER}$, $V_{CGGR}$.

[Read Operation]

Next, a read operation of the semiconductor memory device according to the present embodiment will be described.

Figure 23:
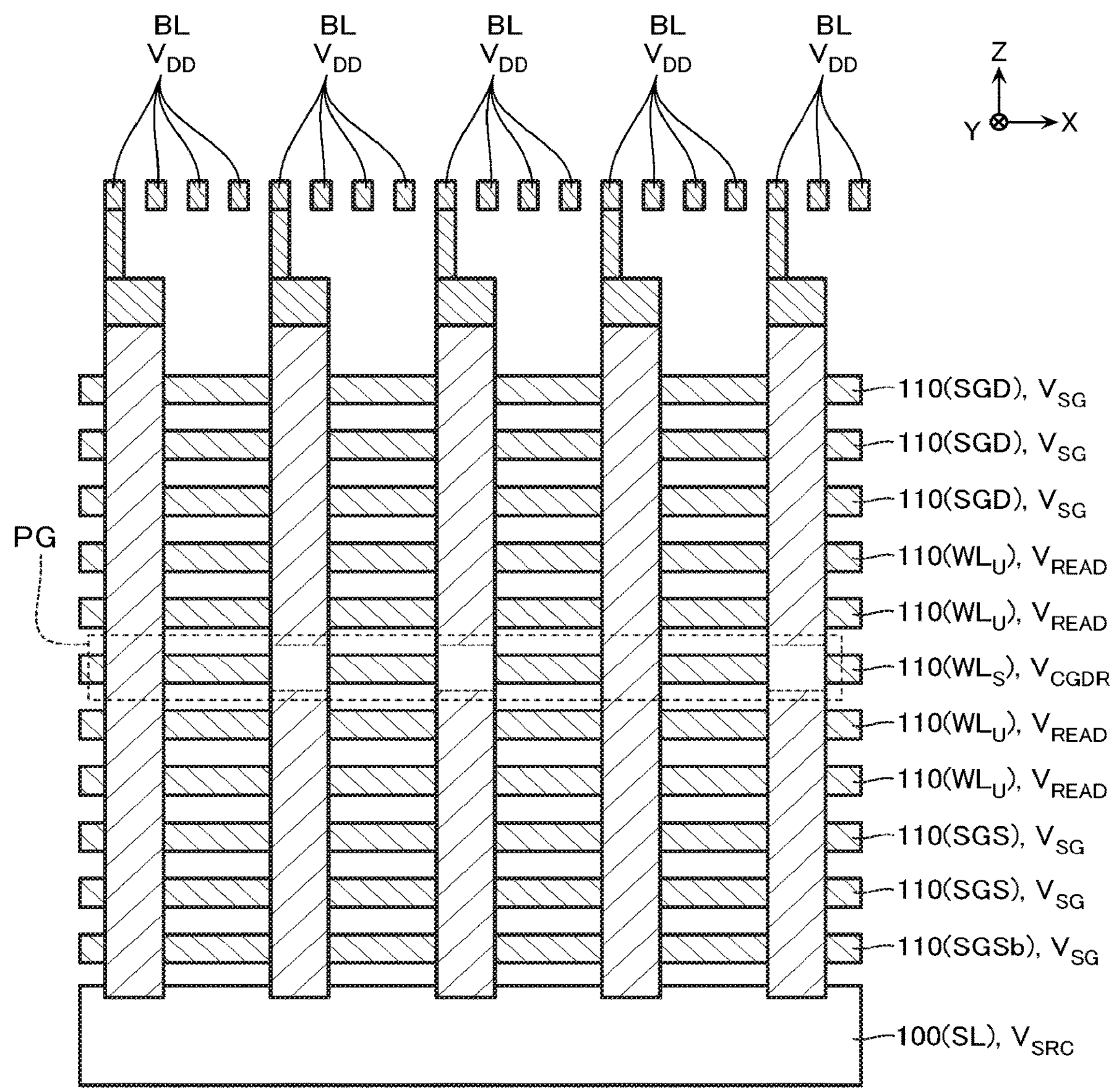
FIG. 23 is a schematic cross-sectional view for explaining a read operation.
Figure 24:
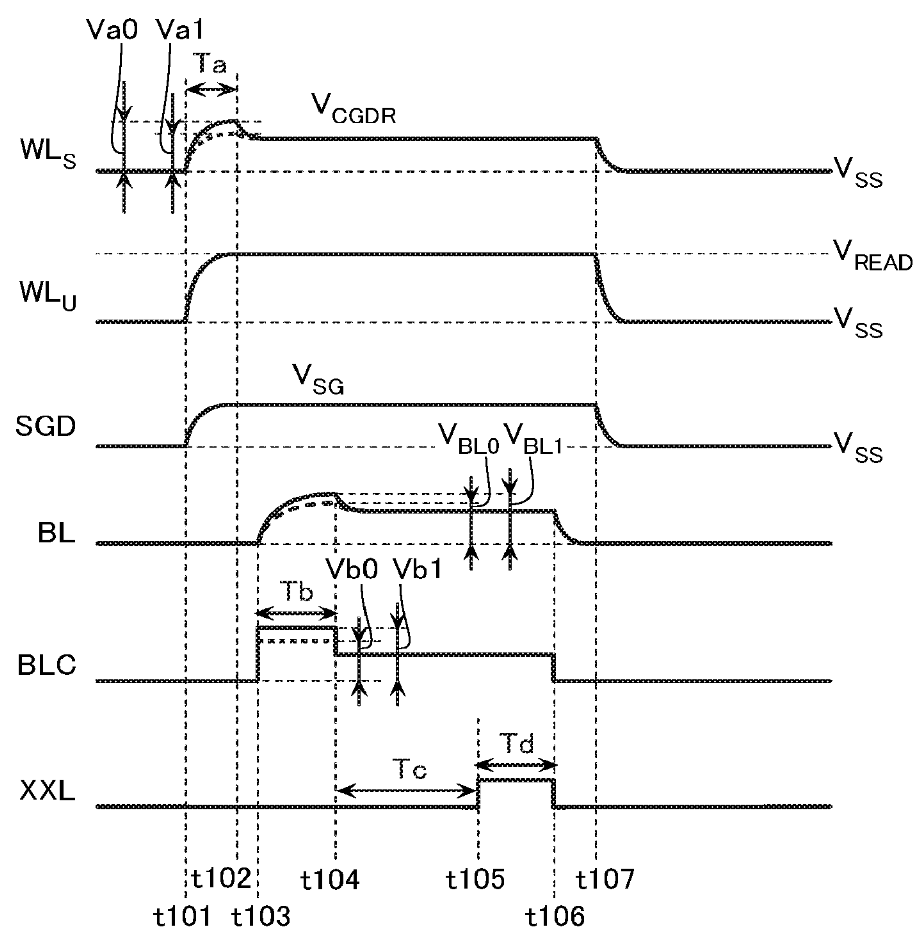
FIG. 24 is a timing chart for explaining the read operation.

FIG. 23 is a schematic cross-sectional view for explaining the read operation. FIG. 24 is a timing chart for explaining the read operation.

Note that in the description below, sometimes, the word line WL representing a target of operation will be called a selected word line $WL_S$, and the other word lines WL will be called unselected word lines $WL_U$. Moreover, the description below describes an example where a plurality of memory cells MC included in the string unit SU representing a target of operation and connected to the selected word line $WL_S$ (hereafter, sometimes called "selected memory cells MC") undergo execution of the read operation. Moreover, in the description below, a configuration including such a plurality of selected memory cells MC will sometimes be called a selected page PG.

At timing t101 of the read operation, as shown in FIG. 24, for example, the unselected word lines $WL_U$ are supplied with the read pass voltage $V_{READ}$, whereby the unselected memory cells MC are set to an ON state. Moreover, the selected word line $WL_S$ is supplied with a read voltage to be used in read (any of the read voltages $V_{CGAR}$-$V_{CGGR}$ described with reference to FIG. 22A) or a voltage larger than the read voltage. Moreover, the select gate lines (SGD, SGS, SGSb) are supplied with a voltage $V_{SG}$. The voltage $V_{SG}$ has a magnitude of a degree at which a channel of electrons is formed in the channel regions of the select transistors (STD, STS, STSb), whereby the select transistors (STD, STS, STSb) attain an ON state.

In a period from timing t101 to timing t102 of the read operation, a waiting time Ta is provided. The waiting time Ta is a waiting time for charging the selected word line $WL_S$, for example.

At timing t102 of the read operation, the selected word line $WL_S$ is supplied with the read voltage to be used in read (any of the read voltages $V_{CGAR}$-$V_{CGGR}$ described with reference to FIG. 22D). As a result, as shown in FIG. 23, for example, some of the selected memory cells MC attain an ON state, and the rest of the selected memory cells MC attain an OFF state.

At timing t103 of the read operation, for example, the bit lines BL undergo charging, and so on. For example, the latch circuit SDL of FIG. 9 is latched with "H", and states of the signal lines STB, XXL, BLC, BLS, HLL, BLX are set to "L, L, H, H, H, H". As a result, the bit line BL and the sense node SEN are supplied with the voltage $V_{DD}$, and charging of these bit line BL and sense node SEN is started. Moreover, for example, the source line SL (FIG. 3) is supplied with a voltage $V_{SRC}$, whereby charging of this source line SL is started. The voltage $V_{SRC}$ has about the same magnitude as the ground voltage $V_{SS}$, for example. The voltage $V_{SRC}$ may be a voltage which is both slightly larger than the ground voltage $V_{SS}$ and sufficiently smaller than the voltage $V_{DD}$, for example.

In a period from timing t103 to timing t104 of the read operation, a waiting time Tb is provided. The waiting time Tb is a waiting time for converging currents of the bit lines BL, for example.

At timing t104 of the read operation, for example, a voltage of the signal line BLC is reduced. At this time, the voltage of the signal line BLC is adjusted to a voltage of a degree at which the clamp transistor 44 connected to the signal line BLC (FIG. 9) is maintained unchanged in an ON state. As a result, the voltage of the bit line BL decreases.

In a period from timing t104 to timing t105 of the read operation (FIG. 24), a waiting time Tc is provided. The waiting time Tc is a waiting time for stabilizing the currents of the bit lines BL, for example. Hereafter, the waiting time Tc will sometimes be called a "stabilization waiting time".

At timing t105 of the read operation, the sense amplifier module SAM (FIG. 2) is used to detect an ON state/OFF state of the memory cell MC and acquire data indicating the state of this memory cell MC. Hereafter, such an operation will sometimes by called a sense operation. In the sense operation, for example, states of the signal lines STB, XXL, BLC, BLS, HLL, BLX (FIG. 9) are set to "L, H, H, H, L, L". As a result, charge of the sense node SEN connected to a selected memory cell MC in an ON state is discharged via the bit line BL, and voltage of this sense node falls. On the other hand, charge of the sense node SEN connected to a selected memory cell MC in an OFF state is maintained, and voltage of this sense node is maintained.

In a period from timing t105 to timing t106 of the read operation (FIG. 24), a waiting time Td is provided. The waiting time Td is a waiting time for detecting the state of the memory cell MC, for example. Hereafter, the waiting time Td will sometimes be called a "sense time".

At timing t106 of the read operation, the sense operation is ended. For example, states of the signal lines STB, XXL, BLC, BLS, HLL, BLX (FIG. 9) are set to "L, L, L, L, L, L". As a result, the sense node SEN is electrically cut off from the bit line BL. Moreover, supply of current to the bit line BL ends.

Note that at timing t106 or a certain timing after timing t106 of the read operation, the wiring LBUS is charged by the pre-charge transistor 55 (FIG. 9), after which the signal line STB is temporarily set to an "H" state, although illustration of this is omitted. Now, the sense transistor 41 is in an ON state or an OFF state depending on charge of the sense node SEN. Hence, voltage of the wiring LBUS is in an "H" state or an "L" state depending on the charge of the sense node SEN. Subsequently, data of the wiring LBUS is latched by any of the latch circuit SDL or latch circuits DL0-$DLn_L$.

At timing t107 of the read operation, the selected word line $WL_S$, the unselected word lines $WL_U$, and the select gate lines (SGD, SGS, SGSb) are supplied with the ground voltage $V_{SS}$.

Note that FIG. 24 describes an example where, in the read operation, the single read voltage $V_{CGDR}$ alone is supplied to the selected word line $WL_S$, and the sense operation executed a single time in this state. Such an operation is executed when, for example, data is allocated in a form of the kind shown in FIG. 22B, and lower bit data is discriminated.

When, for example, middle bit data is discriminated, the read voltage $V_{CGAR}$ is supplied to the selected word line $WL_S$, and the sense operation executed a single time in this state. Moreover, the read voltage $V_{CGCR}$ is supplied to the selected word line $WL_S$, and the sense operation executed a single time in this state. Moreover, the read voltage $V_{CGFR}$ is supplied to the selected word line $WL_S$, and the sense operation executed a single time in this state.

When, for example, upper bit data is discriminated, the read voltage $V_{CGBR}$ is supplied to the selected word line $WL_S$, and the sense operation executed a single time in this state. Moreover, the read voltage $V_{CGER}$ is supplied to the selected word line $WL_S$, and the sense operation executed a single time in this state. Moreover, the read voltage $V_{CGGR}$ is supplied to the selected word line $WL_S$, and the sense operation executed a single time in this state.

[Variation of Wiring Resistance in Read Operation]

As described with reference to FIGS. 13 and 15, the conductive layer 200 and conductive layer 220 respectively comprise: the two portions 201 and two portions 221 provided in the two memory hole regions $R_{MH}$; and the portion 202 and portion 222 connected to both of these two portions 201 and two portions 221. Moreover, the two portions 201 and two portions 221 are respectively electrically connected to each other via the portion 202 and portion 222.

Moreover, as described with reference to FIGS. 14 and 16, the two conductive layers 210 aligned in the X direction and two conductive layers 230 aligned in the X direction are separated in the X direction, and electrically connected to each other via the contacts CC and the wirings m0*a*, m1*a*.

Now, for convenience of manufacturing steps, the plurality of conductive layers 110 include a highly heat-resistant material such as tungsten (W) or molybdenum (Mo). On the other hand, the wirings m0*a*, m1*a* include a highly conductive material such as copper (Cu). In such a configuration, for example, a wiring resistance between the two portions 201 of the conductive layer 200 and wiring resistance between the two portions 221 of the conductive layer 220 are larger than a wiring resistance between the two conductive layers 210 aligned in the X direction and wiring resistance between the two conductive layers 230 aligned in the X direction.

Now, if, for example, operation parameters of the read operation are set considering the case where the conductive layer 200 or conductive layer 220 is the selected word line $WL_S$, then sometimes, when the conductive layers 210 or the conductive layers 230 becomes the selected word line $WL_S$, a selected memory cell MC that should be determined to be in an OFF state is determined to be in an ON state.

[Adjustment of Operation Parameters]

In the first embodiment, when the conductive layer 200 or the conductive layer 220 is the selected word line $WL_S$, operation parameters A are used in the read operation. Moreover, when the conductive layer 210 or the conductive layer 230 is the selected word line $WL_S$, operation parameters B are used in the read operation. At least some of operation parameters B differ from operation parameters A.

Operation parameters A, B include, for example, the waiting times Ta, Tb, Tc, Td described with reference to FIG. 24, and so on.

The waiting time Ta in operation parameters B may be shorter than the waiting time Ta in operation parameters A. Hence, in the read operation in the case of the conductive layer 210 or conductive layer 230 being the selected word line $WL_S$, excessive charging of the selected word line $WL_S$ can be suppressed. Note that the waiting time Ta in operation parameters B may be the same as the waiting time Ta in operation parameters A.

The waiting time Tb in operation parameters B may be longer than the waiting time Tb in operation parameters A. Hence, in the read operation in the case of the conductive layer 210 or conductive layer 230 being the selected word line $WL_S$, currents of the bit lines BL can be suppressed to a degree that effects of excessive charging of the selected word line $WL_S$ are canceled. Note that the waiting time Tb in operation parameters B may be the same as the waiting time Tb in operation parameters A.

The waiting time Tc in operation parameters B may be longer than the waiting time Tc in operation parameters A. Hence, in the read operation in the case of the conductive layer 210 or conductive layer 230 being the selected word line $WL_S$, cell current can be stabilized to a degree that effects of excessive charging of the selected word line $WL_S$ are canceled. Note that the waiting time Tc in operation parameters B may be the same as the waiting time Tc in operation parameters A.

The waiting time Td (sense time) in operation parameters B may be shorter than the waiting time Td (sense time) in operation parameters A. Hence, in the read operation in the case of the conductive layer 210 or conductive layer 230 being the selected word line $WL_S$, an amount of reduction of charge in the sense node SEN can be suppressed to a degree that effects of excessive charging of the selected word line $WL_S$ are canceled. Note that the waiting time Td in operation parameters B may be the same as the waiting time Td in operation parameters A.

Moreover, operation parameters A, B include, for example, the voltage supplied to the selected word line $WL_S$ in the period from timing t101 to timing t102. For example, when operation parameters A are used, this voltage may be a voltage Va0. Moreover, when operation parameters B are used, this voltage may be a voltage Va1. The voltages Va0, Va1 have a magnitude greater than or equal to that of the read voltage (in the example of FIG. 24, the read voltage $V_{CGDR}$). The voltage Va1 may be smaller than the voltage Va0. Hence, in the read operation in the case of the conductive layer 210 or conductive layer 230 being the selected word line $WL_S$, excessive charging of the selected word line $WL_S$ can be suppressed. Note that the voltage Va1 may be the same as the voltage Va0.

Moreover, operation parameters A, B include, for example, the voltage supplied to the signal line BLC in the period from timing t103 to timing t104. For example, when operation parameters A are used, this voltage may be a voltage Vb0. Moreover, when operation parameters B are used, this voltage may be a voltage Vb1. The voltage Vb1 may be larger than the voltage Vb0. In this case, a voltage $V_{BL1}$ of the bit lines BL at the timing t104 corresponding to operation parameters B may be larger than a voltage $V_{BL0}$ of the bit lines BL at the timing t104 corresponding to operation parameters A. Hence, in the read operation in the case of the conductive layer 210 or conductive layer 230 being the selected word line $WL_S$, currents of the bit lines BL can be suppressed to a degree that effects of excessive charging of the selected word line $WL_S$ are canceled. Note that the voltage Vb1 may be the same as the voltage Vb0.

In the present embodiment, operation parameters B in the read operation in the case of the conductive layer 210 or conductive layer 230 being the selected word line $WL_S$ are adjusted so as to differ from operation parameters A in the read operation in the case of the conductive layer 200 or conductive layer 220 being the selected word line $WL_S$. As a result, the read operation and cell characteristics in these cases are uniformized, and quality of the semiconductor memory device improves.

Note that in the case of operation parameters A, B having the waiting times Ta made different or magnitudes of the voltages Va0, Va1 made different, there is no need for the waiting time Tc in operation parameters B to be made longer than the waiting time Tc in operation parameters A. Hence, time required for the read operation in the case of the conductive layer 210 or conductive layer 230 being the selected word line $WL_S$ can be reduced.

Second Embodiment

Figure 25:
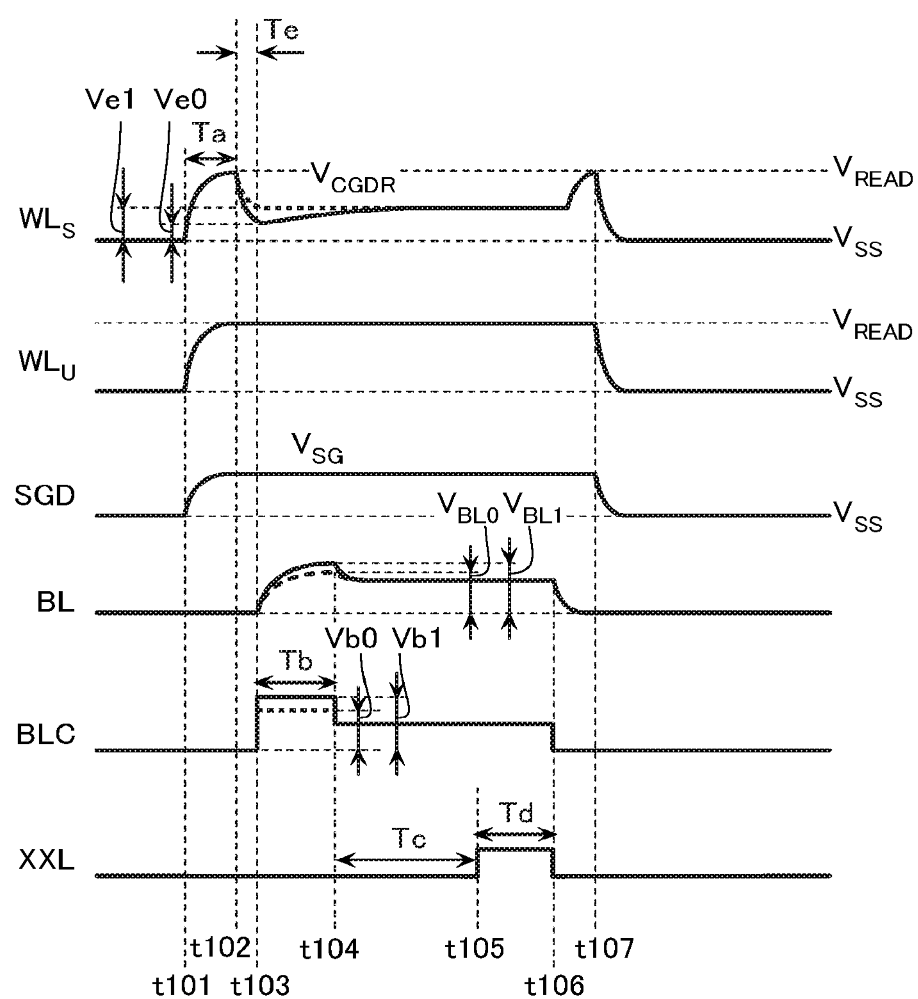
FIG. 25 is a timing chart for explaining a read operation of a semiconductor memory device according to a second embodiment.

Next, a semiconductor memory device according to a second embodiment will be described with reference to FIG. 25. FIG. 25 is a timing chart for explaining a read operation of same semiconductor memory device.

In the first embodiment, a method of executing the read operation is exemplified with reference to FIG. 24. However, such a method is merely an exemplification, and the method of executing the read operation may be appropriately adjusted.

For example, the semiconductor memory device according to the second embodiment is basically configured similarly to the semiconductor memory device according to the first embodiment. Moreover, the read operation according to the second embodiment is basically executed similarly to the read operation according to the first embodiment.

However, in the read operation according to the second embodiment, at timing t101, the selected word line $WL_S$ is supplied with the read pass voltage $V_{READ}$.

Moreover, in the read operation according to the second embodiment, at timing t102, the selected word line $WL_S$ is supplied with the read voltage (in the example of FIG. 25, the read voltage $V_{CGDR}$) or a voltage less than the read voltage.

Moreover, in the read operation according to the second embodiment, in the period from timing t102 to timing t103, a waiting time Te is provided. The waiting time Te is a waiting time for discharging charge of the selected word line $WL_S$, for example.

Moreover, in the read operation according to the second embodiment, at timing t103, the selected word line $WL_S$ is supplied with the read voltage.

Moreover, operation parameters A, B according to the second embodiment include, for example, the waiting time Te.

The waiting time Te in operation parameters B may be shorter than the waiting time Te in operation parameters A. Hence, in the read operation in the case of the conductive layer 210 or conductive layer 230 being the selected word line $WL_S$, excessive discharging of the selected word line $WL_S$ can be suppressed. Note that when a parameter other than the waiting time Te is made different between operation parameters A, B, the waiting time Te in operation parameters B may be the same as the waiting time Te in operation parameters A.

Moreover, operation parameters A, B according to the second embodiment include, for example, the voltage supplied to the selected word line $WL_S$ in the period from timing t102 to timing t103. For example, when operation parameters A are used, this voltage may be a voltage Ve0. Moreover, when operation parameters B are used, this voltage may be a voltage Ve1. The voltages Ve0, Ve1 have a magnitude less than or equal to that of the read voltage (in the example of FIG. 25, the read voltage $V_{CGDR}$). The voltage Ve1 may be larger than the voltage Ve0. Hence, in the read operation in the case of the conductive layer 210 or conductive layer 230 being the selected word line $WL_S$, excessive discharging of the selected word line $WL_S$ can be suppressed. Note that the voltage Ve1 may be the same as the voltage Ve0.

Third Embodiment

Next, a semiconductor memory device according to a third embodiment will be described with reference to FIGS. 26 to 30.

The first embodiment and the second embodiment describe examples where operation parameters used in read operations are adjusted. However, such aspects are merely exemplifications, and the operation to undergo adjustment of operation parameters used therein, is appropriately adjustable.

For example, the semiconductor memory device according to the third embodiment is basically configured similarly to the semiconductor memory device according to the first embodiment or the second embodiment. However, in the semiconductor memory device according to the third embodiment, operation parameters used in a write operation are adjusted. Note that during the read operation of the semiconductor memory device according to the third embodiment, operation parameters may be adjusted in a similar form to in the first embodiment or the second embodiment, but need not be so adjusted.

[Write Operation]

Next, the write operation of the semiconductor memory device according to the present embodiment will be described.

Figure 26:
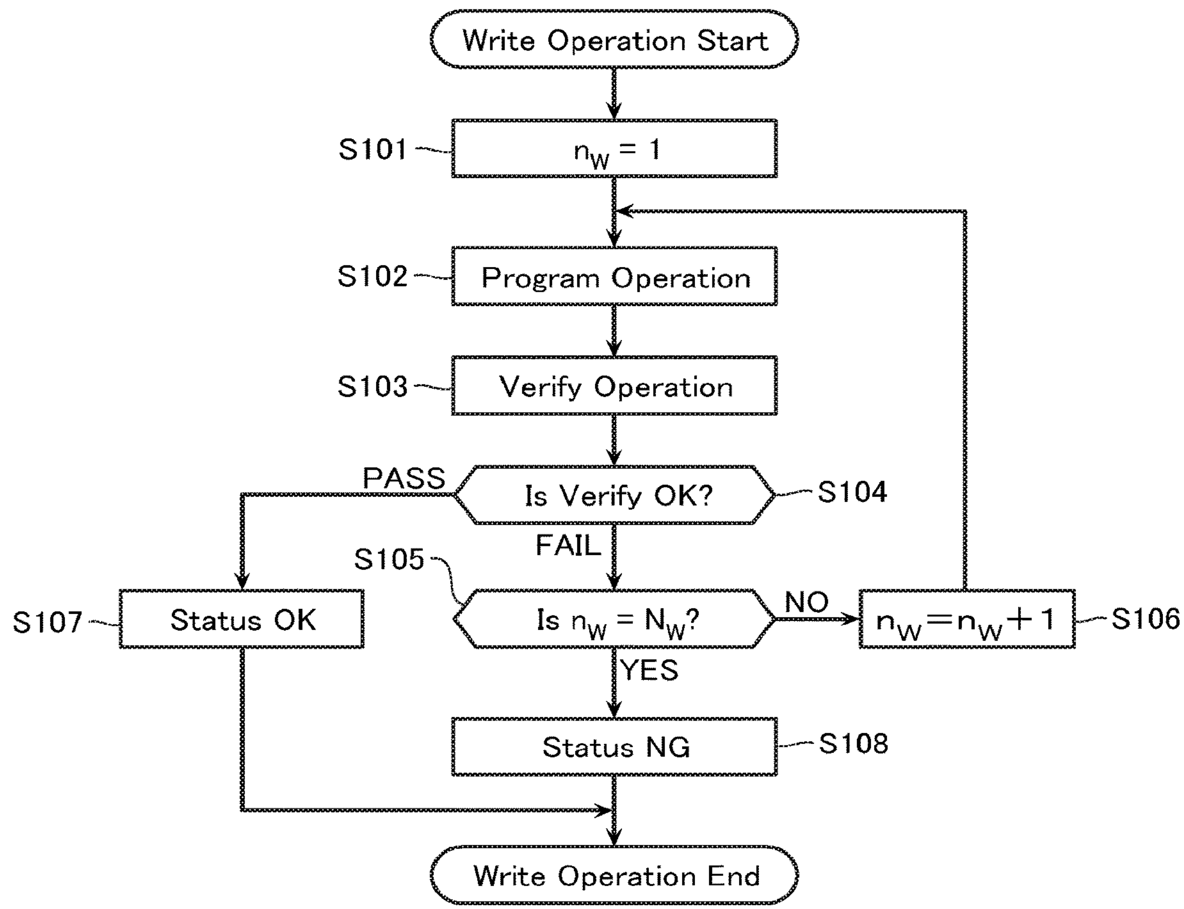
FIG. 26 is a flowchart for explaining a write operation of a semiconductor memory device according to a third embodiment.
Figure 27:
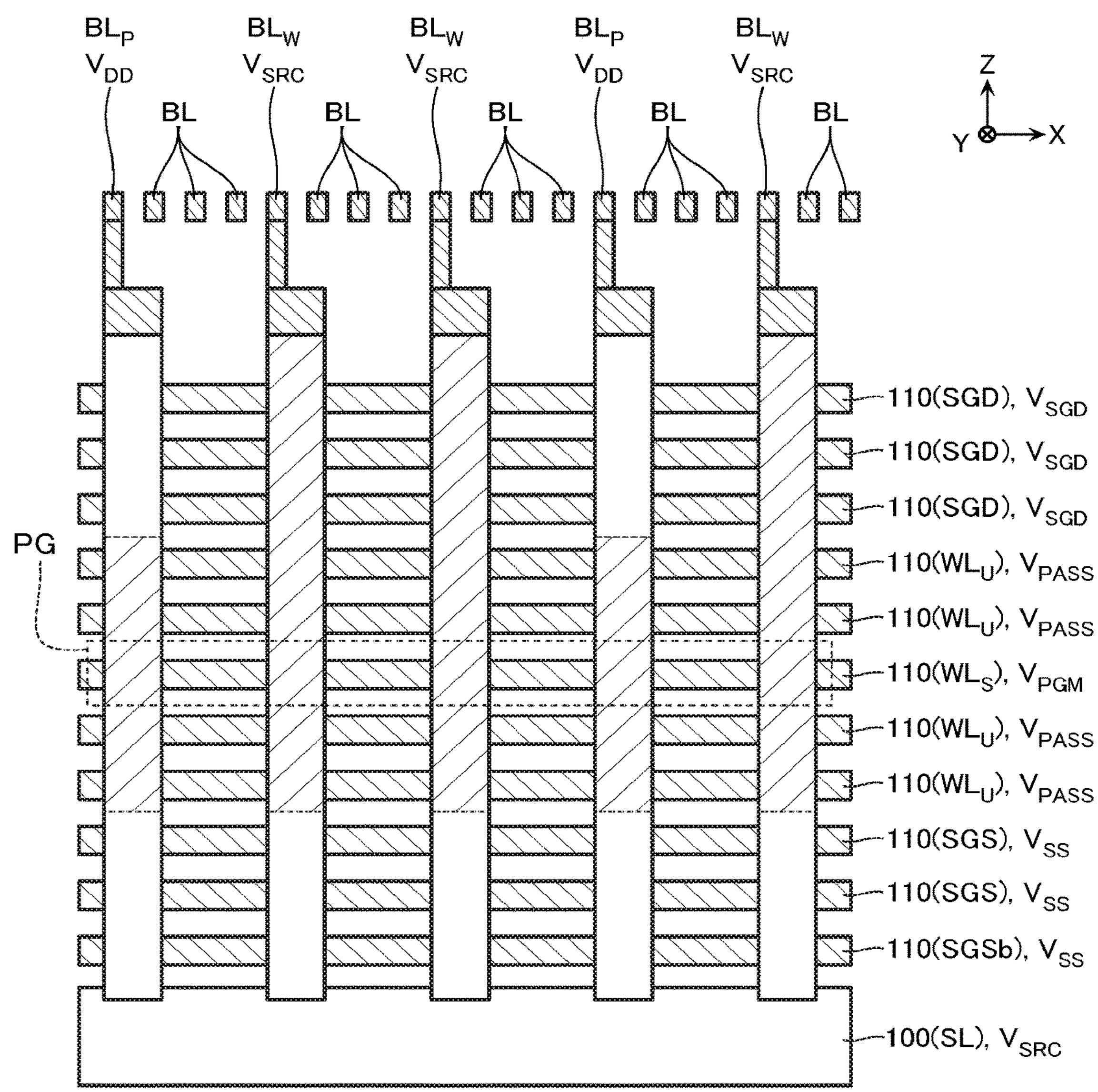
FIG. 27 is a schematic cross-sectional view for explaining a program operation included in the write operation.
Figure 28:
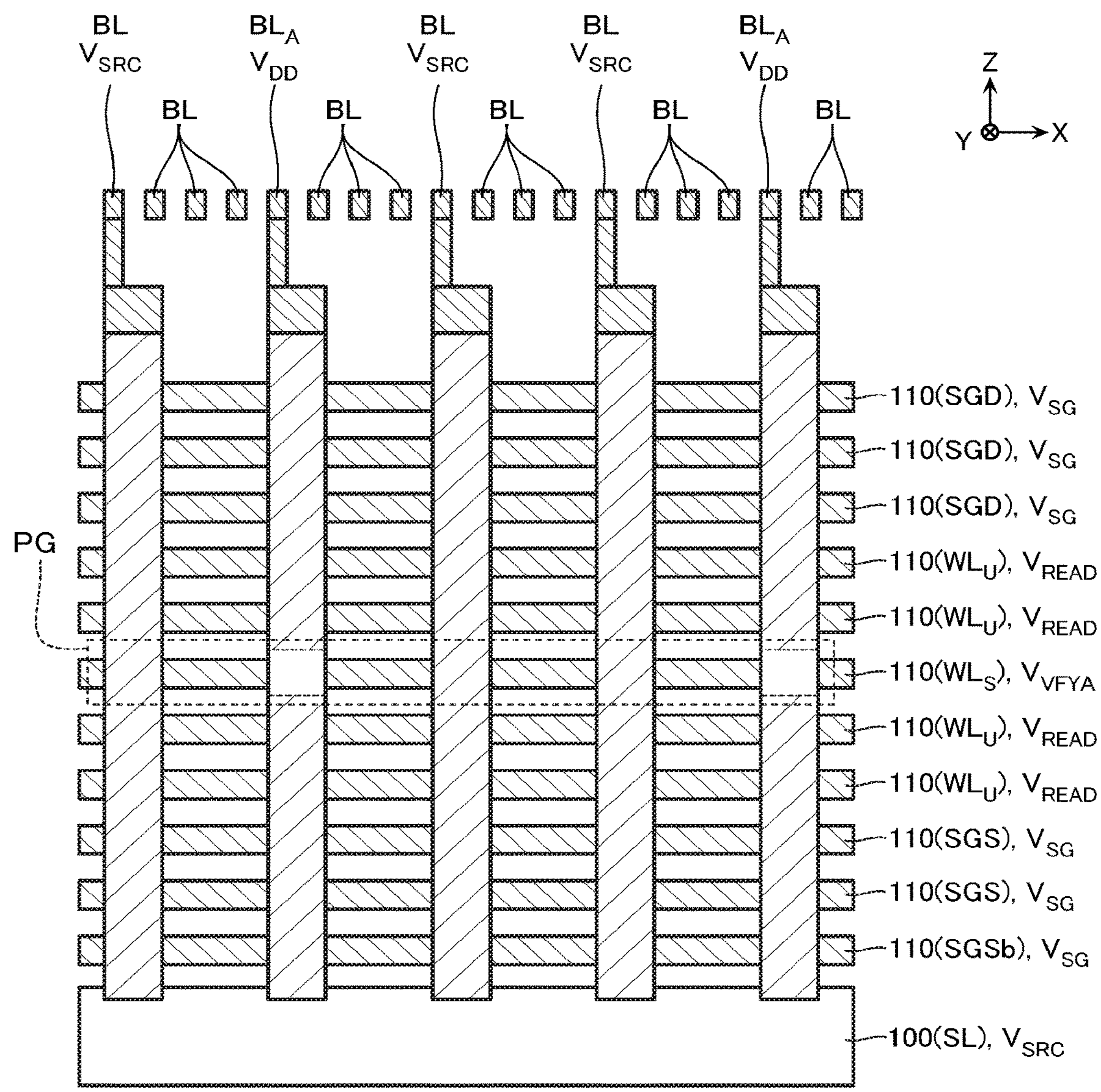
FIG. 28 is a schematic cross-sectional view for explaining a verify operation included in the write operation.
Figure 29:
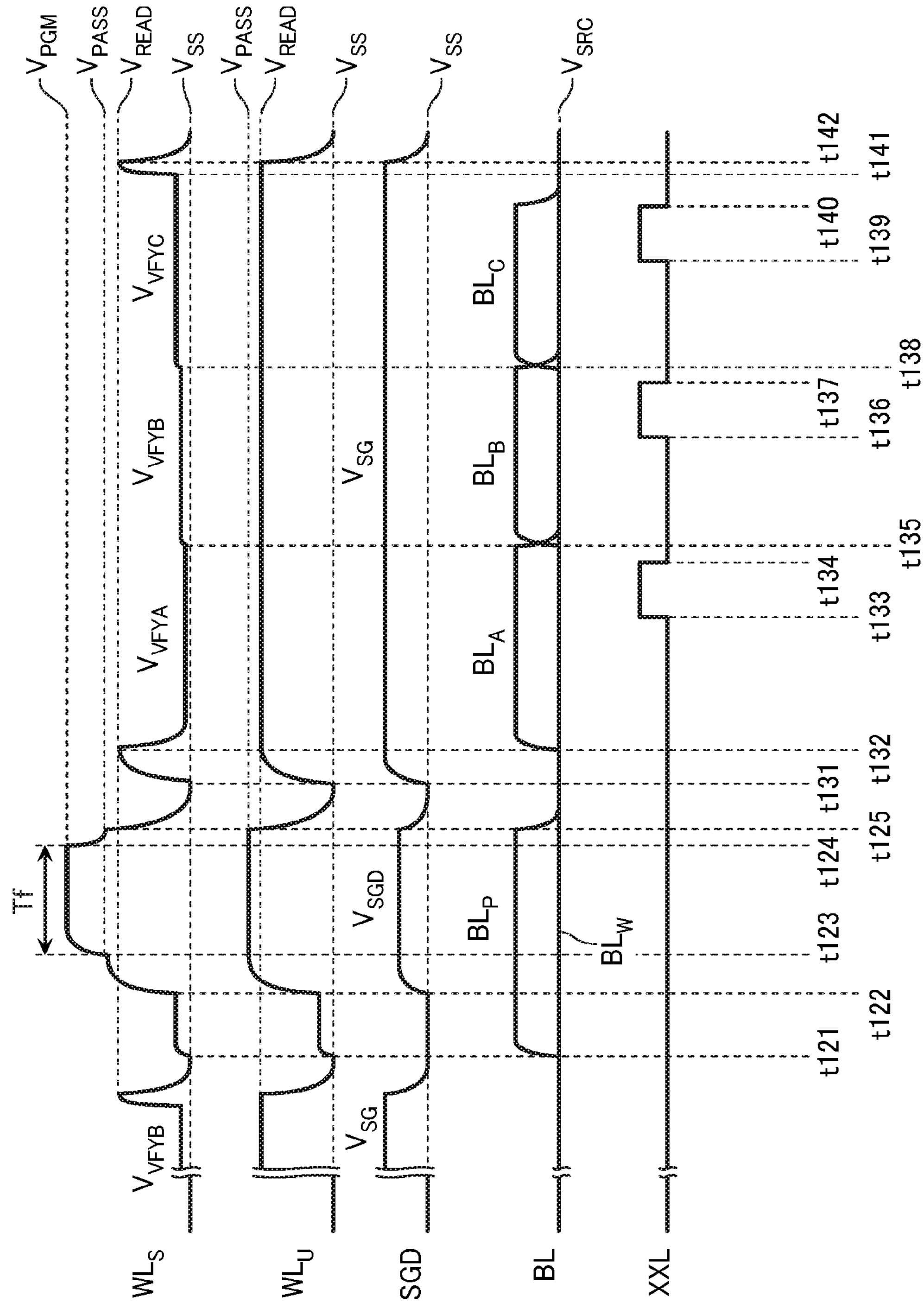
FIG. 29 is a timing chart for explaining the write operation.
Figure 30:
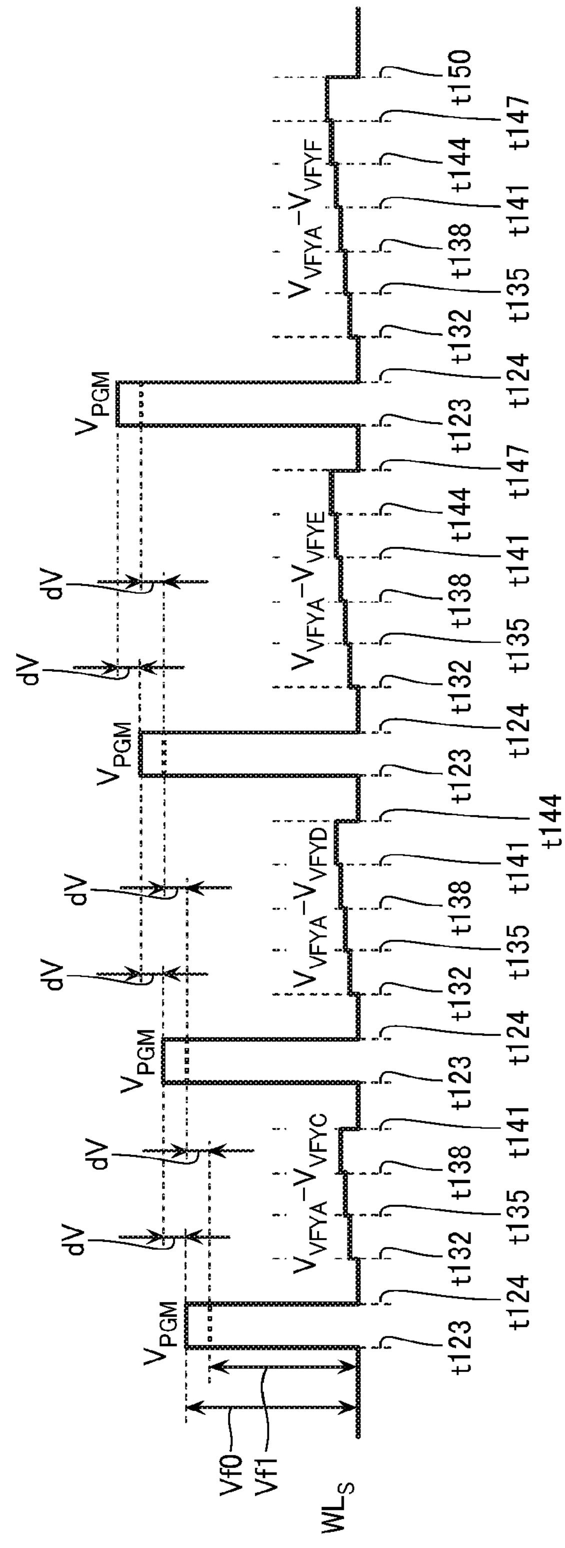
FIG. 30 is a timing chart for explaining the write operation.

FIG. 26 is a flowchart for explaining the write operation. FIG. 27 is a schematic cross-sectional view for explaining a program operation included in the write operation. FIG. 28 is a schematic cross-sectional view for explaining a verify operation included in the write operation. FIGS. 29 and 30 are timing charts for explaining the write operation.

In step S101, as shown in FIG. 26, for example, a loop count $n_W$ is set to 1. The loop count $n_W$ is a variable indicating the number-of-times of a write loop. Moreover, the latch circuits DL0-DL$n_L$, of the sense amplifier unit SAU (FIG. 9) are latched with user data to be written to the memory cells MC, for example.

In step S102, the program operation is executed. The program operation is an operation in which the selected word line $WL_S$ is supplied with a program voltage to increase the threshold voltage of the memory cells MC. This operation is executed from timing t121 to timing t125 of FIG. 29, for example.

At timing t121 of the program operation, for example, bit lines $BL_W$ connected to memory cells MC which are to undergo adjustment of their threshold voltages, of the plurality of selected memory cells MC are supplied with the voltage $V_{SRC}$, and bit lines $BL_P$ connected to memory cells MC which are not to undergo adjustment of their threshold voltages, of the plurality of selected memory cells MC are supplied with the voltage $V_{DD}$. For example, the latch circuit SDL (FIG. 9) corresponding to the bit line $BL_W$ is latched with "L", and the latch circuit SDL (FIG. 9) corresponding to the bit line $BL_P$ is latched with "H". Moreover, states of the signal lines STB, XXL, BLC, BLS, HLL, BLX are set to "L, L, H, H, L, H". Hereafter, a memory cell MC which is to undergo adjustment of its threshold voltage, of the plurality of selected memory cells MC will sometimes be called a "write memory cell MC", and a memory cell MC which is not to undergo adjustment of its threshold voltage, of the plurality of selected memory cells MC will sometimes be called a "prohibit memory cell MC".

At timing t122 of the program operation, the selected word line $WL_S$ and the unselected word lines $WL_U$ are supplied with a write pass voltage $V_{PASS}$. Moreover, the drain side select gate line SGD is supplied with a voltage $V_{SGD}$. The write pass voltage $V_{PASS}$ has a magnitude greater than or equal to that of the read pass voltage $V_{READ}$ described with reference to FIG. 22A, for example. The voltage $V_{SGD}$ has a magnitude which is smaller than that of the voltage $V_{SG}$ described with reference to FIGS. 23 and 24, and of a degree at which the drain side select transistor STD attains an ON state or an OFF state depending on the voltage of the bit line BL.

At timing t123 of the program operation, the selected word line $WL_S$ is supplied with a program voltage $V_{PGM}$. The program voltage $V_{PGM}$ is larger than the write pass voltage $V_{PASS}$.

Now, as shown in FIG. 27, for example, channels of semiconductor layers 120 connected to the bit lines $BL_W$ are supplied with the voltage $V_{SRC}$. Comparatively large electric fields are generated between such semiconductor layers 120 and the selected word line $WL_S$. As a result, electrons in the channel of the semiconductor layer 120 tunnel into the charge accumulating film 132 (FIG. 19) via the tunnel insulating film 131 (FIG. 19). Hence, the threshold voltage of the write memory cell MC increases.

Moreover, channels of semiconductor layers 120 connected to the bit lines $BL_P$ are electrically in a floating state, and potentials of these channels rise to about the write pass voltage $V_{PASS}$, due to capacitive coupling with the unselected word lines $WL_U$. Electric fields smaller than any of the above-described electric fields are generated between such semiconductor layers 120 and the selected word line $WL_S$. As a result, electrons in the semiconductor layer 120 do not tunnel into the charge accumulating film 132 (FIG. 19). Hence, the threshold voltage of the prohibit memory cell MC does not increase.

In a period from timing t123 to timing t124 of the program operation, a waiting time Tf is provided. The waiting time Tf is a waiting time for increasing the threshold voltage of the write memory cell MC, for example.

At timing t124 of the program operation, the selected word line $WL_S$ and the unselected word lines $WL_U$ are supplied with the write pass voltage $V_{PASS}$.

At timing t125 of the program operation, the selected word line $WL_S$, the unselected word lines $WL_U$, and the select gate lines (SGD, SGS, SGSb) are supplied with the ground voltage $V_{SS}$.

In step S103 (FIG. 26), the verify operation is performed.

At timing t131 of the verify operation, as shown in FIG. 29, for example, the selected word line $WL_S$ and the unselected word lines $WL_U$ are supplied with the read pass voltage $V_{READ}$, whereby all of the memory cells MC are set to an ON state. Moreover, the select gate lines (SGD, SGS, SGSb) are supplied with the voltage $V_{SG}$, whereby the select transistors (STD, STS, STSb) are set to an ON state.

At timing t132 of the verify operation, the selected word line $WL_S$ is supplied with a certain verify voltage (any of the verify voltages $V_{VFYA}$-$V_{VFYG}$ described with reference to FIG. 22A). As a result, as shown in FIG. 28, for example, some of the selected memory cells MC attain an ON state, and the rest of the selected memory cells MC attain an OFF state.

Moreover, at timing t132, for example, the bit lines BL undergo charging, and so on. At this time, for example, bit lines BL (in the example of FIG. 29, bit lines $BL_A$) connected to memory cells MC corresponding to a specific state (in the example of FIG. 29, the A state) are supplied with the voltage $V_{DD}$, and the other bit lines BL are supplied with the voltage $V_{SRC}$, based on data in the latch circuits DL0-$DLn_L$.

In a period from timing t133 to timing t134 of the verify operation, as shown in FIG. 29, for example, the sense operation is executed. At this time, the latch circuits DL0-$DLn_L$ may be latched with the likes of data indicating ON state/OFF state of the memory cells MC.

In a period from timing t135 to timing t137 of the verify operation, processing similar to in a period from timing t132 to timing t134 is performed for memory cells MC in another state (in the example of FIG. 29, the B state). Note that in FIG. 29, a bit line BL connected to a memory cell MC corresponding to the B state is written as bit line $BL_B$.

In a period from timing t138 to timing t140 of the verify operation, processing similar to in the period from timing t132 to timing t134 is performed for memory cells MC in another state (in the example of FIG. 29, the C state). Note that in FIG. 29, a bit line BL connected to a memory cell MC corresponding to the C state is written as bit line $BL_C$.

At timing t141, the selected word line $WL_S$ and the unselected word lines $WL_U$ are supplied with the read pass voltage $V_{READ}$, whereby all of the memory cells MC are set to an ON state. Moreover, the select gate lines (SGD, SGS, SGSb) are supplied with the voltage $V_{SG}$, whereby the select transistors (STD, STS, STSb) are set to an ON state.

At timing t142 of the verify operation, the selected word line $WL_S$, the unselected word lines $WL_U$, and the select gate lines (SGD, SGS, SGSb) are supplied with the ground voltage $V_{SS}$.

Subsequently, data latched in the latch circuit SDL is transferred to an unillustrated counter circuit. The counter circuit counts the number of memory cells MC whose threshold voltages have reached their target value, or the number of memory cells MC whose threshold voltages have not reached their target value.

Note that in the example of FIG. 29, there is shown an example where three types of verify voltages, namely, the verify voltages $V_{VFYA}$, $V_{VFYB}$, $V_{VFYC}$ are supplied to the selected word line $WL_S$ in the verify operation. However, the number of verify voltages supplied to the selected word line $WL_S$ in the verify operation may be two types or less, may be four types or more, or, as exemplified in FIG. 30, for example, may be changed according to the loop count $n_W$.

In step S104 (FIG. 26), a result of the verify operation is determined. For example, reference is made to the above-described counter circuit, and in such a case as when the number of memory cells MC whose threshold voltages have not reached their target value is a certain number or more, there is determined to have been a verify FAIL, and operation proceeds to step S105. On the other hand, in such a case as when the number of memory cells MC whose threshold voltages have not reached their target value is less than the certain number, there is determined to have been a verify PASS, and operation proceeds to step S107.

In step S105, it is determined whether the loop count $n_W$ has reached a certain number-of-times $N_W$, or not. If $N_W$ has not been reached, then operation proceeds to step S106. If $N_W$ has been reached, then operation proceeds to step S108.

In step S106, the loop count $n_W$ is increased by 1, whereupon operation proceeds to step S102. Moreover, in step S106, a certain voltage dV is added to the program voltage $V_{PGM}$, for example. Hence, as shown in FIG. 30, for example, the program voltage $V_{PGM}$ increases along with increase in the loop count $n_W$.

In step S107, status data $D_{ST}$ indicating that the write operation ended normally is stored in the status register STR (FIG. 2), and the write operation is ended. Note that the status data $D_{ST}$ is outputted to the controller die CD (FIG. 1) in accordance with a status read operation.

In step S108, status data $D_{ST}$ indicating that the write operation did not end normally is stored in the status register STR (FIG. 2), and the write operation is ended.

[Variation of Wiring Resistance in Write Operation]

As mentioned above, the wiring resistance between the two portions 201 (FIG. 13) of the conductive layer 200 and wiring resistance between the two portions 221 (FIG. 15) of the conductive layer 220 are larger than the wiring resistance between the two conductive layers 210 (FIG. 14) aligned in the X direction and wiring resistance between the two conductive layers 230 (FIG. 16) aligned in the X direction.

Now, if, for example, operation parameters of the write operation are set considering the case where the conductive layer 200 or conductive layer 220 is the selected word line $WL_S$, then sometimes, when the conductive layers 210 or the conductive layers 230 becomes the selected word line $WL_S$, the threshold voltage of the selected memory cell MC is increasing more than necessary.

[Adjustment of Operation Parameters]

In the semiconductor memory device according to the third embodiment, when the conductive layer 200 or the conductive layer 220 is the selected word line $WL_S$, operation parameters C are used in the write operation. Moreover, when the conductive layer 210 or the conductive layer 230 is the selected word line $WL_S$, operation parameters D are used in the write operation. At least some of operation parameters D differ from operation parameters C.

Operation parameters C, D include, for example, the waiting time Tf described with reference to FIG. 29.

The waiting time Tf in operation parameters D may be shorter than the waiting time Tf in operation parameters C. Hence, in the write operation in the case of the conductive layer 210 or conductive layer 230 being the selected word line $WL_S$, an amount of increase in threshold voltage of the selected memory cell MC can be suppressed. Note that the waiting time Tf in operation parameters D may be the same as the waiting time Tf in operation parameters C.

Moreover, operation parameters C, D include, for example, an initial value of the program voltage $V_{PGM}$ (the program voltage $V_{PGM}$ when the loop count $n_W$ is 1). As shown in FIG. 30, for example, when operation parameters C are used, this voltage may be a voltage Vf0. Moreover, when operation parameters D are used, this voltage may be a voltage Vf1. The voltage Vf1 may be smaller than the voltage Vf0. Hence, in the write operation in the case of the conductive layer 210 or conductive layer 230 being the selected word line $WL_S$, an amount of increase in threshold voltage of the selected memory cell MC can be suppressed. Note that the voltage Vf1 may be the same as the voltage Vf0.

Fourth Embodiment

Figure 31:
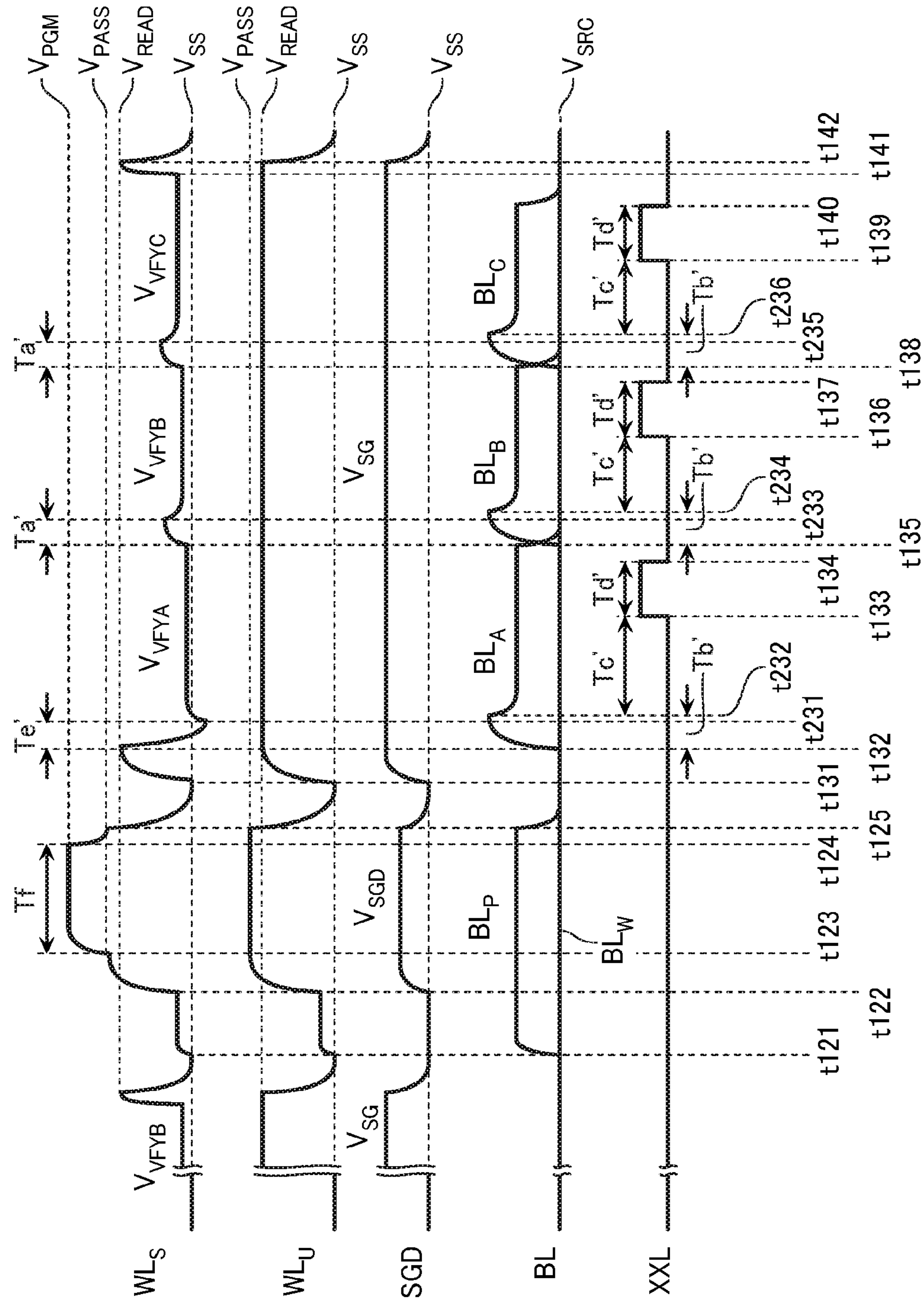
FIG. 31 is a timing chart for explaining a write operation of a semiconductor memory device according to a fourth embodiment.

Next, a semiconductor memory device according to a fourth embodiment will be described with reference to FIG. 31. FIG. 31 is a timing chart for explaining a write operation of same semiconductor memory device.

In the third embodiment, a method of executing the write operation is exemplified with reference to FIGS. 26 to 30. However, such a method is merely an exemplification, and the method of executing the write operation may be appropriately adjusted.

For example, the semiconductor memory device according to the fourth embodiment is basically configured similarly to the semiconductor memory device according to the third embodiment. However, the write operation according to the fourth embodiment differs from the write operation according to the third embodiment. The write operation according to the fourth embodiment is basically executed similarly to the write operation according to the third embodiment.

However, in the write operation according to the fourth embodiment, at timing t132, the selected word line $WL_S$ is supplied with the verify voltage to be used first in the verify operation (in the example of FIG. 31, the verify voltage $V_{VFYA}$) or a voltage smaller than this first-to-be-used verify voltage.

Moreover, in the write operation according to the fourth embodiment, in a period from timing t132 to timing t231, a waiting time Te' is provided. The waiting time Te' is a waiting time for discharging charge of the selected word line $WL_S$, for example.

Moreover, in the write operation according to the fourth embodiment, at timings t231, t233, t235, the selected word line $WL_S$ is supplied with the verify voltages (in the example of FIG. 31, the verify voltages $V_{VFYA}$, $V_{VFYB}$, $V_{VFYC}$).

Moreover, in the write operation according to the fourth embodiment, in a period from timing t132 to timing t232, a period from timing t135 to timing t234, and a period from timing t138 to timing t236, a waiting time Tb' is provided. The waiting time Tb' is a waiting time for converging currents of the bit lines BL, for example.

Moreover, in the write operation according to the fourth embodiment, at timings t232, t234, t236, a voltage of the signal line BLC is reduced. At these times, the voltage of the signal line BLC is adjusted to a voltage of a degree at which the clamp transistor 44 connected to the signal line BLC (FIG. 9) is maintained unchanged in an ON state.

Moreover, in the write operation according to the fourth embodiment, in a period from timing t232 to timing t133, a period from timing t234 to timing t136, and a period from timing t236 to timing t139, a waiting time Tc' is provided. The waiting time Tc' is a waiting time for stabilizing the currents of the bit lines BL, for example. Hereafter, the waiting time Tc' will sometimes be called a “stabilization waiting time”.

Moreover, in the write operation according to the fourth embodiment, in a period from timing t133 to timing t134, a period from timing t136 to timing t137, and a period from timing t139 to timing t140, a waiting time Td' is provided. The waiting time Td' is a waiting time for detecting a state of the memory cell MC, for example. Hereafter, the waiting time Td' will sometimes be called a “sense time”.

Moreover, in the write operation according to the fourth embodiment, at timings t135, t138, the selected word line $WL_S$ is supplied with the verify voltages to be used next in the verify operation (in the example of FIG. 31, the verify voltages $V_{VFYB}$, $V_{VFYC}$) or voltages larger than these next-to-be-used verify voltages.

Moreover, in the write operation according to the fourth embodiment, in a period from timing t135 to timing t233 and a period from timing t138 to timing t235, a waiting time Ta' is provided. The waiting time Ta' is a waiting time for charging the selected word line $WL_S$, for example.

Operation parameters C, D according to the fourth embodiment include, for example, the waiting times Ta', Tb', Tc', Td', Te'.

The waiting time Ta' in operation parameters D may be shorter than the waiting time Ta' in operation parameters C. Hence, in the write operation in the case of the conductive layer 210 or conductive layer 230 being the selected word line $WL_S$, excessive charging of the selected word line $WL_S$ can be suppressed. Note that the waiting time Ta' in operation parameters D may be the same as the waiting time Ta' in operation parameters C.

The waiting time Tb' in operation parameters D may be longer than the waiting time Tb' in operation parameters C. Hence, in the write operation in the case of the conductive layer 210 or conductive layer 230 being the selected word line $WL_S$, currents of the bit lines BL can be suppressed to a degree that effects of excessive charging of the selected word line $WL_S$ are canceled. Note that the waiting time Tb' in operation parameters D may be the same as the waiting time Tb' in operation parameters C.

The waiting time Tc' in operation parameters D may be longer than the waiting time Tc' in operation parameters C. Hence, in the write operation in the case of the conductive layer 210 or conductive layer 230 being the selected word line $WL_S$, cell current can be stabilized to a degree that effects of excessive charging of the selected word line $WL_S$ are canceled. Note that the waiting time Tc' in operation parameters D may be the same as the waiting time Tc' in operation parameters C.

The waiting time Td' (sense time) in operation parameters D may be shorter than the waiting time Td' (sense time) in operation parameters C. Hence, in the write operation in the case of the conductive layer 210 or conductive layer 230 being the selected word line $WL_S$, an amount of reduction of charge in the sense node SEN can be suppressed to a degree that effects of excessive charging of the selected word line $WL_S$ are canceled. Note that the waiting time Td' in operation parameters D may be the same as the waiting time Td' in operation parameters C.

The waiting time Te' in operation parameters D may be shorter than the waiting time Te' in operation parameters C. Hence, in the write operation in the case of the conductive layer 210 or conductive layer 230 being the selected word line $WL_S$, excessive discharging of the selected word line $WL_S$ can be suppressed. Note that the waiting time Te' in operation parameters D may be the same as the waiting time Te' in operation parameters C.

Moreover, operation parameters C, D include, for example, the voltage supplied to the selected word line $WL_S$ in the period from timing t132 to timing t231. For example, the voltage when operation parameters D are used may be larger than the voltage when operation parameters C are used. Hence, in the write operation in the case of the conductive layer 210 or conductive layer 230 being the selected word line $WL_S$, excessive discharging of the selected word line $WL_S$ can be suppressed. Note that these voltages may be the same.

Moreover, operation parameters C, D include, for example, the voltage supplied to the signal line BLC in the period from timing t132 to timing t232. For example, the voltage when operation parameters D are used may be smaller than the voltage when operation parameters C are used. Hence, in the write operation in the case of the conductive layer 210 or conductive layer 230 being the selected word line $WL_S$, currents of the bit lines BL can be increased to a degree that effects of excessive discharging of the selected word line $WL_S$ are canceled. Note that these voltages may be the same.

Moreover, operation parameters C, D include, for example, the voltage supplied to the signal line BLC in the period from timing t135 to timing t234 and the period from timing t138 to timing t236. For example, the voltage when operation parameters D are used may be larger than the voltage when operation parameters C are used. Hence, in the write operation in the case of the conductive layer 210 or conductive layer 230 being the selected word line $WL_S$, currents of the bit lines BL can be suppressed to a degree that effects of excessive charging of the selected word line $WL_S$ are canceled. Note that these voltages may be the same.

Moreover, operation parameters C, D include, for example, the voltage supplied to the selected word line $WL_S$ in the period from timing t135 to timing t233 and the period from timing t138 to timing t235. For example, the voltage when operation parameters D are used may be smaller than the voltage when operation parameters C are used. Hence, in the write operation in the case of the conductive layer 210 or conductive layer 230 being the selected word line $WL_S$, excessive charging of the selected word line $WL_S$ can be suppressed. Note that these voltages may be the same.

Fifth Embodiment

Figure 32:
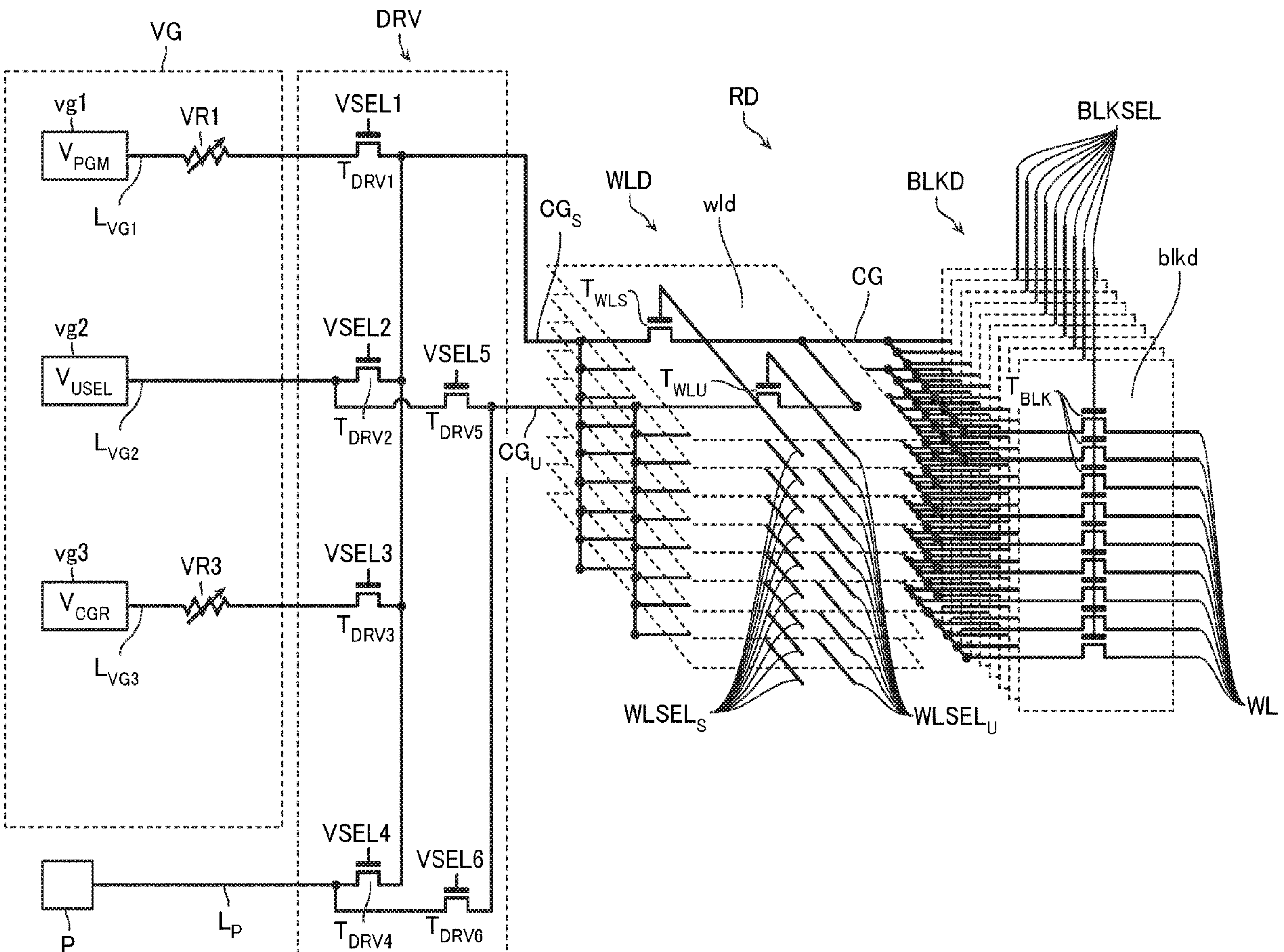
FIG. 32 is a schematic circuit diagram showing a configuration of part of a semiconductor memory device according to a fifth embodiment.

Next, a semiconductor memory device according to a fifth embodiment will be described with reference to FIG. 32. FIG. 32 is a schematic circuit diagram showing a configuration of part of same semiconductor memory device.

The semiconductor memory device according to the fifth embodiment is basically configured similarly to the semiconductor memory device according to any of the first through fourth embodiments. However, in the semiconductor memory device according to the fifth embodiment, as exemplified in FIG. 32, for example, a variable resistance circuit VR1 is provided in a current path between the voltage generating unit vg1 and the transistor $T_{DRV1}$. Moreover, a variable resistance circuit VR3 is provided in a current path between the voltage generating unit vg3 and the transistor $T_{DRV3}$.

Figure 33:
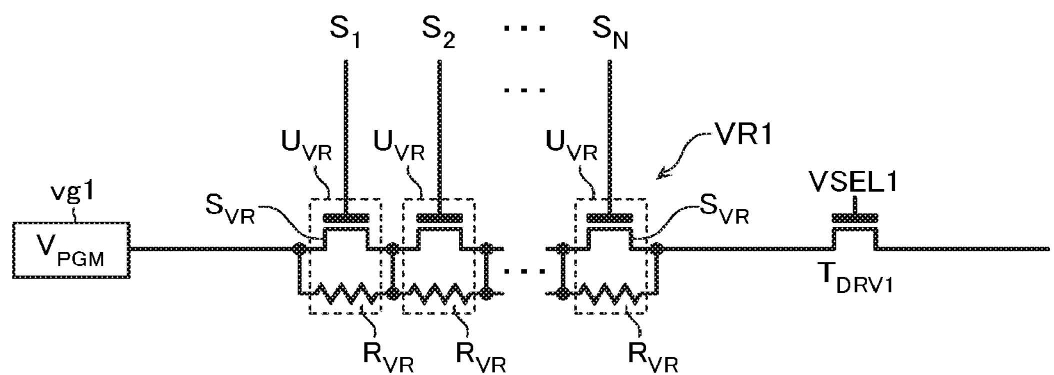
FIG. 33 is a schematic circuit diagram showing a configuration of a variable resistance circuit VR1.

FIG. 33 is a schematic circuit diagram showing a configuration of the variable resistance circuit VR1. The variable resistance circuit VR1 comprises N resistance units $U_{VR}$ connected in series between the voltage generating unit vg1 and the transistor $T_{DRV1}$. These plurality of resistance units $U_{VR}$ each comprise a transistor $S_{VR}$ and a resistance element $R_{VR}$ connected in parallel between an input terminal and an output terminal of the resistance unit $U_{VR}$. Gate electrodes of the N transistors $S_{VR}$ are respectively connected to signal lines $S_1$-$S_N$. The N resistance elements $R_{VR}$ may all comprise different resistance values. A resistance value of the variable resistance circuit VR1 is controllable to $2^N$ types, according to N-bit data inputted to the signal lines $S_1$-$S_N$, for example. The variable resistance circuit VR3 comprises a similar configuration to the variable resistance circuit VR1, although illustration of this is omitted.

Operation parameters A, B according to the fifth embodiment include, for example, N-bit data inputted to the variable resistance circuit VR3 in a period from timing t101 to timing t102 (FIG. 24), a period from timing t102 to timing t103, and a period from timing t103 to timing t106 of the read operation. For example, the resistance value of the variable resistance circuit VR3 when operation parameters B are used may be larger than the resistance value of the variable resistance circuit VR3 when operation parameters A are used. Note that the resistance value of the variable resistance circuit VR3 when operation parameters B are used may be the same as the resistance value of the variable resistance circuit VR3 when operation parameters A are used.

Moreover, operation parameters C, D according to the fifth embodiment include, for example, N-bit data inputted to the variable resistance circuit VR1 in a period from timing t123 to timing t124 (FIG. 29) of the write operation. For example, the resistance value of the variable resistance circuit VR1 when operation parameters D are used may be larger than the resistance value of the variable resistance circuit VR1 when operation parameters C are used. Note that the resistance value of the variable resistance circuit VR1 when operation parameters D are used may be the same as the resistance value of the variable resistance circuit VR1 when operation parameters C are used.

Moreover, operation parameters C, D according to the fifth embodiment include, for example, N-bit data inputted to the variable resistance circuit VR3 in a period from timing t131 to timing t132 (FIG. 29), a period from timing t132 to timing t231 (FIG. 31), a period from timing t132 to timing t134 (FIG. 31), a period from timing t135 to timing t233 (FIG. 31), a period from timing t234 to timing t137 (FIG. 31), a period from timing t138 to timing t235 (FIG. 31), and a period from timing t236 to timing t140 (FIG. 31) of the write operation. For example, the resistance value of the variable resistance circuit VR3 when operation parameters D are used may be larger than the resistance value of the variable resistance circuit VR3 when operation parameters C are used. Note that the resistance value of the variable resistance circuit VR3 when operation parameters D are used may be the same as the resistance value of the variable resistance circuit VR3 when operation parameters C are used.

Note that in the fifth embodiment, any of the operation parameters exemplified in the first through fourth embodiments may be adjusted, but need not be adjusted.

Moreover, the circuit configurations of the kinds shown in FIGS. 32 and 33 are merely exemplifications, and specific configurations are appropriately adjustable. For example, in the example of FIG. 32, either of the variable resistance circuits VR1, VR3 may be omitted. Moreover, in the example of FIG. 32, for example, the variable resistance circuits VR1, VR3 are provided in current paths between the transistors $T_{DRV1}$, $T_{DRV3}$ in the driver circuit DRV and the voltage generating units vg1, vg3. However, it is only required that the variable resistance circuits be provided in current paths between the voltage generating units vg1, vg3 and the conductive layers 110. For example, the variable resistance circuits may be provided in current paths between the transistors $T_{DRV1}$, $T_{DRV3}$ in the driver circuit DRV and the wiring $CG_S$.

Sixth Embodiment

Figure 34:
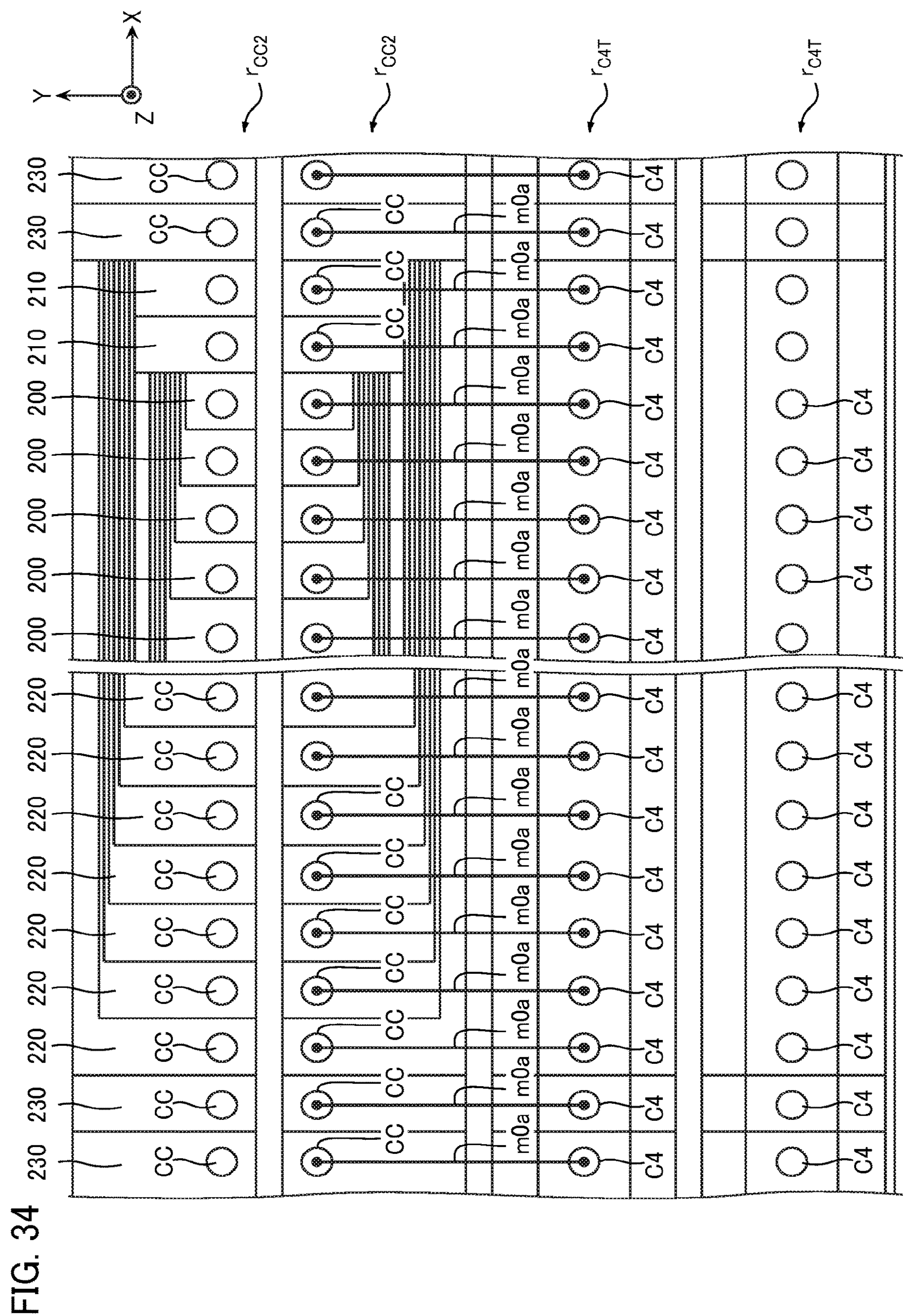
FIG. 34 is a schematic plan view showing a configuration of part of a semiconductor memory device according to a sixth embodiment.
Figure 35:
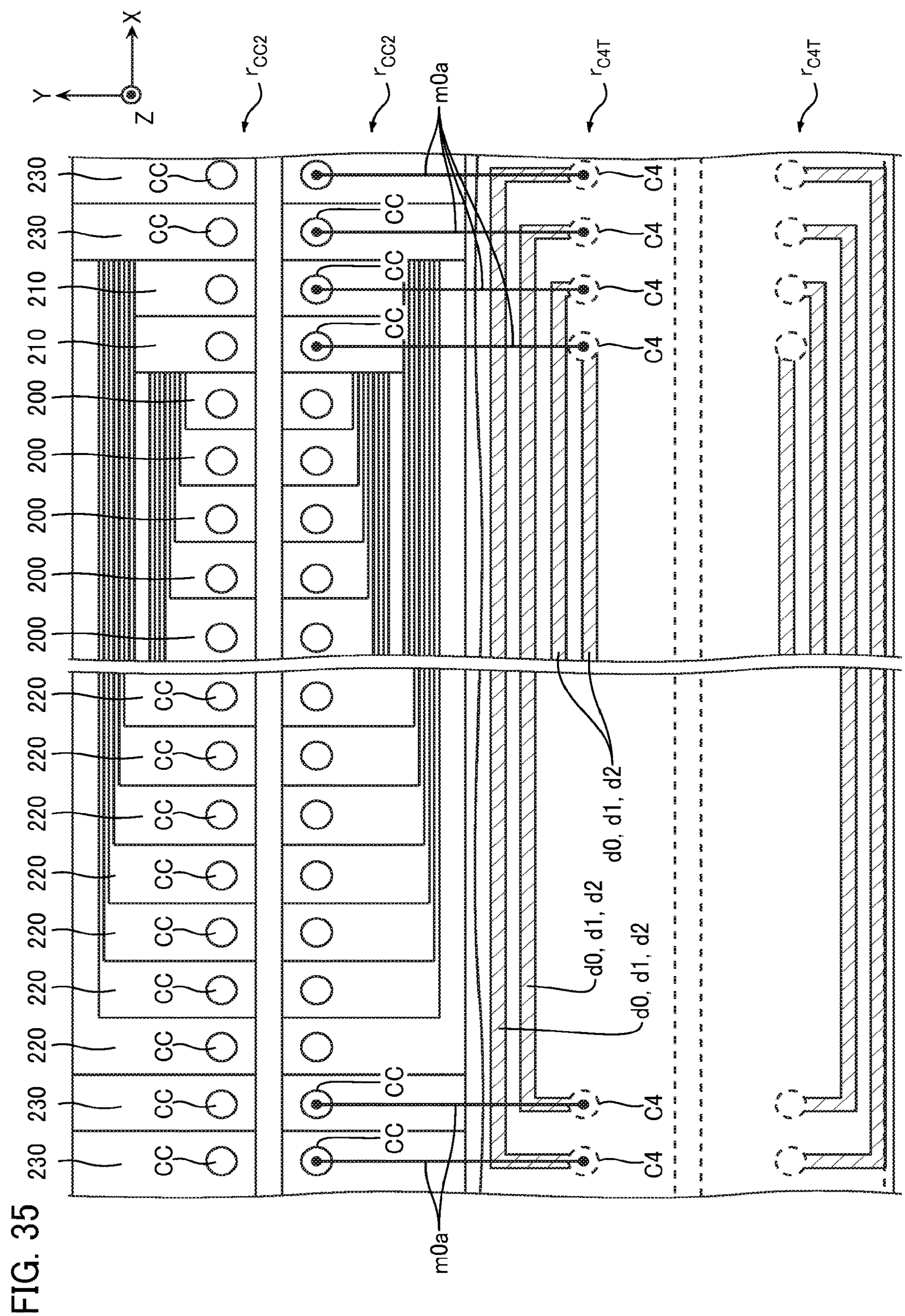

Next, a semiconductor memory device according to a sixth embodiment will be described with reference to FIGS. 34 and 35. FIG. 34 is a schematic plan view showing a configuration of part of same semiconductor memory device. FIG. 35 is a schematic plan view in which FIG. 34 is shown with some configurations thereof omitted.

In the first through fifth embodiments, effects of variation in wiring resistances are suppressed by adjusting operation parameters in at least one of the read operation and the write operation. However, such a method is merely an exemplification, and the method of suppressing variation in wiring resistance is appropriately adjustable.

For example, the semiconductor memory device according to the sixth embodiment is basically configured similarly to the semiconductor memory device according to any of the first through fifth embodiments.

However, as described with reference to FIG. 20, for example, in the semiconductor memory devices according to the first through fifth embodiments, two conductive layers 210 aligned in the X direction are connected to one contact C4 via low-resistance wirings m1*a* extending in the X direction, and are connected to the transistor Tr via this one contact C4. Similarly, two conductive layers 230 aligned in the X direction are connected to one contact C4 via low-resistance wirings m1*a* extending in the X direction, and are connected to the transistor Tr via this one contact C4.

On the other hand, as shown in FIG. 34, for example, in the semiconductor memory device according to the sixth embodiment, two conductive layers 230 aligned in the X direction are respectively connected to wirings m0*a* extending in the Y direction via contacts CC, and are respectively connected to different contacts C4 via these wirings m0*a*. Moreover, two conductive layers 210 aligned in the X direction are respectively connected to wirings m0*a* extending in the Y direction via contacts CC, and are respectively connected to different contacts C4 via these wirings m0*a*. In addition, as shown in FIG. 35, for example, in the semiconductor memory device according to the sixth embodiment, two conductive layers 230 aligned in the X direction are each connected to at least any one of wirings d0, d1, d2 extending in the X direction, via two contacts C4. Moreover, two conductive layers 210 aligned in the X direction are each connected to at least any one of wirings d0, d1, d2 extending in the X direction, via two contacts C4.

Now, as described with reference to FIG. 11, and so on, the wirings d0, d1, d2 include a highly heat-resistant material such as tungsten (W), similarly to the conductive layers 110. Hence, such a configuration enables suppression of a difference between, on the one hand, wiring resistance between the two portions 201 of the conductive layer 200 and wiring resistance between the two portions 221 of the conductive layer 220, and on the other hand, wiring resistance between the two conductive layers 210 aligned in the X direction and wiring resistance between the two conductive layers 230 aligned in the X direction.

Note that in the sixth embodiment, any of the operation parameters exemplified in the first through fifth embodiments may be adjusted, but need not be adjusted.

Figure 36:
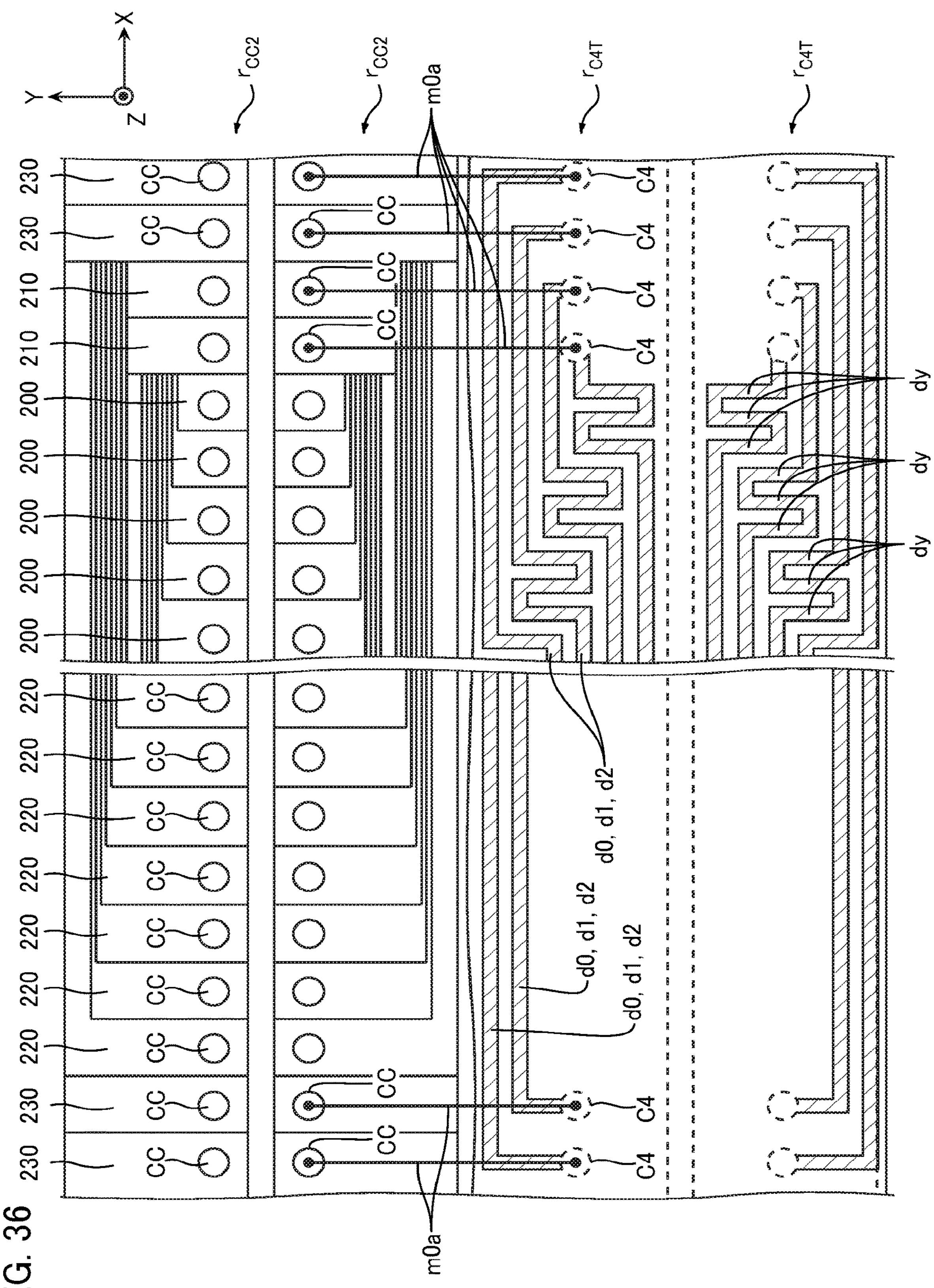
FIG. 36 is a schematic plan view for explaining a modified example of the semiconductor memory device according to the sixth embodiment.
Figure 37:
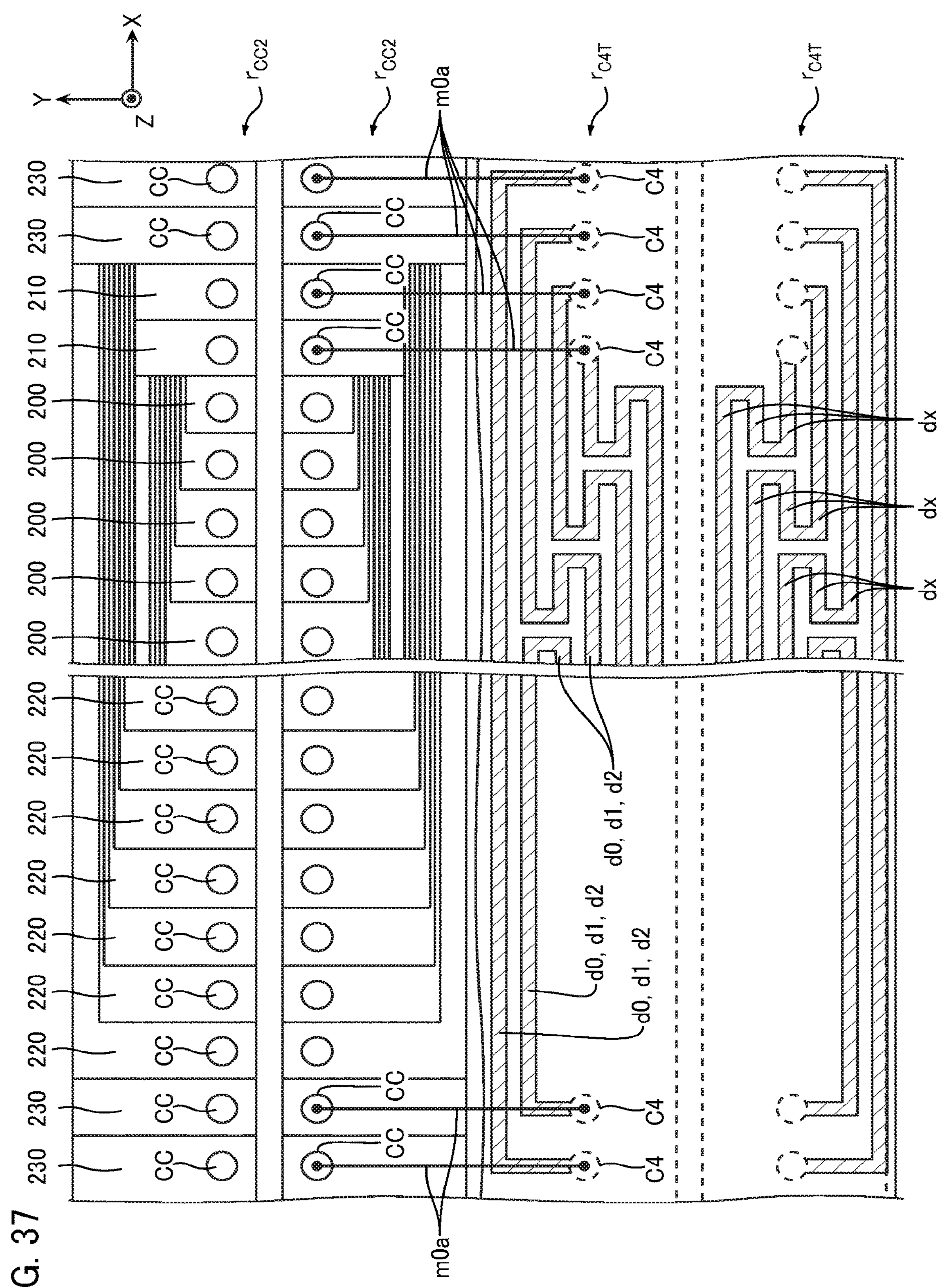
FIG. 37 is a schematic plan view for explaining a modified example of the semiconductor memory device according to the sixth embodiment.

Moreover, the configurations of the kinds shown in FIGS. 34 and 35 are merely exemplifications, and specific configurations may be appropriately adjusted. For example, in the example of FIG. 35, the wirings d0, d1, d2 for electrically connecting two conductive layers 210 aligned in the X direction comprised a substantially linear shape extending in the X direction. Similarly, the wirings d0, d1, d2 for electrically connecting two conductive layers 230 aligned in the X direction comprised a substantially linear shape extending in the X direction. However, as shown in FIG. 36, for example, such wirings d0, d1, d2 may comprise a plurality of substantially linear portions dy extending in the Y direction and aligned in the X direction. Moreover, as shown in FIG. 37, for example, such wirings d0, d1, d2 may comprise a plurality of substantially linear portions dx extending in the X direction and aligned in the Y direction. Such configurations enable wiring resistance between two conductive layers 210 aligned in the X direction and wiring resistance between two conductive layers 230 aligned in the X direction to be further increased.

Other Embodiments

That concludes description of the semiconductor memory devices according to the first through sixth embodiments. However, the configurations and operations of the kinds described above are merely exemplifications, and specific configurations and operations may be appropriately adjusted.

For example, the memory cell arrays MCA according to the first through sixth embodiments each comprise the two memory cell arrays layers $L_{MCA1}$/$L_{MCA2}$ aligned in the Z direction, as described with reference to FIG. 11. Moreover, some of the plurality of conductive layers 110 included in the memory cell array layer $L_{MCA1}$, namely, the conductive layers 200 (FIG. 13) comprise the two portions 201 aligned in the X direction and the portion 202 connected to these two portions 201, and, above these conductive layers 200, there is provided a group of pairs of conductive layers 210 (FIG. 14) aligned in the X direction. Moreover, some of the plurality of conductive layers 110 included in the memory cell array layer $L_{MCA2}$, namely, the conductive layers 220 (FIG. 15) comprise the two portions 221 aligned in the X direction and the portion 222 connected to these two portions 221, and, above these conductive layers 220, there is provided a group of pairs of conductive layers 230 (FIG. 16) aligned in the X direction.

However, such a configuration is merely an exemplification, and a specific configuration may be appropriately adjusted.

For example, in the memory cell array MCA according to the first through sixth embodiments, the memory cell array layer $L_{MCA2}$ may be omitted. In such a case, the memory cell array layer $L_{MCA1}$ may comprise the plurality of conductive layers 110 functioning as the drain side select gate line SGD, and so on (FIG. 17).

Moreover, for example, in the memory cell array MCA according to the first through sixth embodiments, one or more memory cell array layers may be provided between the memory cell array layer $L_{MCA1}$ and the memory cell array layer $L_{MCA2}$. Such memory cell array layers may each include a plurality of the conductive layers 110. Moreover, some of these plurality of conductive layers 110 may comprise two portions aligned in the X direction and a portion connected to these two portions. Moreover, above these some of the conductive layers 110, there may be provided pairs of the conductive layers 110 aligned in the X direction.

Moreover, for example, in the description of the semiconductor memory devices according to the first through sixth embodiments, a configuration having a plurality of NAND-connected memory transistors is exemplified as the configuration of the memory cell array MCA. However, such a configuration is merely an exemplification, and a method of connecting the memory transistors may be appropriately adjusted. For example, a configuration having a plurality of NOR-connected memory transistors may be adopted as the configuration of the memory cell array MCA.

Moreover, for example, in the above examples, a configuration in which an insulative or conductive charge accumulating portion is included in the gate insulating film is exemplified as the memory transistor. However, such a configuration is merely an exemplification, and the configuration included in the gate insulating film of the memory transistor may be appropriately adjusted. For example, a configuration including a ferroelectric substance in the gate insulating film may be adopted as the memory transistor.

Moreover, for example, in the above examples, a configuration having a plurality of memory transistors is exemplified as the configuration of the memory cell array MCA. However, such a configuration is merely an exemplification, and a specific configuration is appropriately adjustable. For example, a configuration having other than memory transistors may be adopted as the configuration of the memory cell array MCA.

For example, the memory cell array MCA may be a DRAM (Dynamic Random Access Memory). The DRAM comprises one or a plurality of capacitors and one or a plurality of transistors. The DRAM undergoes charging/discharging of its capacitor during a write operation and a read operation. A word line is connected to a gate electrode of the transistor, and a bit line is connected to a source or drain of the transistor. The configuration of the memory cell array MCA has a plurality of word lines aligned in the Z direction or a plurality of bit lines aligned in the Z direction, for example.

Moreover, for example, the memory cell array MCA may be an SRAM (Static Random Access Memory). The SRAM comprises two CMOS inverters. An input terminal of one is connected to an output terminal of the other, and an output terminal of said one is connected to an input terminal of said other.

Moreover, the memory cell array MCA may be a magnetoresistive memory such as an MRAM (Magnetoresistive Random Access Memory) or an STT-MRAM (Spin Transfer Torque MRAM). The MRAM and STT-MRAM include a pair of ferromagnetic films and a tunnel insulating film. The pair of ferromagnetic films are opposingly disposed. The tunnel insulating film is provided between the pair of ferromagnetic films. Magnetization directions of the ferromagnetic films change in response to the write operation.

Moreover, the memory cell array MCA may be a resistance change memory such as a ReRAM (Resistive Random Access Memory). The ReRAM includes a pair of electrodes and a metal oxide or the like. The metal oxide or the like is provided between the pair of electrodes. A filament of oxygen vacancies or the like, is formed in the metal oxide or the like, in response to a write operation. The pair of electrodes are electrically conducted with each other or cut off from each other via this filament of oxygen vacancies or the like.

Moreover, the memory cell array MCA may be a phase change memory such as a PCRAM (Phase Change Random Access Memory) or a PCM (Phase Change Memory). The phase change memory may include a chalcogenide film of the likes of GeSbTe. A crystalline state of the chalcogenide film may change in response to the write operation.

Moreover, in the example of FIG. 36, the wirings d0, d1, d2 for electrically connecting two conductive layers 210 aligned in the X direction and two conductive layers 230 aligned in the X direction comprise a plurality of substantially linear portions dy extending in the Y direction and aligned in the X direction. Moreover, in the example of FIG. 37, the wirings d0, d1, d2 for electrically connecting two conductive layers 210 aligned in the X direction and two conductive layers 230 aligned in the X direction comprise a plurality of substantially linear portions dx extending in the X direction and aligned in the Y direction. However, such configurations are merely exemplifications, and specific configurations may be appropriately adjusted. For example, in the example of FIG. 20, the wirings m0*a*, m1*a* for electrically connecting two conductive layers 210 aligned in the X direction and two conductive layers 230 aligned in the X direction may comprise a plurality of substantially linear portions extending in the Y direction and aligned in the X direction. Similarly, in the example of FIG. 20, the wirings m0*a*, m1*a* for electrically connecting two conductive layers 210 aligned in the X direction and two conductive layers 230 aligned in the X direction may comprise a plurality of substantially linear portions extending in the X direction and aligned in the Y direction.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a substrate;

a first conductive layer which is separated from the substrate in a first direction intersection a surface of the substrate and extends in a second direction intersecting the first direction;

a second conductive layer which is separated from the substrate and the first conductive layer in the first direction and extends in the second direction;

a third conductive layer which is separated from the substrate and the first conductive layer in the first direction, extends in the second direction, is aligned with the second conductive layer in the second direction, and is electrically connected to the second conductive layer;

a first semiconductor layer which extends in the first direction and faces the first conductive layer and the second conductive layer;

a first charge accumulating portion provided between the first conductive layer and the first semiconductor layer;

a second charger accumulating portion provided between the second conductive layer and the first semiconductor layer;

a second semiconductor layer which extends in the first direction and faces the first conductive layer and the third conductive layer;

a third charge accumulating portion provided between the first conductive layer and the second semiconductive layer;

a fourth charge accumulating portion provided between the third conductive layer and the second semiconductor layer;

a first bit line electrically connected to the first semiconductor layer; and a second bit line electrically connected to the second semiconductor layer, when a magnitude and supply time of one or a plurality of voltages supplied to the first conductive layer, a magnitude and supply time of one or a plurality of voltages supplied to the first bit line, a stabilization waiting time until sense start, and a sense time, in the case of a certain operation being executed on a first memory cell including the first charge accumulating portion, are assumed to be first operation parameters, and a magnitude and supply time of one or a plurality of voltages supplied to the second conductive layer and the third conductive layer, a magnitude and supply time of one or a plurality of voltages supplied to the first bit line, a stabilization waiting time until sense start, and a sense time, in the case of the certain operation being executed on a second memory cell including the second charge accumulating portion, are assumed to be second operation parameters, at least some of the second operation parameters differing from at least some of the first operation parameters.

2. The semiconductor memory device according to claim 1, wherein at least one of a magnitude and supply time of one or a plurality of voltages supplied to the second conductive layer and the third conductive layer, in the case of the certain operation being executed on the second memory cell is smaller than at least one of a magnitude and supply time of one or a plurality of voltages supplied to the first conductive layer, in the case of the certain operation being executed on the first memory cell.

3. The semiconductor memory device according to claim 1, wherein at least one of a magnitude and supply time of one or a plurality of voltages supplied to the first bit line, in the case of the certain operation being executed on the second memory cell is larger than at least one of a magnitude and supply time of one or a plurality of voltages supplied to the first bit line, in the case of the certain operation being executed on the first memory cell.

4. The semiconductor memory device according to claim 1, wherein a stabilization waiting time until sense start in the case of the certain operation being executed on the second memory cell is longer than a stabilization waiting time until sense start in the case of the certain operation being executed on the first memory cell.

5. The semiconductor memory device according to claim 1, wherein a sense time in the case of the certain operation being executed on the second memory cell is shorter than a sense time in the case of the certain operation being executed on the first memory cell.

6. The semiconductor memory device according to claim 1, wherein when the certain operation is a read operation, and in the case of the read operation on the first memory cell, at a first timing, the first conductive layer is supplied with a first voltage, and at a second timing later than the first timing, the first conductive layer is supplied with a second voltage which is smaller than the first voltage, and in the case of the read operation on the second memory cell, at a third timing, the second conductive layer and the third conductive layer are supplied with a third voltage, and at a fourth timing later than the third timing, the second conductive layer and the third conductive layer are supplied with a fourth voltage which is smaller than the third voltage, a time from the third timing to the fourth timing is shorter than a time from the first timing to the second timing.

7. The semiconductor memory device according to claim 1, wherein when the certain operation is a read operation, and in the case of the read operation on the first memory cell, at a first timing, the first conductive layer is supplied with a first voltage, and at a second timing later than the first timing, the first conductive layer is supplied with a second voltage which is smaller than the first voltage, and in the case of the read operation on the second memory cell, at a third timing, the second conductive layer and the third conductive layer are supplied with a third voltage, and at a fourth timing later than the third timing, the second conductive layer and the third conductive layer are supplied with a fourth voltage which is smaller than or of the same value as the third voltage, the third voltage is smaller than the first voltage.

8. The semiconductor memory device according to claim 1, wherein when the certain operation is a read operation, and in the case of the read operation on the first memory cell, at a first timing, the first conductive layer is supplied with a first voltage, at a second timing later than the first timing, the first conductive layer is supplied with a second voltage which is smaller than the first voltage, and at a fifth timing between the first timing and the second timing, the first conductive layer is supplied with a fifth voltage which is smaller than the second voltage, and in the case of the read operation on the second memory cell, at a third timing, the second conductive layer and the third conductive layer are supplied with a third voltage, at a fourth timing later than the third timing, the second conductive layer and the third conductive layer are supplied with a fourth voltage which is smaller than the third voltage, and at a sixth timing between the third timing and the fourth timing, the second conductive layer and the third conductive layer are supplied with a sixth voltage which is smaller than the fourth voltage, a time from the sixth timing to the fourth timing is shorter than a time from the fifth timing to the second timing.

9. The semiconductor memory device according to claim 1, wherein when the certain operation is a read operation, and in the case of the read operation on the first memory cell, at a first timing, the first conductive layer is supplied with a first voltage, at a second timing later than the first timing, the first conductive layer is supplied with a second voltage which is smaller than the first voltage, and at a fifth timing between the first timing and the second timing, the first conductive layer is supplied with a fifth voltage which is smaller than the second voltage, and in the case of the read operation on the second memory cell, at a third timing, the second conductive layer and the third conductive layer are supplied with a third voltage, at a fourth timing later than the third timing, the second conductive layer and the third conductive layer are supplied with a fourth voltage which is smaller than the third voltage, and at a sixth timing between the third timing and the fourth timing, the second conductive layer and the third conductive layer are supplied with a sixth voltage which is smaller than or of the same value as the fourth voltage, the sixth voltage is larger than the fifth voltage.

10. The semiconductor memory device according to claim 1, wherein when the certain operation is a read operation, and in the case of the read operation on the first memory cell, at a seventh timing, the first bit line is supplied with a seventh voltage, and at an eighth timing later than the seventh timing, the first bit line is supplied with an eighth voltage which is smaller than the seventh voltage, and in the case of the read operation on the second memory cell, at a ninth timing, the first bit line is supplied with a ninth voltage, and at a tenth timing later than the ninth timing, the first bit line is supplied with a tenth voltage which is smaller than the ninth voltage, a time from the ninth timing to the tenth timing is longer than a time from the seventh timing to the eighth timing.

11. The semiconductor memory device according to claim 1, wherein when the certain operation is a read operation, and in the case of the read operation on the first memory cell, at a seventh timing, the first bit line is supplied with a seventh voltage, and at an eighth timing later than the seventh timing, the first bit line is supplied with an eighth voltage which is smaller than the seventh voltage, and in the case of the read operation on the second memory cell, at a ninth timing, the first bit line is supplied with a ninth voltage, and at a tenth timing later than the ninth timing, the first bit line is supplied with a tenth voltage which is smaller than the ninth voltage, the ninth voltage is larger than the seventh voltage.

12. The semiconductor memory device according to claim 1, further comprising:

a first transistor, the first transistor comprising a gate electrode which is electrically connected to the first bit line; and a second transistor, the second transistor being provided in a current path between the first transistor and the first bit line, wherein when the certain operation is a read operation, and in the case of the read operation on the first memory cell, at a seventh timing, a gate electrode of the second transistor is supplied with an eleventh voltage, and at an eighth timing later than the seventh timing, the gate electrode of the second transistor is supplied with a twelfth voltage which is smaller than the eleventh voltage, and in the case of the read operation on the second memory cell, at a ninth timing, the gate electrode of the second transistor is supplied with a thirteenth voltage, and at a tenth timing later than the ninth timing, the gate electrode of the second transistor is supplied with a fourteenth voltage which is smaller than the thirteenth voltage, a time from the ninth timing to the tenth timing is longer than a time from the seventh timing to the eighth timing.

13. The semiconductor memory device according to claim 1, further comprising:

a first transistor, the first transistor comprising a gate electrode which is electrically connected to the first bit line; and a second transistor, the second transistor being provided in a current path between the first transistor and the first bit line, wherein when the certain operation is a read operation, and in the case of the read operation on the first memory cell, at a seventh timing, a gate electrode of the second transistor is supplied with an eleventh voltage, and at an eighth timing later than the seventh timing, the gate electrode of the second transistor is supplied with a twelfth voltage which is smaller than the eleventh voltage, and in the case of the read operation on the second memory cell, at a ninth timing, the gate electrode of the second transistor is supplied with a thirteenth voltage, and at a tenth timing later than the ninth timing, the gate electrode of the second transistor is supplied with a fourteenth voltage which is smaller than the thirteenth voltage, the thirteenth voltage is larger than the eleventh voltage.

14. The semiconductor memory device according to claim 1, wherein when the certain operation is a read operation, and in the case of the read operation on the first memory cell, at an eighth timing, the first bit line is supplied with an eighth voltage, and at an eleventh timing later than the eighth timing, there is started a first sense operation, and in the case of the read operation on the second memory cell, at a tenth timing, the first bit line is supplied with a tenth voltage, and at a twelfth timing later than the tenth timing, there is started a second sense operation, a time from the tenth timing to the twelfth timing is longer than a time from the eighth timing to the eleventh timing.

15. The semiconductor memory device according to claim 1, wherein when the certain operation is a write operation, and the write operation includes a plurality of times of a program operation, and in the case of a first time of the program operation in the write operation on the first memory cell, at a thirteenth timing, the first conductive layer is supplied with a fifteenth voltage, and at a fourteenth timing later than the thirteenth timing, the first conductive layer is supplied with a sixteenth voltage which is smaller than the fifteenth voltage, and in the case of a first time of the program operation in the write operation on the second memory cell, at a fifteenth timing, the second conductive layer and the third conductive layer are supplied with a seventeenth voltage, and at a sixteenth timing later than the fifteenth timing, the second conductive layer and the third conductive layer are supplied with an eighteenth voltage which is smaller than the seventeenth voltage, a time from the fifteenth timing to the sixteenth timing is shorter than a time from the thirteenth timing to the fourteenth timing.

16. The semiconductor memory device according to claim 1, wherein when the certain operation is a write operation, and the write operation includes a plurality of times of a program operation, and in the case of a first time of the program operation in the write operation on the first memory cell, at a thirteenth timing, the first conductive layer is supplied with a fifteenth voltage, and at a fourteenth timing later than the thirteenth timing, the first conductive layer is supplied with a sixteenth voltage which is smaller than the fifteenth voltage, and in the case of a first time of the program operation in the write operation on the second memory cell, at a fifteenth timing, the second conductive layer and the third conductive layer are supplied with a seventeenth voltage, and at a sixteenth timing later than the fifteenth timing, the second conductive layer and the third conductive layer are supplied with an eighteenth voltage which is smaller than the seventeenth voltage, the seventeenth voltage is smaller than the fifteenth voltage.

17. A semiconductor memory device comprising:

a substrate;

a first conductive layer which is separated from the substrate in a first direction intersecting a surface of the substrate and extends in a second direction intersecting the first direction;

a second conductive layer which is separated from the substrate and the first conductive layer in the first direction and extends in the second direction;

a third conductive layer which is separated from the substrate and the first conductive layer in the first direction, extends in the second direction, is aligned with the second conductive layer in the second direction, and is electrically connected to the second conductive layer;

a first semiconductor layer which extends in the first direction and faces the first conductive layer and the second conductive layer;

a second semiconductor layer which extends in the first direction and faces the first conductive layer and the third conductive layer;

a first wiring which is electrically connected to the first conductive layer, the second conductive layer, and the third conductive layer;

an operation voltage output circuit which is electrically connected to the first wiring; and a variable resistance circuit which is provided in a current path between the first wiring and the operation voltage output circuit.

18. A semiconductor memory device comprising:

a substrate;

a first conductive layer which is separated from the substrate in a first direction intersecting a surface of the substrate and extends in a second direction intersecting the first direction;

a second conductive layer which is separated from the substrate and the first conductive layer in the first direction and extends in the second direction;

a third conductive layer which is separated from the substrate and the first conductive layer in the first direction, extends in the second direction, is aligned with the second conductive layer in the second direction, and is electrically connected to the second conductive layer;

a first semiconductor layer which extends in the first direction and faces the first conductive layer and the second conductive layer;

a second semiconductor layer which extends in the first direction and faces the first conductive layer and the third conductive layer;

a fourth conductive layer which is provided between the substrate and the first conductive layer, and is connected to one end of the first semiconductor layer and to one end of the second semiconductor layer;

a first wiring which is provided between the substrate and the fourth conductive layer, and is electrically connected to the second conductive layer and the third conductive layer;

a first contact which extends in the first direction, whose one end in the first direction is closer to the substrate than the fourth conductive layer is, whose other end in the first direction is further from the substrate than the second conductive layer is, and which is provided in a current path of the second conductive layer and the first wiring; and a second contact which extends in the first direction, whose one end in the first direction is closer to the substrate than the fourth conductive layer is, whose other end in the first direction is further from the substrate than the third conductive layer is, and which is provided in a current path of the third conductive layer and the first wiring.

19. The semiconductor memory device according to claim 18, wherein the first wiring comprises a plurality of first portions, and the plurality of first portions extend in the second direction and are aligned in a third direction intersecting the first direction and the second direction, or extend in the third direction and are aligned in the second direction.

* * * * *